United States Patent [19]

Childers et al.

[11] Patent Number: 5,105,387

[45] Date of Patent: Apr. 14, 1992

[54] THREE TRANSISTOR DUAL PORT DYNAMIC RANDOM ACCESS MEMORY GAIN CELL

[75] Inventors: Jimmie D. Childers, Missouri City, Tex.; Seiichi Yamamoto, Inashiki; Masanari Takeyasu, Tsukuba, both of Japan

[73] Assignee: Texas Instruments Incorporated, Dallas, Tex.

[21] Appl. No.: 422,378

[22] Filed: Oct. 13, 1989

[51] Int. Cl.$^5$ .............................................. G11C 13/00
[52] U.S. Cl. ........................... 365/189.03; 365/189.01
[58] Field of Search ...................... 365/189.01, 189.03, 365/189.04, 149, 207, 230.05, 189.08

[56] References Cited

U.S. PATENT DOCUMENTS 4,739,474  4/1988  Holsztynski et al.
4,967,398  10/1990  Jamoua et al. ................. 365/189.04

OTHER PUBLICATIONS

Fisher, Allan L. et al., Architecture of a VLSI SIMD Processing Element, IEEE International Conference on Circuits and Design, 1987, pp. 324-327.
van Roermund, A. H. M. et al., A General-Purpose Programmable Video Signal Processor, ICCE 1989 VSP/Phillips.
Chin, D. et al., The Princeton Engine: A Real-Time Video System Simulator, IEEE Transactions on Consumer Electronics, vol. 34, No. 2, May 1988, pp. 285-297.
Nakagawa, Shin-ichi et al., A 50 ns Video Signal Processor, IEEE International Solid-State Circuits Conference, Digest of Technical Papers, vol. XXXII, 1989, pp. 168-169, 328.
Kikuchi, Kouichi et al., A Single-Chip 16-Bit 25 ns Realtime Video/Image Signal Processor, IEEE ISSCC Digest of Technical Papers, vol. XXXII, 1989, pp. 170-171, 329.
Wilson, Stephen S., The Pixie-5000—A Systolic Array Processor, IEEE 1985, pp. 477-483.
Davis, Ronald et al., Systolic Array Chip Matches the Pace of High-Speed Processing, Electronic Design, Oct. 21, 1984, pp. 207-218.
Hannaway, Wyndham et al., Handling Real-Time Images Comes Naturally to Systolic Array Chip, Electronic Design, Nov. 15, 1984, pp. 289-300.
Smith, Jr., Winthrop W. et al., Systolic Array Chip Recognizes Visual Patterns Quicker Than a Wink, Electronic Design, Nov. 29, 1984, pp. 257-266.
Wallis, Lyle, Associative Memory Calls on the Talents of Systolic Array Chip, Electronic Design, Dec. 13, 1984, pp. 217-226.
Fisher, Allan L. et al., Real-Time Image Processing on Scan Line Array Processors, IEEE 1985, pp. 484-489.
Fisher, Allan L., Scan Line Array Processor for Image Computation, IEEE 13th Annual International Symposium on Compu. Arch., Compu. Arch. News, vol. 14, No. 2, Jun. 1986, pp. 338-345.
Waltz, David L. Applications of the Connection Machine, IEEE Computer Magazine, Jan. 1987, pp. 85-97.
Webber, Donald M. et al., Circuit Simulation on the Connection Machine, 24th ACM/IEEE Design Automation Conference, 1987, pp. 108-113.
Hillis, W. Daniel, text book excerpt, The Connection Machine, The MIT Press series in artificial intelligence-Thesis (Ph.D.)-MIT, 1985, pp. 18-28.
Fountain, T. J., text book, Integrated Technology for Parallel Image Processing, "Plans for the CLIP7 Chip", pp. 199-214, Chapter 13.
Gharachorloo, Nader et al., A Super Buffer: A Systolic VLSI Graphics Engine for Real-Time Raster Image Generation, 1985 Chapel Hill Conference on VLSI, pp. 285-305.

*Primary Examiner*—Terrell W. Fears
*Attorney, Agent, or Firm*—Richard Donaldson; William Hiller; Robby T. Holland

[57] ABSTRACT

The present invention relates generally to single instruction, multiple data processors. More particularly, the invention relates to processors having a one dimensional array of processing elements, that finds particular application in digital signal processing such as Improved Definition Television (IDTV). Additionally, the invention relates to improvements to the processors, television and video systems and other systems improvements and methods of their operation and control.

4 Claims, 48 Drawing Sheets

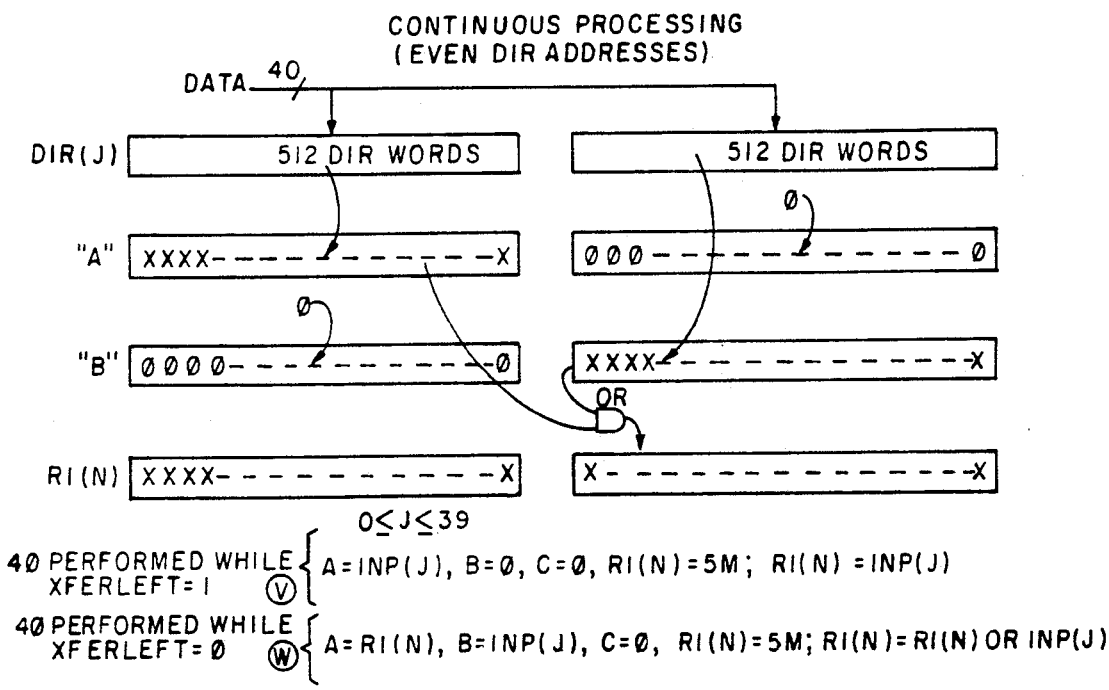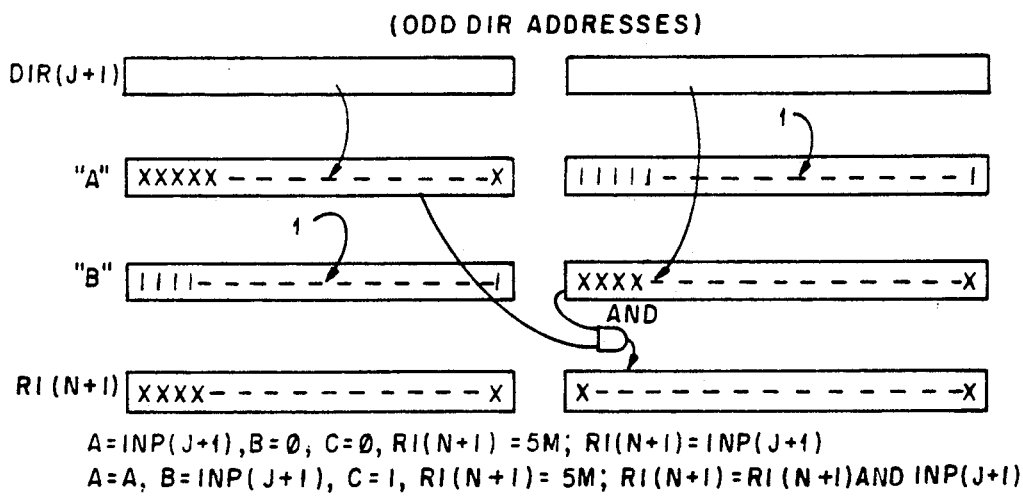
Fig. 14

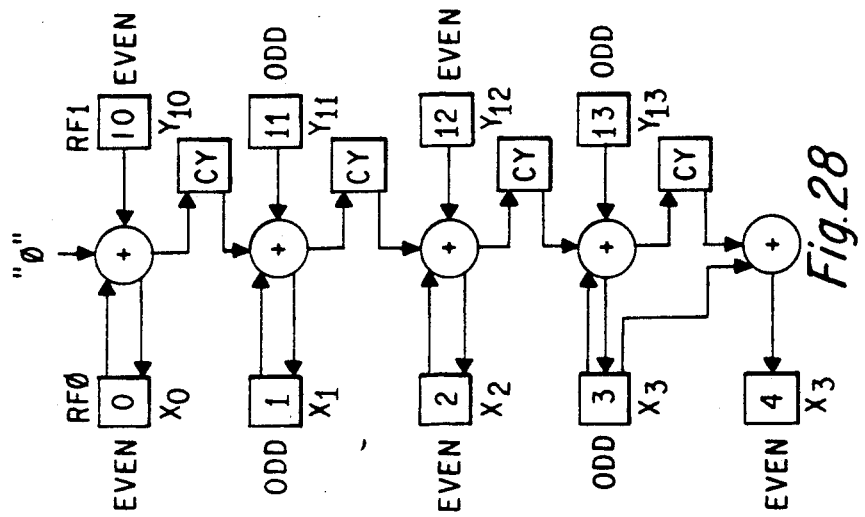
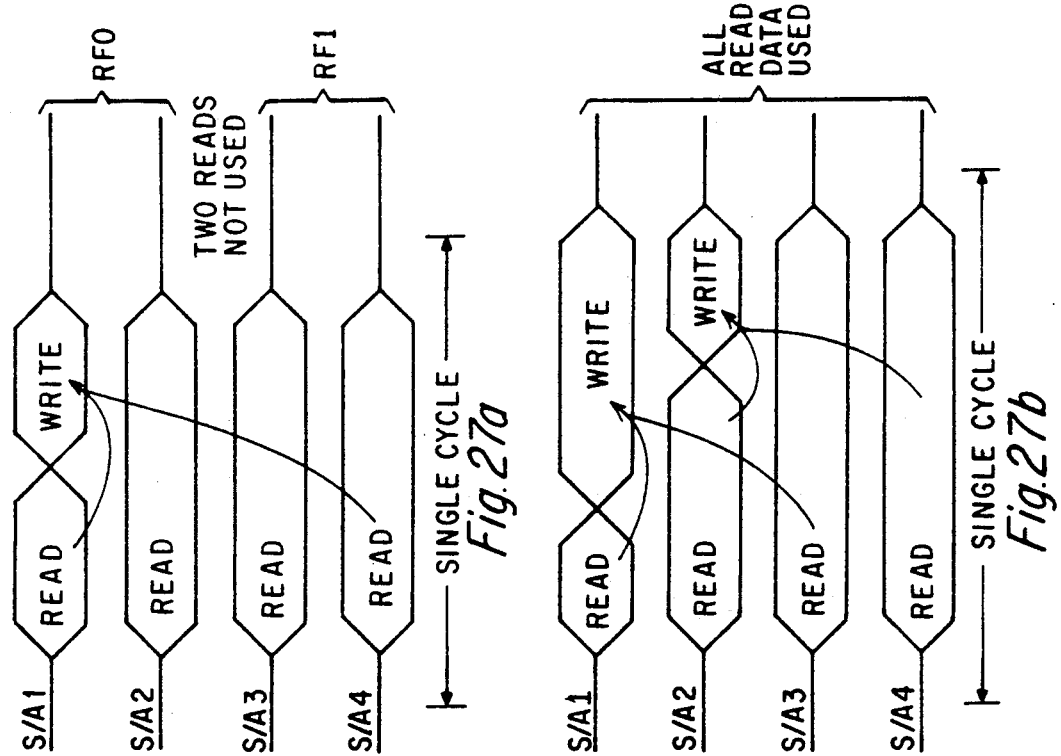
Fig.28
Fig.27a
Fig.27b

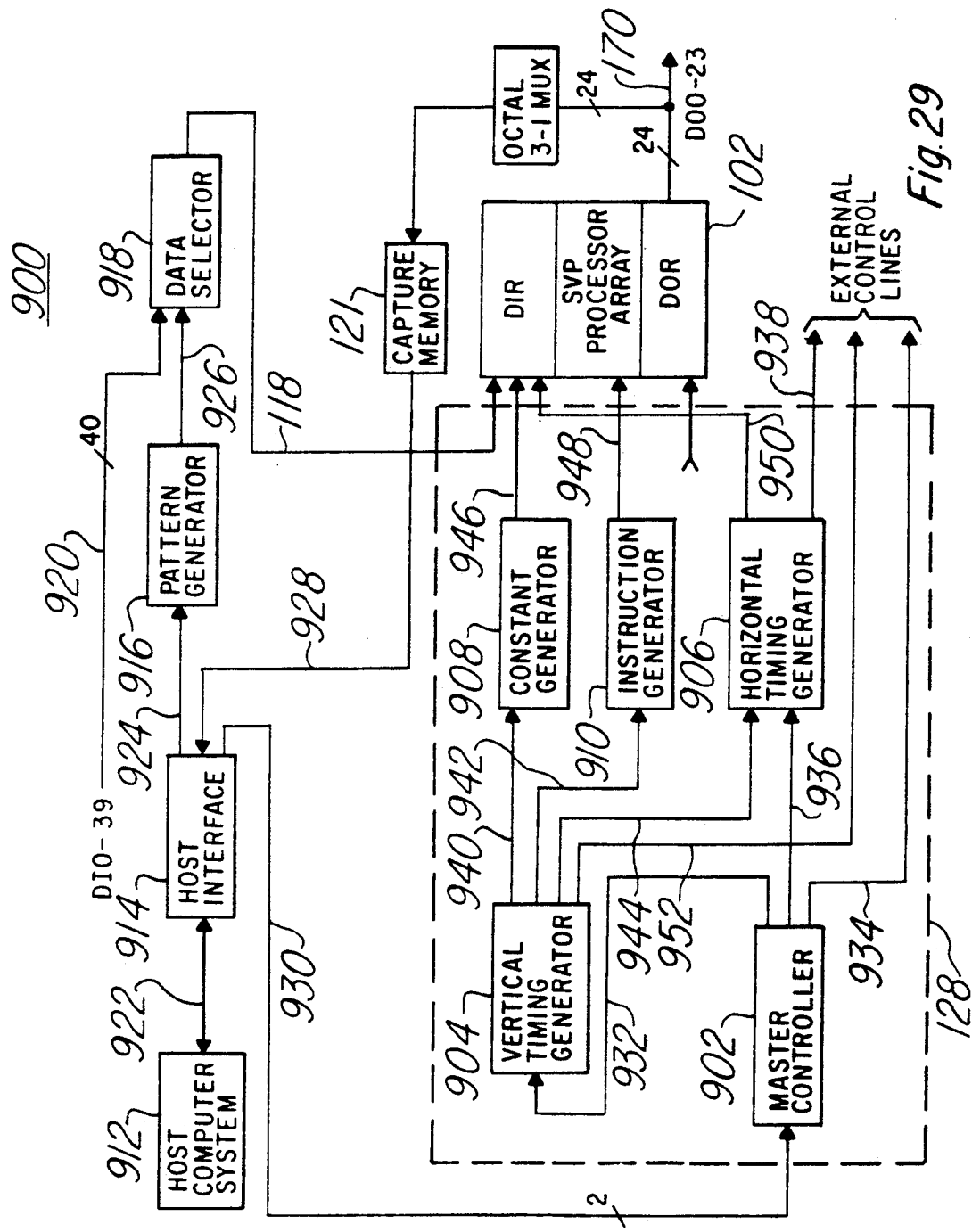

IN 1120

TIMING PATTERN | REPEAT # | LOOP PATTERN

| | I | II | III | IV |
|---|---|---|---|---|
| #1 | 1 | 3 | #4 |
| #2 | 1 | 10 | #1 |
| #3 | 1 | 1 | #2 |
| #4 | 0 | 31 | #3 |
| | 0 | 31 | #3 |
| | 1 | 31 | #3 |
| | | 5 | |
| #5 | 0 | 10 | #4 |
| | 0 | 2 | #1 |
| | 0 | 10 | #4 |
| | 0 | 31 | #1 |
| | 0 | 31 | #1 |
| | 0 | 12 | #1 |
| | 0 | 5 | #2 |
| | 1 | 2 | #3 |

| | I | II | III |
|---|---|---|---|
| 1 | 0 | 1 |
| | 0 | 2 |
| | 0 | 1 |
| | 0 | 3 |
| | 1 | 8 |
| 2 | 0 | 6 |
| | 0 | 19 |
| | 1 | 31 |
| 3 | 0 | 8 |
| | 0 | 5 |
| | 0 | 7 |
| | 0 | 3 |
| | 0 | 2 |
| | 1 | 19 |
| 4 | 0 | 23 |
| | 0 | 36 |
| | 0 | 18 |
| | 0 | 41 |
| | 0 | 61 |
| | 0 | 19 |
| | 0 | 8 |
| | 0 | 7 |
| | 1 | 19 |

Fig.40

$t_{SC}$ = SAMPLE CLOCK PERIOD DELAY
$k_n$ = CONSTANTS
$n$ = DATA PATH WIDTH

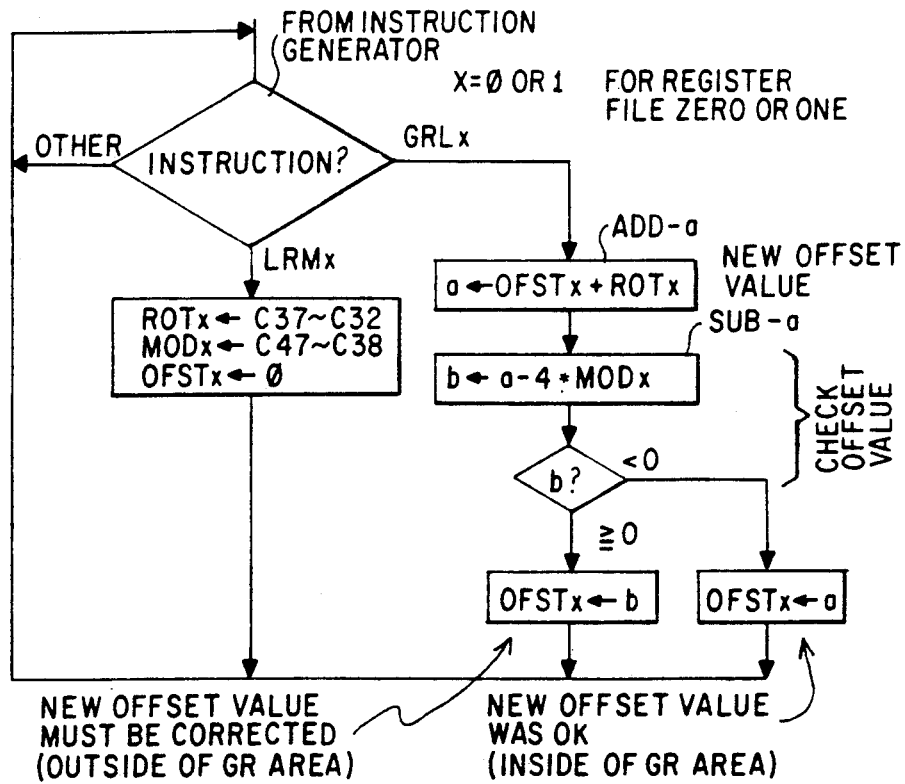
FUNCTION OF LRM0, LRM1, GRL0, GRL1  *Fig. 46a*
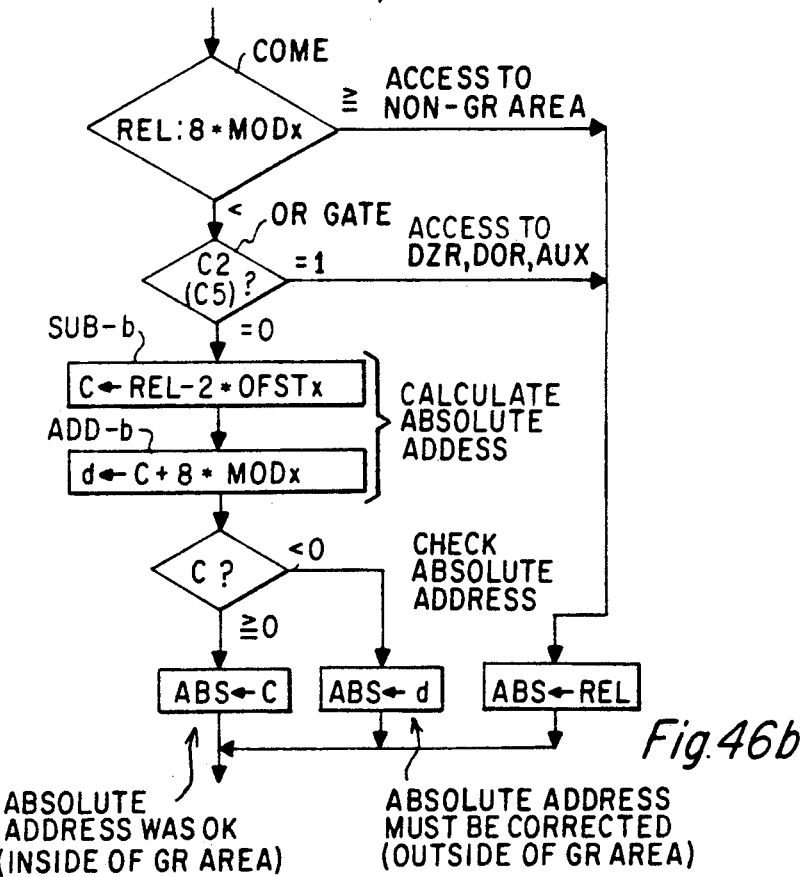
*Fig. 46b*

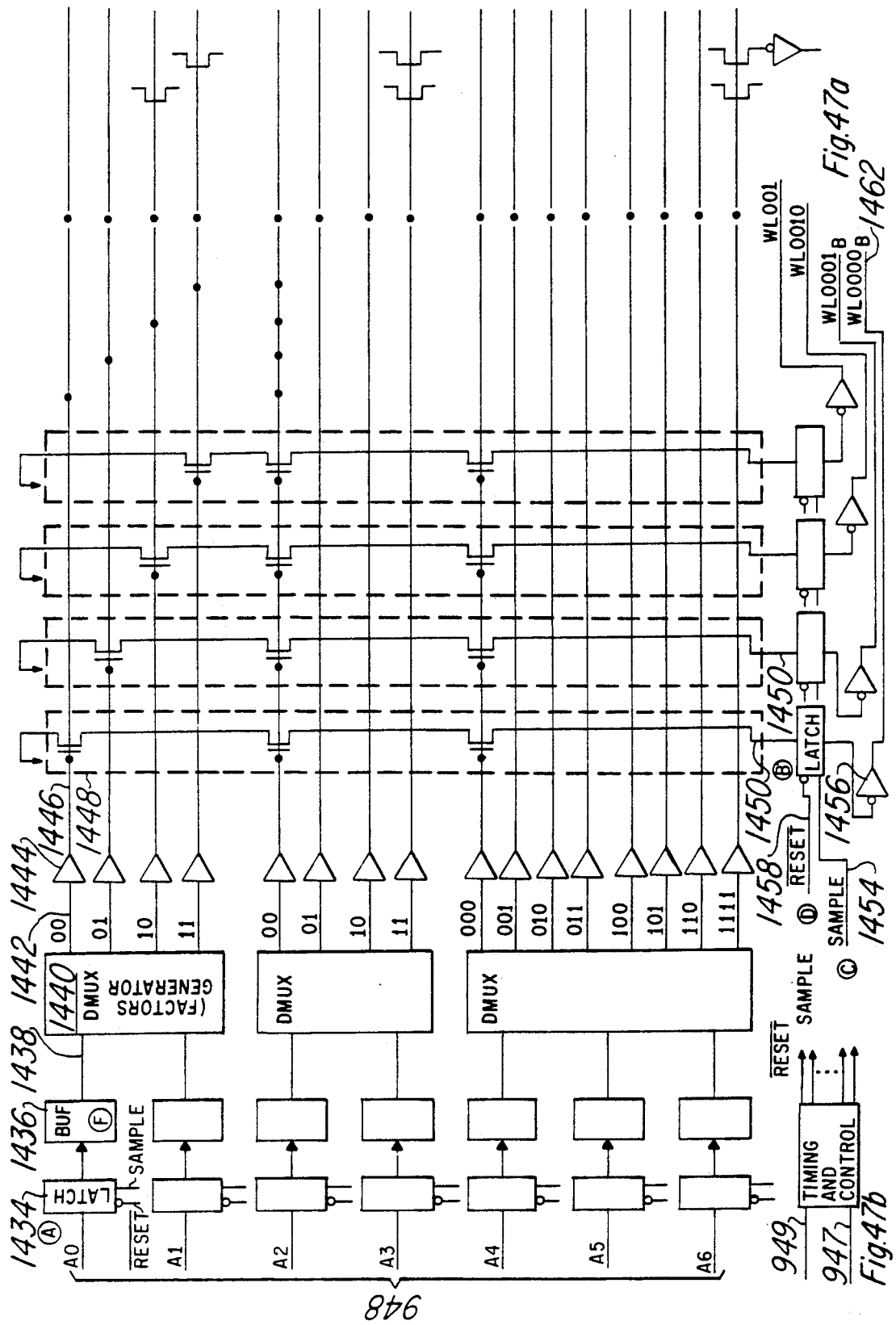

| IN (1431) | OUT (1462) |
|---|---|
| RF0A0--6 ADDRESS | WORDLINE FOR RF0 or DIR |
| RF1A0---6 ADDRESS | WORDLINE FOR RF1 or DOR |
| C0 -- 23 CTRL | INSTRUCTION DECODE REGS M, A, B, C (MULTIPLEXERS) |
| C0.C1  2 --> 4 DECODER<br>C3, C4  2 --> 4<br>C6, C7  2 --> 4<br><br>C9, 10, 11  3 --> 8<br>12, 13, 14  3 --> 8<br>15, 16, 17  3 --> 8<br>18, 19, 20  3 --> 8 | |

C2 --> RF0A7 --> RF0/DIR SELECT

C5 --> RF/A7 --> RFI/DOR SELECT

C8 --> L/2R OR R/2R

C21 --> CONDITIONAL INSTRUCTION CONTROL

C22, 23 --> INSTRUCTION TYPE SELECT (SINGLE, DOUBLE, WAIT-STATED SINGLE, IDLE)

Fig.48

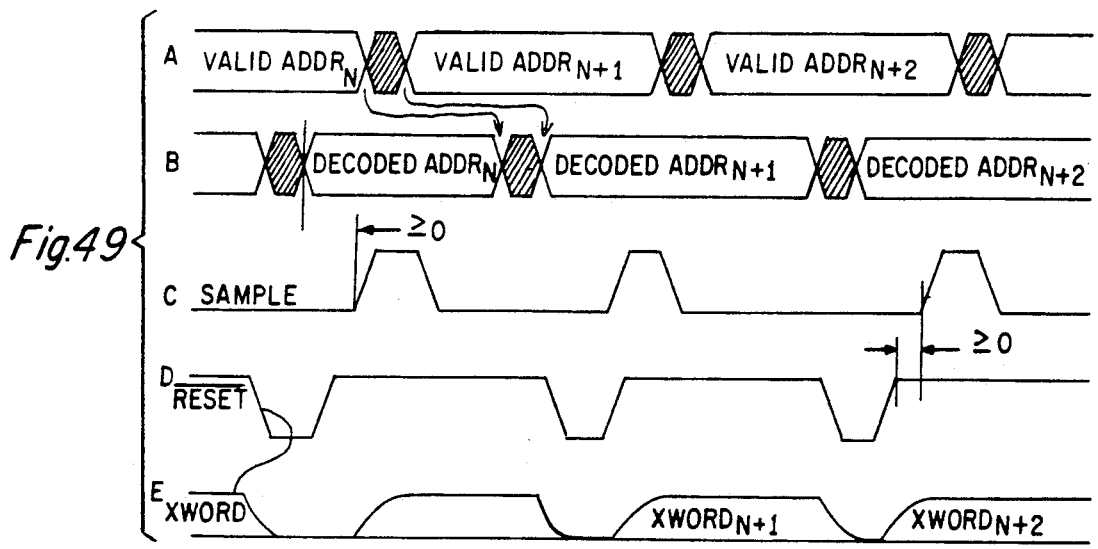
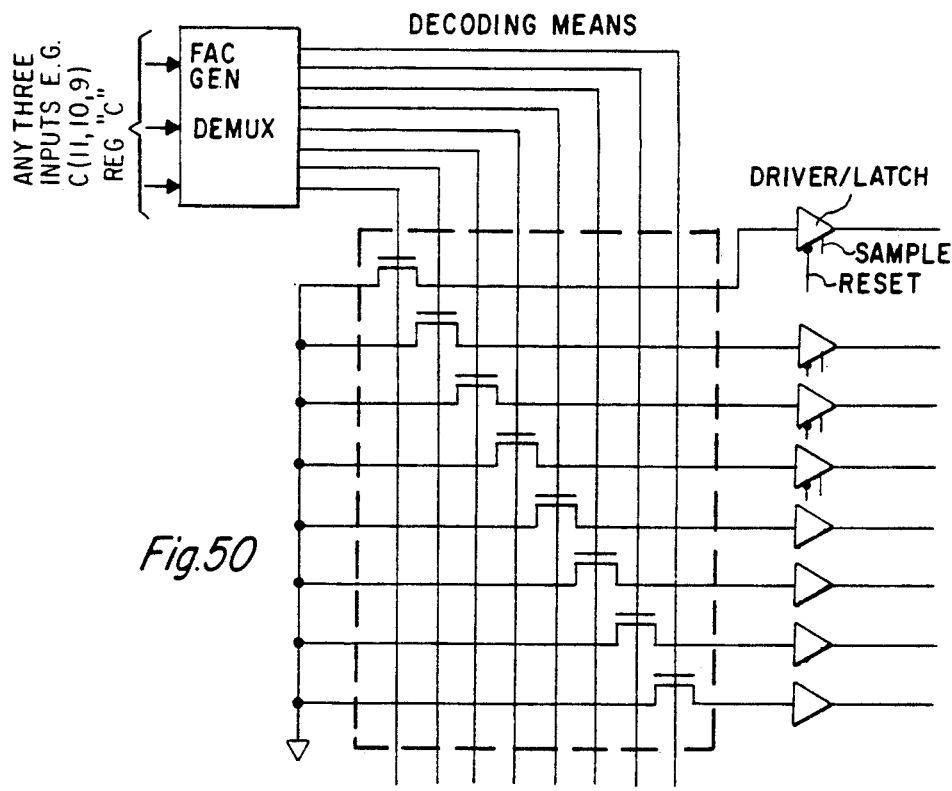

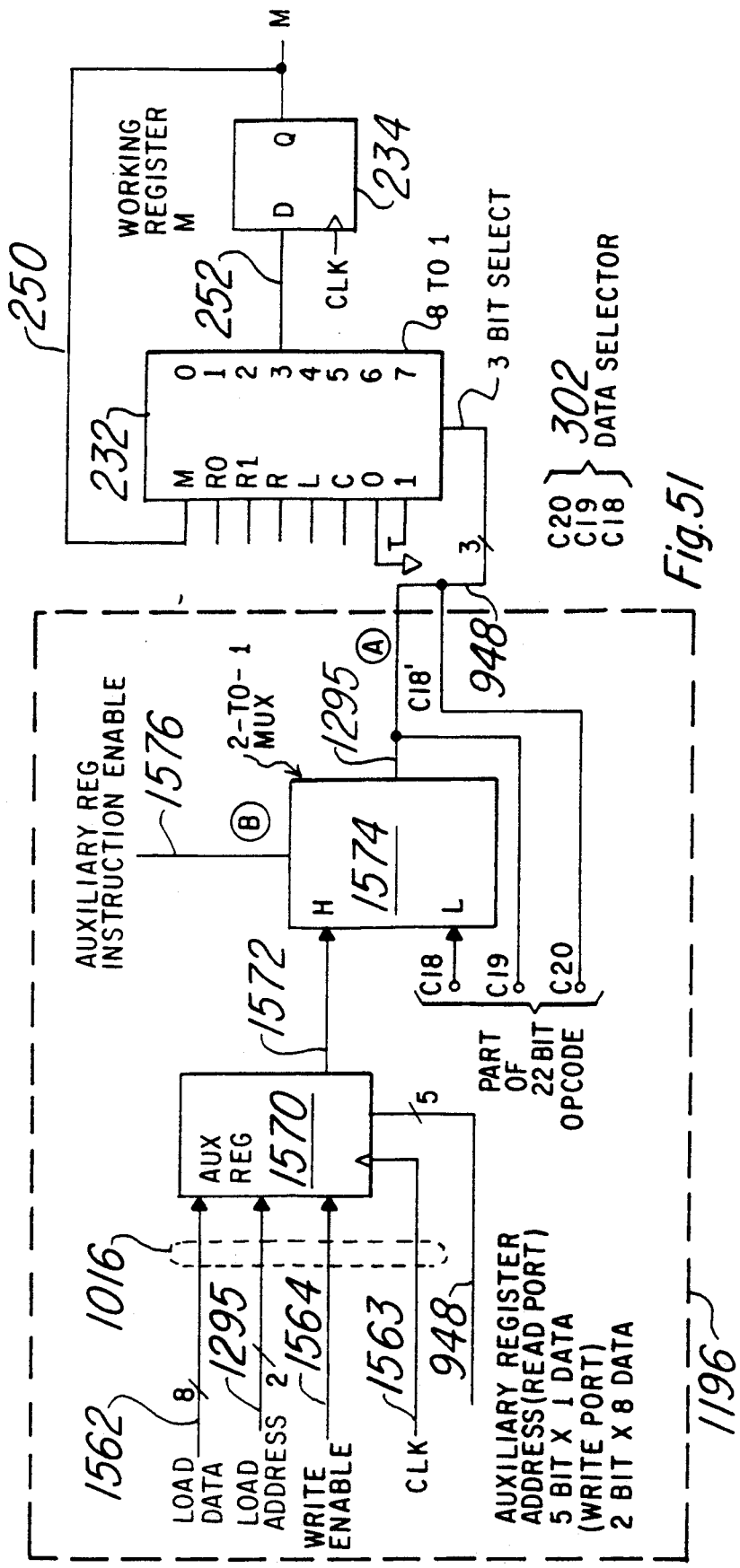

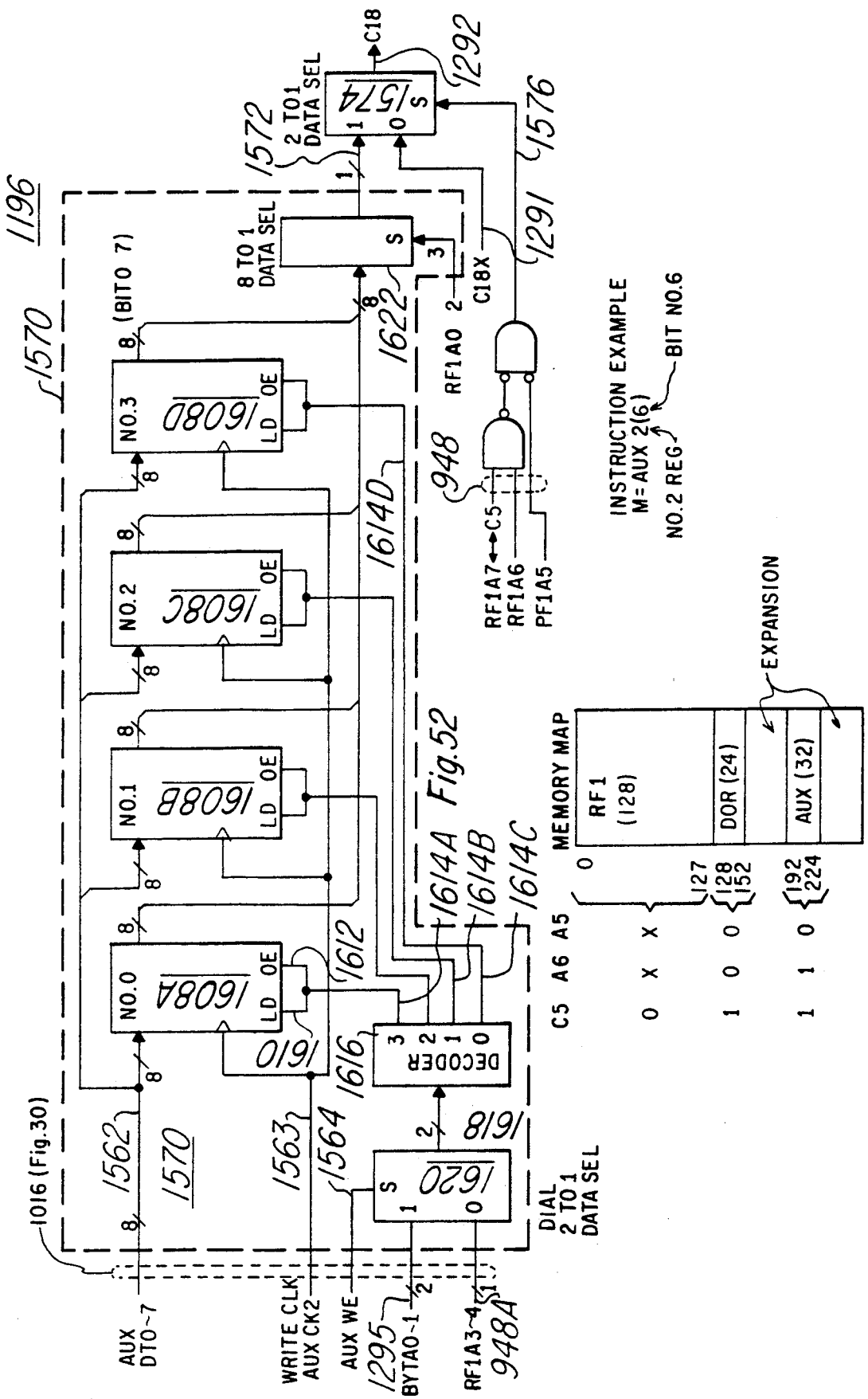

SECURE VIDEO TRANSMISSION

Fig. 67

THREE TRANSISTOR DUAL PORT DYNAMIC RANDOM ACCESS MEMORY GAIN CELL

CROSS REFERENCE TO RELATED CASES

This application is related to pending coassigned applications Ser. No. 119,890 and Ser. No. 119,889, both previously filed Nov. 13, 1987, and to Ser. No. 421,499, Ser. No. 421,487, Ser. No. 421,500, Ser. No. 421,472, Ser. No. 421,493, Ser. No. 421,488, Ser. No. 421,473, Ser. No. 421,486, Ser. No. 421,494, Ser. No. 421,496, Ser. No. 421,471, filed contemporaneously herewith, all of which are assigned to Applicant's assignee and the contents of said related cases are hereby incorporated herein by reference.

BACKGROUND OF THE INVENTION

Fast and accurate real-time processing of data signals is desirable in general purpose digital signal processing, consumer electronics, industrial electronics, graphics and imaging, instrumentation, medical electronics, military electronics, communications and automotive electronics applications among others, to name a few broad technological areas. In general, video signal processing,, such as real-time image processing of video signals, requires massive data handling and processing in a short time interval. Image processing is discussed by Davis et al. in Electronic Design, Oct. 31, 1984, pp. 207–218, and issues of Electronic Design for, Nov. 15, 1984, pp. 289–300, Nov. 29, 1984, pp. 257–266, Dec. 13, 1984, pp. 217–226, and Jan. 10, 1985, pp. 349–356.

SUMMARY OF THE INVENTION

Briefly, in one embodiment, the present invention comprises sensing circuit means, having at least one differential data line for transferring data between said memory cell and said sensing circuit means; a memory cell select circuit having cell select lines connected to said memory cell and operable in response to a control signal to enable transfer of into and out of said memory cell; a first transistor having first and second current handling terminals and a control terminal, the first current handling terminal of said first transistor connected to said differential data line said first transistor control terminal forming a word line for said memory cell; a capacitive storage cell having first and second terminals, said first capacitor terminal connected to ground potential, said second capacitor terminal connected to the second current handling terminal of said first transistor; a second transistor having first and second current handling terminals and a control terminal said control terminal of said second transistor connected the second current handling terminal of said first transistor, said first current handling terminal of said second transistor connected to ground potential; a third transistor having first and second current handling terminals and a control terminal said first current handling terminal of said third transistor connected to said second current handling terminal of said second transistor, said control terminal of said third transistor connected to a cell select line of said memory cell select circuit, and said second current handling terminal of said third transistor forming a memory cell read line; an output data line connected to said memory cell read line for transferring data out of said memory cell.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, when read in conjunction with the accompanying drawings, wherein:

FIG. 8 comprising

FIG. 14 shows a method of recovering data transmitted by the FIG. 13 circuit;

FIGS. 27a and 27b shows an illustrative read/write cycle for the FIG. 26 four sense amplifier processor element;

FIG. 28 illustrates a 4-bit addition using double cycle instruction;

FIG. 29 shows a development system using a SVP device;

FIG. 39 shows illustrative contents of the FIG. 38 sequence memory;

FIG. 40 shows illustrative contents of the FIG. 38 loop memory;

FIG. 44b shows an exploded and reorganized view of a portion of FIG. 44a;

FIGS. 46a and 46b are parts of the same flow diagram for a global rotation operation;

FIGS. 47a and 47b show signal pipelining circuitry;

FIG. 48 shows the various signal inputs and outputs for a FIG. 47 type circuit;

FIG. 49 shows a timing diagram for signal flow using a FIG. 47 pipeline circuit;

FIG. 50 shows an alternative pipeline circuit;

FIG. 51 shows a global variable distribution controller circuit;

FIG. 52 shows an auxiliary register set and control circuit;

FIG. 67 is an illustration of a pin grid array package suitable for SVP packaging.

DETAILED DESCRIPTION OF THE PREFERRED EMBODIMENTS

Figure 1:
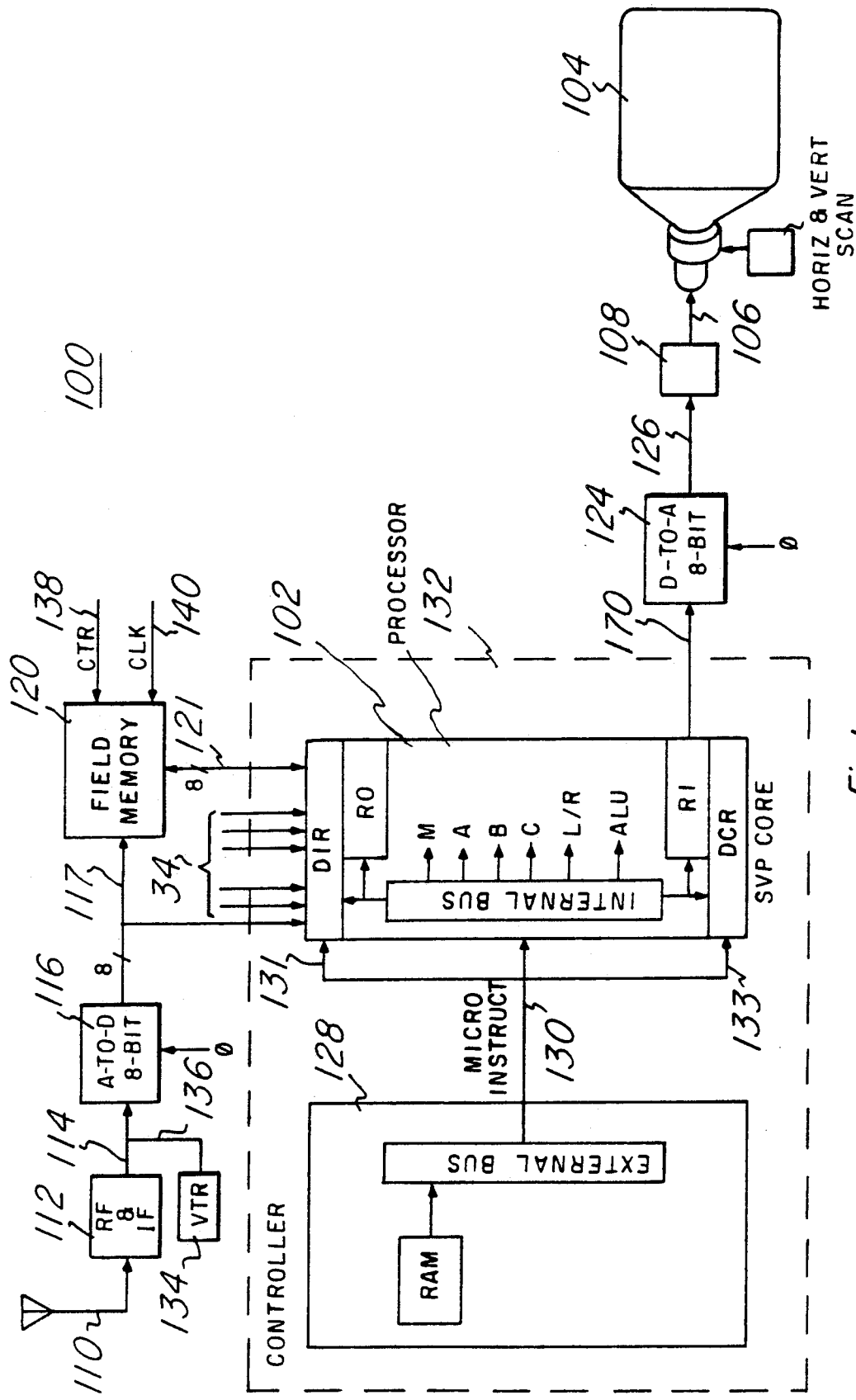
FIG. 1 shows a video system using a synchronous vector processor.

In the following discussion of the preferred embodiments of the invention, reference is made to drawing figures. Like reference numerals used throughout the several figures refer to like or corresponding pars.

An SVP, Synchronous Vector Processor of a preferred embodiment, is a general purpose mask-programmable single instruction, multiple data, reduced instruction set computing (SIMD-RISC) device capable of executing in real-time the 3-D algorithms useful in Improved and Extended Definition Television (IDTV and EDTV) systems. Although the SVP of the invention is disclosed of video signal processing in the preferred embodiment, the hardware of the SVP works well in many different applications so no particular filters or functions are implied in the architecture. Generally, the SVP can be used in any situation in which large numbers of incoming data are to be processed in parallel.

In a typical application, such as video signal processing, the Input and Output layers operate in synchronism with the data source (such as video camera, VCR, receiver, etc.) and the data sink respectively (such as the raster display). Concurrently, the Computation layer performs the desired transformation by the application of programmable functions simultaneously to all the elements of a packet (commonly referred to as a VECTOR: within the TV/Video environment all the samples comprising a single horizontal display line). Thus the SVP is architecturally streamlined for Synchronous Vector Processing.

In FIG. 1, a TV or video system 100 includes synchronous vector processor device 102. System 100 comprises a CRT 104 of the raster-scan type receiving an analog video signal at input 106 form standard analog video circuits 108 as used in a conventional TV receiver. A video signal from an antenna 110, is amplified, filtered and heterodyned in the usual manner through RF and IF stages 112 including tuner, IF strip and sync separator circuitry therein, producing an analog composite or component video signal at line 114. Detection of a frequency modulated (FM) audio component is separately performed and not further discussed here. The horizontal sync, vertical sync, and color burst are used by controller 128 to provide timing to SVP 102 and thus are not part of SVP's data path. The analog video signal on line 114 is converted to digital by analog-to-digital converter 116. The digitized video signal is proved at line 118 for input to synchronous vector processor 102.

Processor 102 processes the digital video signal present on line 118 and provides a processed digital signal on lines 170. The processed video signal is then converted to analog by digital-to-analog converter 124 before being provided via line 126 to standard analog video circuits 108. Video signals can be provided to analog-to-digital converter 116 from a recorded or other non standard signal source such as video tape recorder 134. The VCR signal is provided on line 136 and by passes tuner 112. Processor 102 can store one (or more) video frames in a field memory 120, which is illustratively, a Texas Instruments Model TMS4C1060 field memory divide. Field memory 120 receives control and clocking on lines 138 and 140 from controller 128.

The video signal input on line 114 is converted to 8-bit digitalized video data by analog-to-digital converter 116 at a sampling rate of, for example, 14.32 MHz (a multiple X4 of the color subcarrier frequency, 3.58 MHz). There are a total of 40 input lines to SVP 102. As stated, 8 are used for the digitized video signal. Others are used as inputs for frame memory output, alternate TV source, etc. Digital-to analog converter 124 can also reconstruct at the rate of 14.32 MHz to convert a 8-bit processor output to analog. The remaining output lines may be used for other signals. Alternatively, digital-to-analog converters 116 and 124 can operate at different sample rates as desired for a particular purpose.

Processor 102 is controlled by a controller 128. Controller 128 applies twenty-four microcode control bits and fourteen address bits on lines 130 to processor 102. For relatively low speeds, controller 128 is suitable a standard microprocessor or microcontroller device such as commercially available Texas Instruments Model TMS 370C050, for example. For faster speeds, a higher speed controller stores software code in RAM or ROM, or a state machine or sequencer is employed. The controller 128 is suitably located on the same semiconductor chip as processor 102, forming a unit 132, of FIG. 1, especially, if it merely comprises stored code in a ROM with associated address counter. The Microinstructions can control the operation of seven fundamental (or "primitive") gating and ALU functions within a single cycle. All of the PEs are controlled by the same instruction; thus the architectural designation Single Instruction Multiple Data (SIMD).

Figure 2:
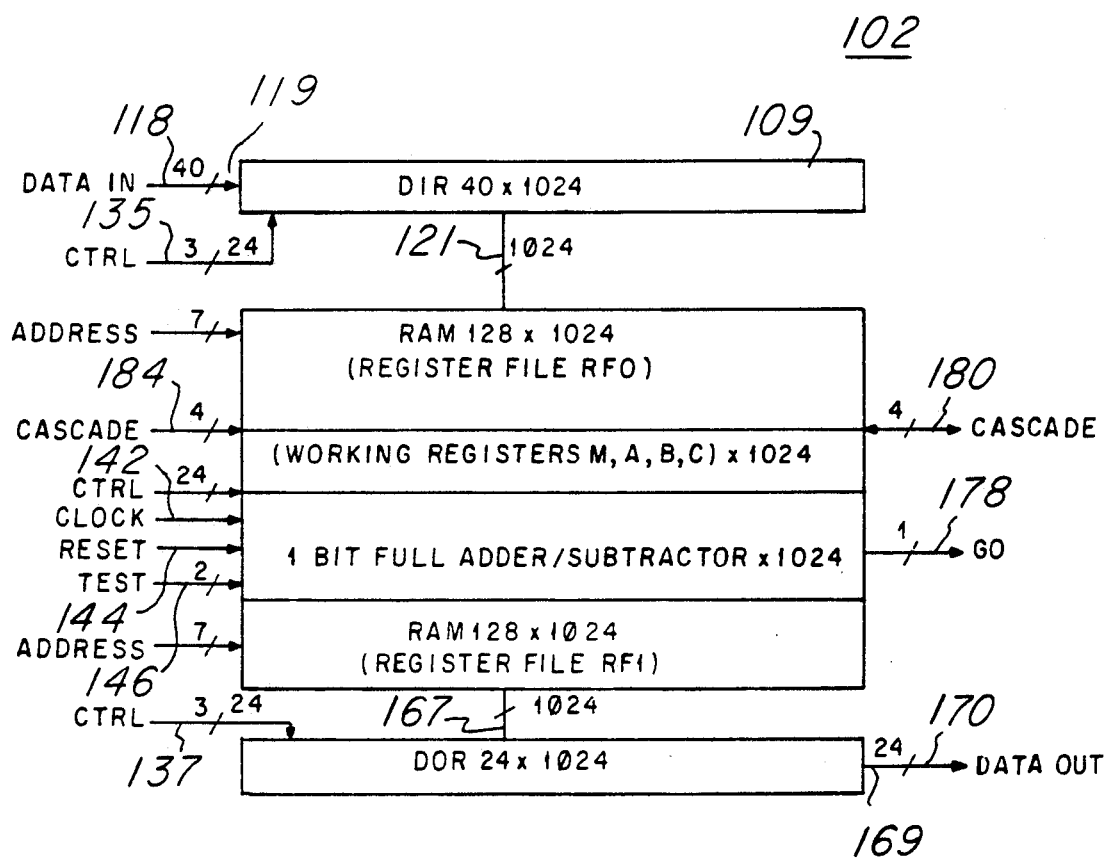
FIG. 2 shows the synchronous vector processor as used in the FIG. 1 system in greater detail.

In a preferred embodiment of FIG. 2 SVP device 102 includes a one-dimensional array having 1024 1-bit processing elements 103 (PE).

Figure 3:
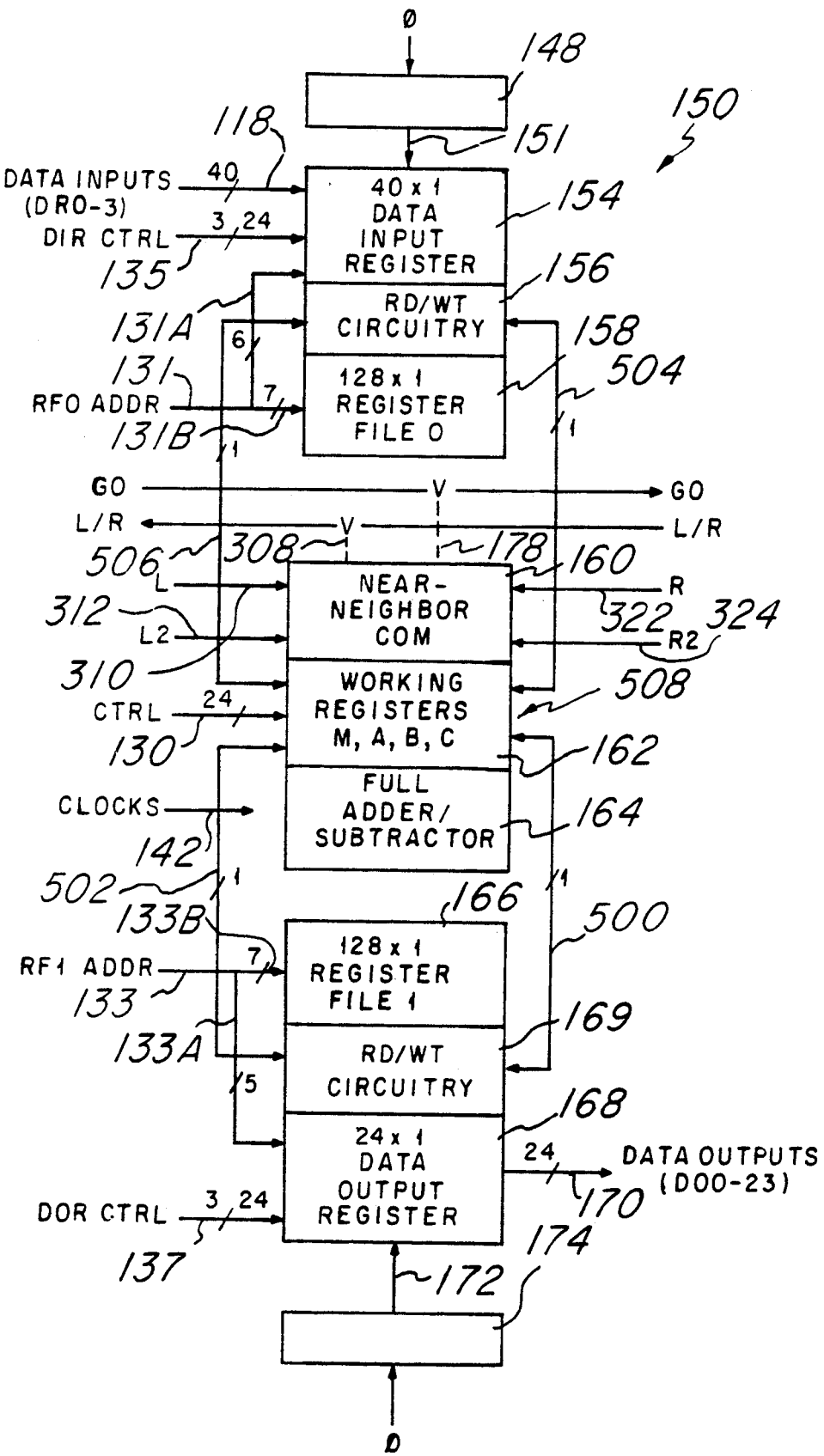
FIG. 3 shows one processor element of the FIG. 2 synchronous vector processor.

An individual processor element 150 is depicted in FIG. 3. Each processor element 150 comprises a forty-bit data input register (DIR) 154, organized as 40×1; a first 128-bit register file (RF0) 158, organized as 128×1; working registers A,B,C and M 162; an arithmetic logic unit 164 including a 1-bit full adder/subtracter; a second 128-bit register file (RF1) 166, organized as 128×1; and a 24-bit data input register (DOR) 168, organized as 24×1. Processor 102 as depicted in FIG. 3 further comprises first read/write circuitry 156 to control reading and writing of data between the DIR/RF0 registers 154/158 working registers A,B,C and M 162, and arithmetic logic unit 164. Second read/write circuitry 167 is provided to control reading and writing of data between DOR/RF1 registers 166/168, working registers A,B,C and M 162, and arithmetic logic unit 164.

Data flow within the PEs is pipelined in three layers or pipeline steps, all operating concurrently: Input, Output, and Computation. In the input layer, the Data Input Register (DIR) acquires or accumulates a packet of data word-serially. In the computation layer the programmed operations are performed simultaneously on all the elements of an already acquired packet via a processor-per-word. The output layer transfers yet another packet from the Data Output Register (DOR) to the output pins, again word-serially.

Within each phase of the computation layer pipeline, a multiplicity of cycles/instructions perform the required operations. The input and output layers or pipeline steps accumulate one data word per cycle, but minimize the I/O pin requirements by suing multiple cycles to transfer the entire packet of data. The number of data words per packet is hardware or software established for each application or system subject to the size of the processor element array; 1024 in the preferred embodiment.

The computation layer or pipeline step also uses multiple cycles to operate on the data. The ALU and data paths dedicated to each data word are one bit wide. Thus functions on multibit words can be computed in multiple cycles.

DIR 154 loads the digitized video signal from lines 118, when an enable signal is applied at input 151. This enable signal is supplied by a 1-of-1024 commutator, sequencer or ring counter 148. Commutator 148 is triggered to begin at the end of the end of a horizontal blanking period, when a standard video signal is present on lines 118, and continue for up to 1024 cycles (at 14.32 MHz) synchronized with the sampling rate (frequency) of analog-to-digital converter 116. Similarly, DOR 168 provides the processed video signal on lines 170 when an enable signal is applied at input 172. This enable signal is received from another 1-of-1024 commutator, sequencer or ring counter 174. Commutator 174 is triggered to begin at the end of a horizontal blanking period and continue for 1024 cycles synchronized with the sampling rate of analog-to-digital converter 124.

Each PE has direct communication with its four nearest neighbors (two to the left and two to the right). Each of the two RFs is capable of independent addressing and read-modify-write cycles such that two different RF locations can be read, the data operated upon by an Arithmetic Logic Unit (ALU), and the result written back into one of the register files RF0 or RF1 locations in a single clock cycle.

External lines are connected in common to all of the processor elements, PEs 150, in the processor array of FIG. 3. These lines will be discussed in greater detail hereinafter, however briefly, they include forty data input lines 118, 7 DIR/RF0 address lines 131, 24 master control lines 130, clock and reset signal lines 142 and 144, 2 test lines 146, 7 DOR/RF1 address lines 133, 24 data output lines 170 and a 1-bit global output 178 (GO) line.

INPUT/OUTPUT

The I/O system of the SVP comprises the Data Input Register 154 (DIR) and the Data Output Register 168 (DOR). DIR and DOR are sequentially addressed dual-ported memories and operate as high speed shift registers. Both DIR and DOR are dynamic memories in the preferred embodiment.

Since the DIR and DOR are asynchronous to the PEs 150 in the general case, some type of synchronization must occur before data is transferred between DIR/DOR and the PEs 150. This usually occurs during the horizontal blanking period in video applications. In some applicators the DIR, DOR, and PEs may operate synchronously, but in any case it is not recommended to read or write to both ports of one of the registers simultaneously.

DATA INPUT REGISTER

Figure 4:
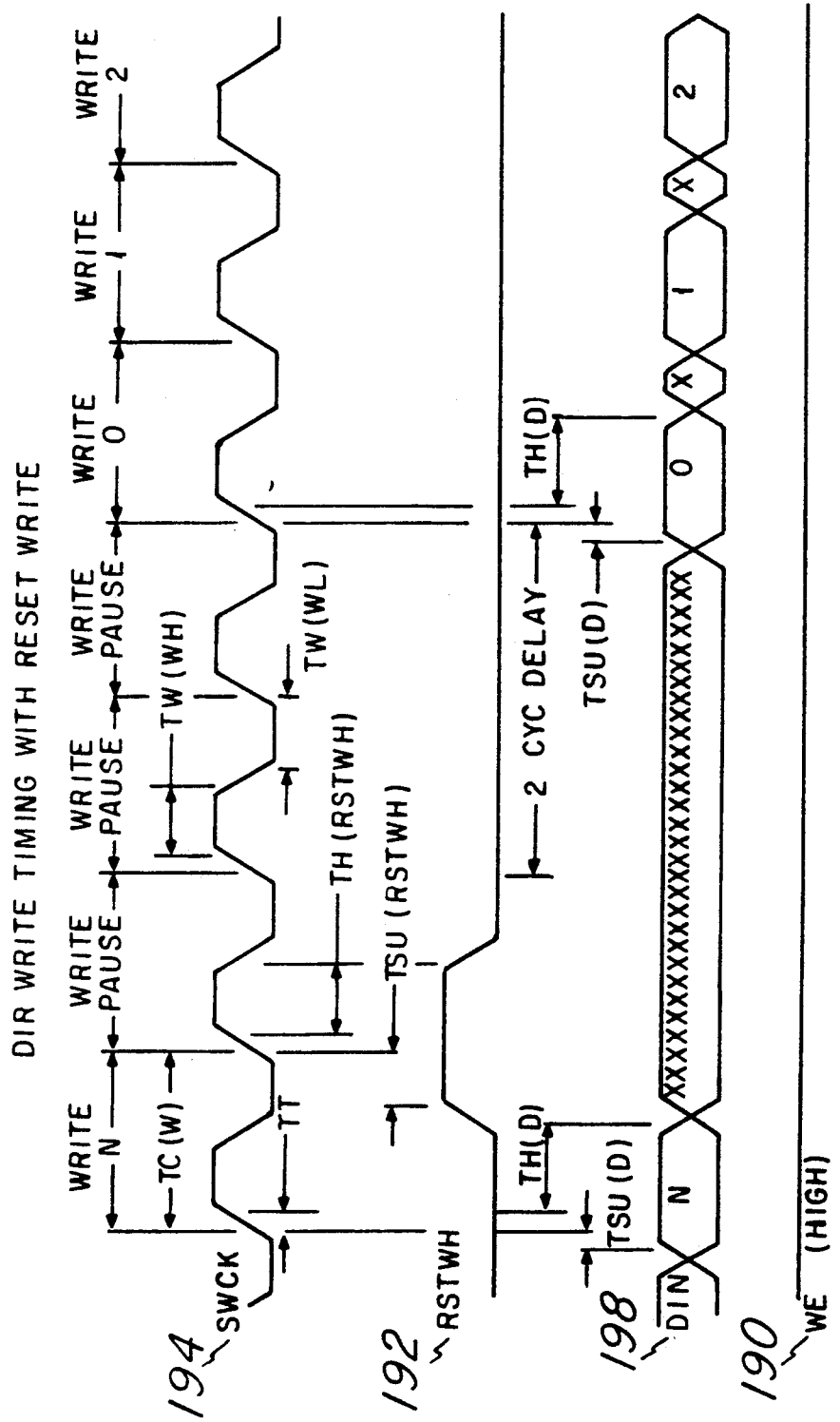
FIG. 4 shows a timing diagram for a Data Input Register write.

With reference again to FIG. 2, the DIR of processor 102 is a 40960 bit dynamic dual-ported memory. One port 119 is organized as 1024 words of 40 bits each and functionally emulates the write port of a 1024 word line memory. FIG. 4 depicts a timing diagram for a DIR write. The 40 Data Inputs 118 (DI0 through DI39) are used in conjunction with timing signals Write Enable 190 (WE), Reset Write 192 (RSTWH), and Write Clock 194 (SWCK). WE 190 controls both the write function and the address pointer 148 (commutator) increment function synchronously with SWCK 194. When high, the RSTWH 192 line resets the address pointer 148 to the first word in the 1024 word buffer on the next rising edge of SWCK. SWCK 194 is a continuous clock input. After an initial two clock delay, one 40 bit word of data 198 is written on each subsequent rising edge of SWCK 194. If data words 0 to N are to be written, WE remains higher for N+4 rising edges of SWCK. The address pointer 148 may generally comprise a 1-of-1024 commutator, sequencer or ring counter triggered to begin at the end of a horizontal blanking period and continue for 1024 cycles synchronized with the sampling frequency of the A-to-D converter 116. The input commutator 148 is clocked at above 1024 times the horizontal scan rate. The output commutator 174 can be, but not necessarily, clocked at the same rate as the input.

It should be noted at this time that although, for purposes of discussion, processor 102 is depicted as having 1024 processor elements, it can have more or less. The actual number is related to the television signal transmission standard employed, namely NTSC, PAL or SECAM, or the desired system or functions in non television applications.

The second port 121 of data input register 154 is organized as 40 words of 1024 bits each; each bit corresponding to a processor element 150. Port 121 is physically a part of, and is mapped into the absolute address space of RF0; therefore, the DIR and RF0 are mutually exclusive circuits. When one is addressed by an operand on a given Assembly language line of assembler code, the other cannot be. An Assembly language line which contains references to both will generate an error at assembly-time. This is discussed in more detail hereinafter.

The DIR 154 works independently of the DOR 168; therefore it has its own address lines 131 and some of its own control lines 135. The exact function of DIR 154 is determined by many lines: C21, C8, C2, C1, C0, the contents of WRM 234, and by addresses RF0A6 through RF0A0, (see FIG. 5). Control line C2=1 selects DIR 154. The seven address lines RF0A6–RF0A0 select 1-of-40 bits to be read or written to while C1 and C0 select the write source (for a read C0 and C1 don't matter). With certain combinations of lines C1 and C0 the write source for DIR. 154 depends on the state of C21 and C8 and the contents of Working Registers M 234. These form instructions called M-dependent instructions which allow more processor 102 flexibility. Table 1 sets forth the control line function for DIR 154.

TABLE 1

| C21 | C8 | C2 | C1 | C0 | (WRM) | Operation on DIR |
|---|---|---|---|---|---|---|
| X | X | 0 | X | X | X | RF0 selected |
| X | X | 1 | 0 | 0 | X | DIR (m) written into DIR(m) (refresh) |
| X | X | 1 | 1 | 0 | X | SM written into DIR(m) |
| X | X | 1 | 1 | 1 | X | (WRM) written into DIR(m) |
| 0 | X | 1 | 0 | 1 | X | (WRC) written into DIR(m) |
| 1 | 0 | 1 | 0 | 1 | 0 | (L/R line of right PE to DIR(m) |
| 1 | 0 | 1 | 0 | 1 | 1 | (L/R line of left PE to DIR(m) |
| 1 | 1 | 1 | 0 | 1 | 0 | (L/R line of 2nd right PE to DIR(m) |
| 1 | 1 | 1 | 0 | 1 | 1 | (L/R line of 2nd left PE to DIR(m) | where, 'm' is the binary combination of {RF0A6, RF0A5, ... RF0A0} and is in the range. 0 <= m <= 39.
The range 40 <= m <= 127 is reserved.

Figure 5:
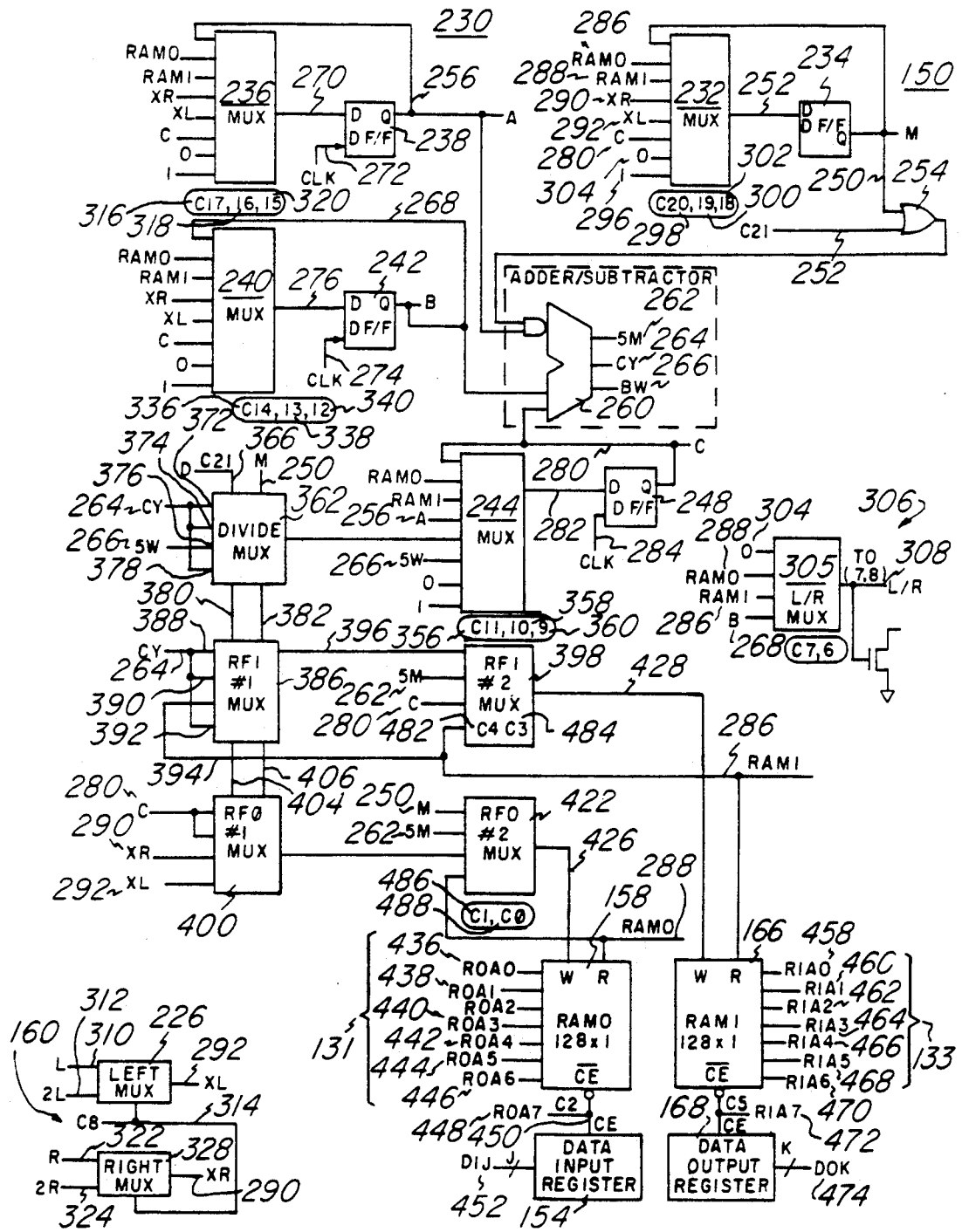
FIG. 5 shows a logical diagram of the FIG. 3 processor element.

The processor element logical diagram of FIG. 5 details the interconnect of RF0 158 and DIR 154. C21, C8, C2, C1, C0, and RF0A6 through RF0A0 are control/address lines common to all 1024 PEs. Signal C 280 and M 250 are from WRC 248 and WRM 234 respectively. SM 262 is from the ALU 260. R 322, 2R 324, L 310, and 2L 312 are signals from this PE's four nearest neighbors. The 40 DIR words are read or written by instructions using the copyrighted key nnemonics:

(INP(m) where $0 \leq m \leq 39$ or XX NIP(m) where XX is a Near-neighbor option.

In order to make the hardware more efficient, the same address lines and much of the same hardware is shared between DIR 154 and RF0 158.

The memory map of Table 2 below requires an eight bit address. This address is made up of Control line C2 (RF0A7) as the MSB and Address lines RF0A6 through RF0A0 as the lesser significant bits. C2 is not considered an address because the selection of the DIR 154 versus RF0 158 is implicit in the instruction mnemonic.

TABLE 2

| C2 | Absolute Address | | Relative Address |
|---|---|---|---|
| 0 | 000 | Register File 0 RF0 | R0(0) |
| 0 | 07Fh | | R0(127) |
| 1 | 080h | Data Input Register DIR | INP(0) |
| | 0A7h | | INP(39) |
| | 0A8h | reserved | |
| | 0FFh | | |

DIR/RF0 Memory Map: h indicates hexidecimal

DATA OUTPUT REGISTER

Figure 6:
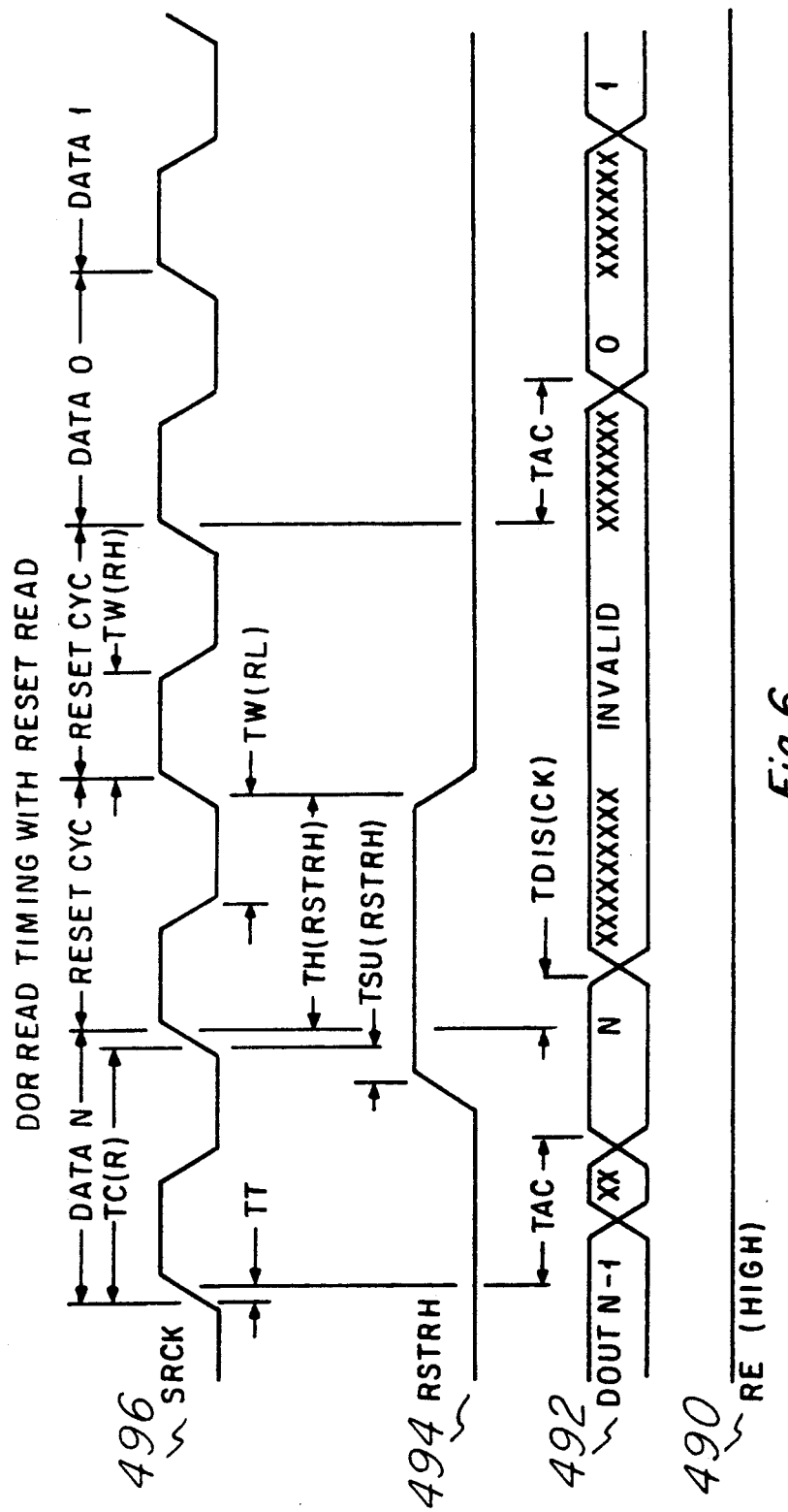
FIG. 6 shows a timing diagram for a Data Output Register read.

With reference again to FIG. 3, DOR 168 is a 24576 bit dynamic dual-ported memory. One port 169 is organized as 1024 words of 24 bits each and functionally emulates the read port of a 1024 word line memory. The Data Outputs (DO0 through DO23) 170 are used in conjunction with the signals Read Enable (RE), Reset Read (RSTRH), and Serial Read Clock (SRCK) of FIG. 6. SRCK 496 is a continuous clock input. RE 490 enables and disables both the read function and the address pointer increment function synchronously with SRCK 496. When high, the RSTRH line 494 resets the address pointer (commutator) to the first word in the 1024 word buffer on the next rising edge 498 of SRCK 496. After an initial two clock delay, one 24 bit word of data is output an access time after each subsequent rising edge of SRCK. If data words 0 to N are to be read, then RE must remain high for N+3 rising edges of SRCK. As discussed hereinabove with reference to DIR 154, the address pointer 174 can similarly comprise a 1-of-1024 commutator or ring counter.

The second port 167 of data output register 168 is organized as 24 words of 1024 bits each; each bit corresponding to a Processor Element 150. Port 167 of DOR 168 is physically a part of, and is mapped into the absolute address space of RF1 166; therefore, the DOR 168 and RF1 166 are mutually exclusive circuits. When one is addressed by an operand on a given Assembly line, the other cannot be. An Assembly line which contains references to both will generate an assembly-time error. This is discussed in more detail hereinafter.

DOR 168 works independently of DIR 154; therefore it has its own address lines 133 and some of its own control lines 137. The exact function of DOR 168 is determined by many lines: C21, C5, C4, C3, the contents of WRM 234, and by addresses RF1A6 through RF1A0, (See FIG. 5). Control line C5=1 selects DOR 168. The seven address lines 133 select 1-of-24 bits to be read or written to while C4 and C3 select the write source. With certain combinations of control lines C4 and C3, the write source DOR 168 depends on the state of C21 and the contents of Working Register M 234. These form instructions called M-dependent instructions which allow more processor 102 flexibility. Table 3 sets forth the control line 130 function for DOR 168.

TABLE 3

| C21 | C5 | C4 | C3 | (WRM) | Operation on DOR |
|---|---|---|---|---|---|
| X | 0 | X | X | X | RF1 selected |
| X | 1 | 0 | 0 | X | DOR(q) written into DOR(q) (refresh) |
| X | 1 | 0 | 1 | X | (WRC) written into DOR(q) |
| X | 1 | 1 | 0 | X | SM written into DOR(q) |
| 0 | 1 | 1 | 1 | X | CY written into DOR(q) |
|   |   |   |   |   | KCY - Conditional Carry: |
| 1 | 1 | 1 | 1 | 0 | DOR(q) written into DOR(q) |
| 1 | 1 | 1 | 1 | 1 | CY written into DOR(q) |

Where, 'q' is the binary combination of {RF1A6, RF1A5, ... RF1A0} and is in the range, $0 <= q <= 23$.
The range $24 <= q <= 127$ is reserved.

The logical diagram of FIG. 5 details the interconnect of RF1 and the DOR. C21, C5, C4, C3, and RF1A6 through RF1A0 are control/address/data lines common to all 1024 PEs. Signal C 280 and M 250 are from WRC 248 and WRM 234 respectively. SM 262 and CY 264 are from ALU 260.

In order to make the hardware more efficient, the same address lines 133 and much of the same hardware is shared between DOR 168 and RF1 166.

The memory map of Table 4 below requires an eight bit address. This address is made up of Control line C5 (RF1A7) as the MSB and Address lines RF1A6 through RF1A0 (133) as the lesser significant bits. C5 is not considered an address because the selection of the DOR 168 versus RF1 166 is implicit in the instruction mnemonic by bit C5.

TABLE 4

| C5 | Absolute Address |   | Relative Address |
|---|---|---|---|
| 0 | 000 |   | R1(0) |
| : | : | Register File 1 RF1 | : |
| 0 | 07Fh |   | R1(127) |
| 1 | 080h | Data Output Register DOR | OUT(0) |
| : | : |   | : |
| : | 097h |   | OUT(23) |
| : | 098h | reserved |   |
| : | 0FFh |   |   |

DOR/RF1 Memory Map: h indicates hexidecimal

PE REGISTER FILES

In FIG. 3, each PE 150 contains two Register Files, RF0 158 and RF1 166. Each RF comprises 128 words by 1 bit of read/write memory for a total of 256 bits per PE 150.

There are two addressing structures in Processor Array 105: one 131 for RF0 158 covering all 1024 PEs, and one 133 for RF1 166 covering all 1024 PEs. Both register files have independent address, select, and instruction lines associated with them, but they share the same control 130 and timing 142 circuitry. This means that both register files read data at the same time, and for electrical efficiency they write independently of each other.

RF0 158 and RF1 166 can be read-only, or can be written to from several sources including the C 248 or M 234 registers, or directly by the SM 262 output of ALU 260. Also, M-dependent instructions conditionally allow data sources like CY 264 output directly from ALU 260 or from near neighbors 160. 'X' in Table 5, following, represents Left 310 or Right 322 neighbor, and 'X2' represents 2nd Left 312 or 2nd Right 324 neighbor depending on the value in WRM 234. Other data may be written to a RF by first passing it to one of these places.

TABLE 5

| Register File | below illustrates the possible write data sources for each Register File: |||||||||
|---|---|---|---|---|---|---|---|---|---|
|  | WRITE DATA SOURCE |||||||||
|  | RF0 | RF1 | M | C | X | X2 | SM | CY | KCY |
| RF0 | * |  | * | * | * | * | * |  |  |
| RF1 |  | * | * | * |  |  | * | * | * |

As mentioned, the register files RF0 and RF1, thus are independently addressable, thus a one-bit multiply-accumulate operation can be performed in a single processor cycle. That is, the following arithmetic expression may be evaluated by each PE in one clock cycle:

$$R1(p)' = (R0(n)*M) + R1(p)$$

where,
M = the value continued in WRM (Working Register M)
R0(n) = the value contained in RF0 at address n
R1(p) = the value contained in RF1 at address p
R1(p)' = the value to be written back into RF1 at address p In a preferred embodiment the Register Files, Data Input Register, and Data Output Register are dynamic read only memories and are periodically refreshed unless implicitly refreshed by the running program. In many applications, (such as digital TV) the program will keep the RFs refreshed if the software loop is repeated more frequently than the refresh period. This keeps any memory locations which are being used by the program refreshed, while unused bits are allowed to remain un-refreshed. Also, a program can explicitly refresh both RFs by simply reading all locations of interest within the refresh period.

REGISTER FILE 0 (RF0)

RF0 158 works independently of RF1 166; therefore it has its own address lines 131 and some of its own control lines. The exact function of RF0 158 is determined by many lines: C21, C8, C2, C1, C0, the contents of WRM 234, and by addresses RF0A6 through RF0A0 (See FIG. 5). Control line 448 C2=0 selects RF0 158. The seven address lines 131 select 1-of-128 bits to be read or written to while C1 and C0 select the write source. With certain combinations of control lines C1 and C0, the write source for RF0 158 depends on the state of C21 and C8 and the contents of Working Register M 234. These form instructions called M-dependent instructions which allow more processor 102 flexibility. Table 6 sets forth the control line function for register file 0 158.

TABLE 6

| C21 | C8 | C2 | C1 | C0 | (WRM) | Operation on DOR |
|---|---|---|---|---|---|---|
| X | X | 1 | X | X | X | DIR selected |
| X | X | 0 | 0 | 0 | X | RF0(n) written into RF0(n) (refresh) |
| X | X | 0 | 1 | 0 | X | SM written into RF0(n) |
| X | X | 0 | 1 | 1 | X | (WRM) written into RF0(n) |
| 0 | X | 0 | 0 | 1 | X | (WRC) written into RF0(n) |
| 1 | 0 | 0 | 0 | 1 | 0 | (L/R line) of right PE to |

TABLE 6-continued

| C21 | C8 | C2 | C1 | C0 | (WRM) | Operation on DOR |
|---|---|---|---|---|---|---|
| 1 | 0 | 0 | 0 | 1 | 1 | RF0(n) (L/R line) of left PE to RF0(n) |
| 1 | 1 | 0 | 0 | 1 | 0 | (L/R line) of 2nd right PE to RF0(n) |
| 1 | 1 | 0 | 0 | 1 | 1 | (L/R line) of 2nd left PE to RF0(n) |

Where, 'n' is the binary combination of {RF0A6, RF0A5, ... RF0A0} and is in the range, $0 <= n <= 127$ The logical diagram of FIG. 5 details the interconnect of RF0 158 and the DIR 154. C21, C8, C2, C1, C0, and RF0A6 through RF0A0 are control/address lines common to all 1024 PEs. Signal C 280 and M 250 are from WRC 248 and WRM 234 respectively. SM 262 is from ALU 260. R 322, 2R 324, L 310, and 2L 312 are signals from this PEs four nearest neighbors.

In order to make the hardware more efficient, the same address lines 131 and much of the same hardware is shared between DIR 154 and RF0 158. The memory map of Table 2 requires an eight bit address. This address is made up of Control line C2 as the MSB. Address lines RF0A6 through RF0A0 are the lesser significant bits. C2 is not considered an address because the selection of the DIR versus RF0 is implicit in the instruction nmemonic. Other registers are mapped into the memory space so all undefined memory space in the memory map of Table 2 is reserved.

REGISTER FILE 1 (RF1)

RF1 166 works independently of RF0 158; therefore it has its own address lines 133 and some of its own control lines. The exact function of RF1 166 is determined by many lines: C21, C5, C4, C3, the contents of WRM 234, and by addresses RF1A6 through RF1A0 (133). Control line C5=0 selects RF1. The seven address lines 133 select 1-of-128 bits to be read or written to while C4 and C3 select the write source. With certain combinations of control lines C4 and C3, the write source depends on the state of C21 and the contents of Working Register M 234. These form instructions called M-dependent instructions which allow more processor flexibility. Table 8 sets forth the control line function for register file 1.

TABLE 8

| C21 | C5 | C4 | C3 | (WRM) | Operation on DOR |
|---|---|---|---|---|---|
| X | 1 | X | X | X | DOR selected |
| X | 0 | 0 | 0 | X | RF1(p) written into RF1(p) (refresh) |
| X | 0 | 0 | 1 | X | (WRC) written into RF1(p) |
| X | 0 | 1 | 0 | X | SM written into RF1(p) |
| 0 | 0 | 1 | 1 | X | CY written into RF1(p) KCY - Conditional Carry: |
| 1 | 0 | 1 | 1 | 0 | RF1(p) written into RF1(p) |
| 1 | 0 | 1 | 1 | 1 | CY written into RF1(p) |

Where, 'p' is the binary combination of {RF1A6, RF1A5, ... RF1A0} and is in the range, $0 <= p <= 127$ The logic diagram of FIG. 5 details the interconnect of RF1 166 and DOR 168. C21, C5, C4, C3, and RF1A6 through RF1A0 are control/address lines common to all 1024 PEs. Signal C 280 and M 250 are from WRC 248 and WRM 234 respectively. SM 262 and C7 264 are from ALU 260.

In order to make the hardware more efficient, the same address lines 133 and much of the same hardware is shared between DOR 168 and RF1 166. The memory map of Table 4 requires an eight bit address. This address is made up of Control line C5 are the MSB. Address lines RF1A6 through RF1A0 are the lesser significant bits. C5 is not considered an address because the selection of the DIR versus RF1 is implicit in the instruction nmemonic. Other registers are mapped into the memory space so all undefined memory space in the memory map of Table 4 is reserved.

READ/WRITE CIRCUITRY

Figure 7:
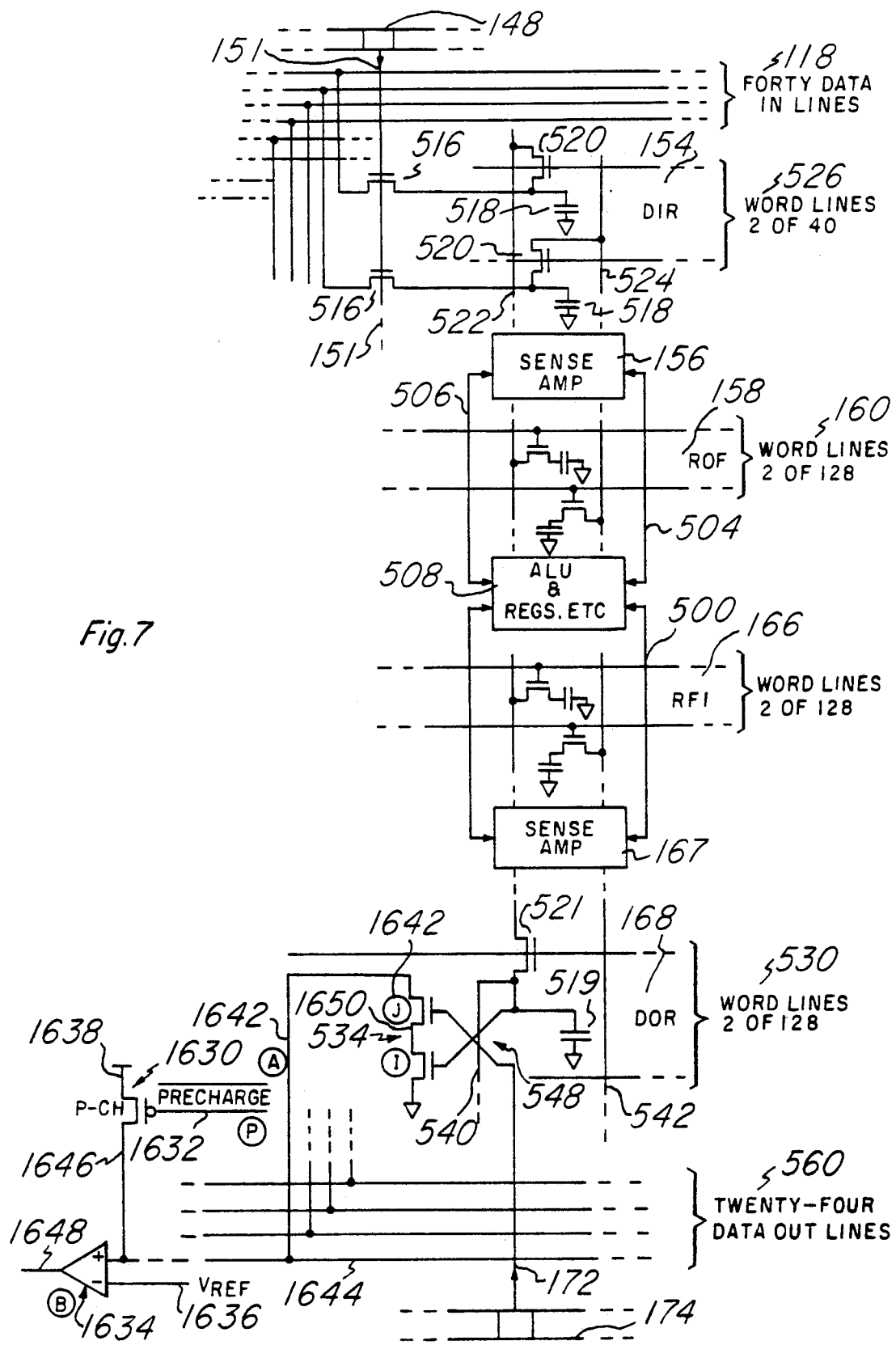
FIG. 7 shows in greater detail the FIG. 3 processor element.
Figure 8A:
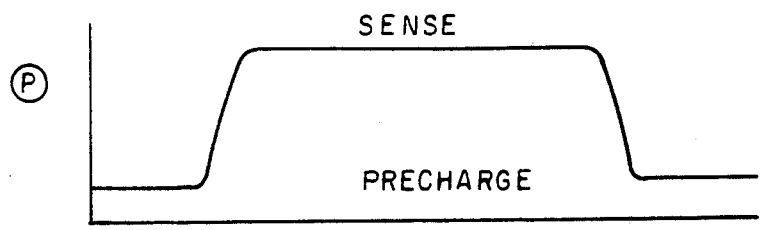
FIGS. 8a–8d shows graphs depicting voltage levels at various nodes of a DOR precharge circuit.
Figure 8B:
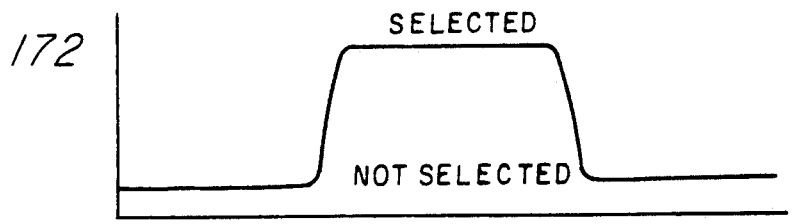
Figure 8C:
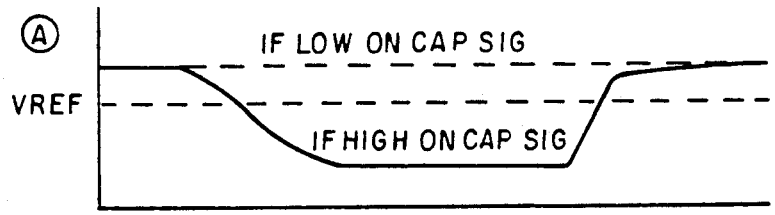
Figure 8D:
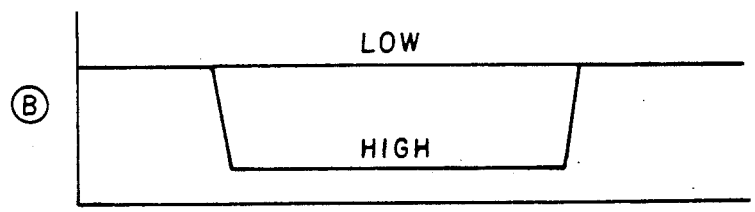

In FIG. 3, blocks 156 and 169, labeled read/write circuitry includes one or more sense amps. FIG. 7 depicts RF0 comprising a 128-bit dynamic random-access memory configured $1 \times 128$. Actually, the RF0 data memory 158 and the DIR input register 154 are parts of the same $1 \times 168$ DRAM column, but DIR 154 differs from the RF0 158 part in that DIR 154 can be written into from the inputs DI0-39 forty bits in parallel. A similarly arrangement exists for the DOR/RF1. However, only 24 (DO0-23) parallel output lines are provided on the DOR. In one embodiment, there are two sense amps per processor element 150. One 156 for the DIR/RF0 and the other 167 for the DOR/RF1. Each sense map reads or writes data to the addressed portion of the data register 154 or 168, or register file 158 or 166. The sensed data is transferred between registers and multiplexers (508), FIG. 7, and the memory banks DIR/RF0 and DOR/RF1 via I/O lines 500, 502, 504 and 506. The particular bit being addressed in the $1 \times 128$ memory RF0 158 part of the DRAM column is selected by the 128, word lines 160, shared by all 1024 processor elements 150. The controller 128 provides six address bits 131A to DIR 154 for a 1-of-64 address selection; (The 7th bit is decoded as; "=0" for DIR selection "=1" for DIR deselected) and provides 7 address bits 131B to RF0 158 for a 1-of-128 address section. The same address selection is provided to RF0 or DIR of all 1024 processor elements 150. Likewise, a second one-bit wide dynamic memory 166, referred to as RF1, is used on the output side of processor 102, again receiving 7 address bits 133B for a 1-of-128 address selection. The RF1 166 memory is associated with a 24-bit data output register 168 called DOR, receiving 5 address bits 133A for a 1-of-32 address selection. The input commutator 148 is clocked at above 1024 times the horizontal scan rate, so all 1024 of the input registers 154 can be loaded during a horizontal scan period. The output commutator 174 may be but is not necessarily clocked at the same rate as the input.

Pointer input 151 from communicator 148 is seen to drive a set of forty input transistors 516 which connect forty data lines 118 (from the parallel inputs DI0-DI39) to dynamic memory cells 518. These cells are dual-port, and are also written to or read from through access transistors 520 and folded bit lines 522 and 524 connected to sense amplifier 156, when addressed by word lines 526. There are forty of the word lines 526 for the DIR part and 128 of the word lines 160 for the RF0 part of this 168-bit dynamic random access (DRAM) column.

As stated earlier hereinabove, the DIR is a 2-transistor dual port cell. Reading and writing can be performed for each port. The DIR operates as a high speed dynamic shift register. The dual port nature allows asynchronous communication of data into and out of the DIR. By using dynamic cells the shift register layout is greatly reduced. Although a dummy cell can be use, it is not a requirement for cell operation.

The data output register utilizes a 3-transistor dual port gain cell. In most applications reading and writing is allowed at port 167, not only reading is performed from second port. DOR 168 also operates as a high speed dynamic shift register. The DOR with gain transistor circuit allows reading of capacitor 519 without destroying the stored charge. In operation if a logical "1" on cell 519 is greater than $1V_T$ of transistor 1640, when select line 172 is turned on, line 1642 will be pulled to a logical "0" or to zero volts, eventually. If the charge on cell 519 is less than $1V_T$ (i.e., a logical "0" or low) the charge on line 1642 will remain at a precharge value. Transistor 1642 is the cell read select transistor. All twenty four data outlines 560 are sensed simultaneously by transistor 1642 (i.e., transistor 1642 selects the processor element cells). As shown node 1650 is isolated. This connection reduces possibility of data a loss in cell from noise generated from reading other processor element cells. Each 128 cell section has a comparator 1634 on the output line to sense the signals. A reference voltage is applied to comparator input 1636. Source 1638 of transistor 1630 is connected to $V_{DD}$. This is not a requirement however, and source 1638 may be connected to another voltage level.

FIGS. 8a-d illustrate voltage levels at several lines and nodes of the DOR circuit.

Figure 9:
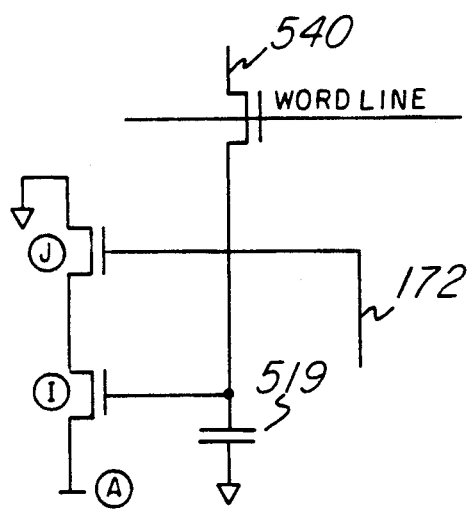
FIG. 9 shows an alternative 3-transistor DOR cell for the FIG. 7 embodiment.

FIG. 9 illustrates an alternative DOR cell.

As previously indicated hereinabove a preferred embodiment of PEs 150 for video applications utilize a 40-bit wide input data bus 118 and a 24 bit video output data bus 170. These bus widths in combination with high clocking speeds of 8fsc (35 ns) results in a large power drain and noise on the bus lines if the entire bus width for the 1024 DIR 154 or DOR 168 must be powered up for the entire clocking period. However because only an individual DIR (or DOR) is being read from or written to at any particular portion of the clocking period, it is possible to power up only the DIR 168 being written to or a portion of the DIR serial array including the DIR being written to at any given time.

Figure 10:
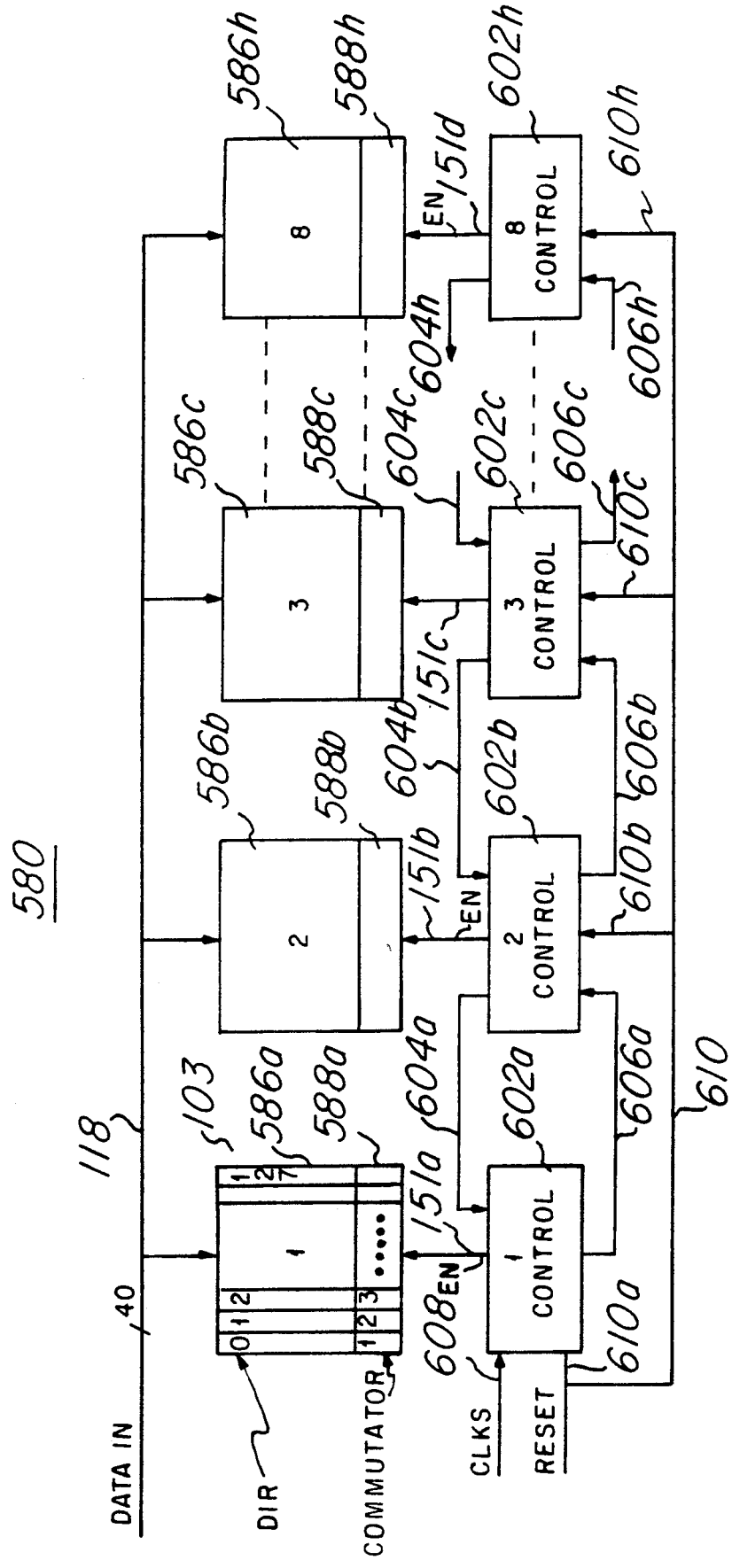
FIG. 10 shows a DIR noise reduction circuit.

FIG. 10 depicts an SVP 102 input bus line 118 power drain and noise reduction control circuit 580. Circuit 580 reduces noise and power requirements of SVP 102 during a DIR 154 write. For purposes of discussion and illustration the 1024 by 40 DIR array 154 is segmented into eight segments or portions 586a-h, each including 128 PEs 150. Data is clocked into memory locations of each 128 DIR segment 586 by a segment of commutator 148 operating under control of a corresponding control unit 602. Control unit 1 (602a) has a segment of clock inputs 608 timed to be in sync with the horizontal scanning rate of the input video data signals on line 118. Each of the eight control units 602 is connected to receive a reset signal 610. The reset signal causes the first control unit 602a to power up and powers down the remaining units 602b-h. Control unit 602 output signals include a commutator enable signal 151 for enabling the commutator 588 for operation as previously described. The individual control unit 602 output signals also include a power up output signal 606 for powering up the next adjacent control unit for operation when data signal write to the presently operating section is near completion. For example, once data read from line 118 to the DIR section 586a is near completion, the next adjacent control unit 602b enables its commutator segment 588b to be ready for a data write. Once segment 602b enables commutator section 588b, a signal on line 604a powers down previous control unit 602a since it has completed writing data to segment 586a. This power up/power down control sequence is repeated for each section until all 1024 DIRs have been loaded. In this fashion only the commutator for the group of DIRs being written to is powered up during a portion of the clock cycle. In accordance with the previously described SVP 102 operation, during the video data signal scan line horizontal blanking period the DIR data in all sections 586a-h is clocked into RF0 while the controller reset signal is made active and a new scan line is ready for input.

Figure 11:
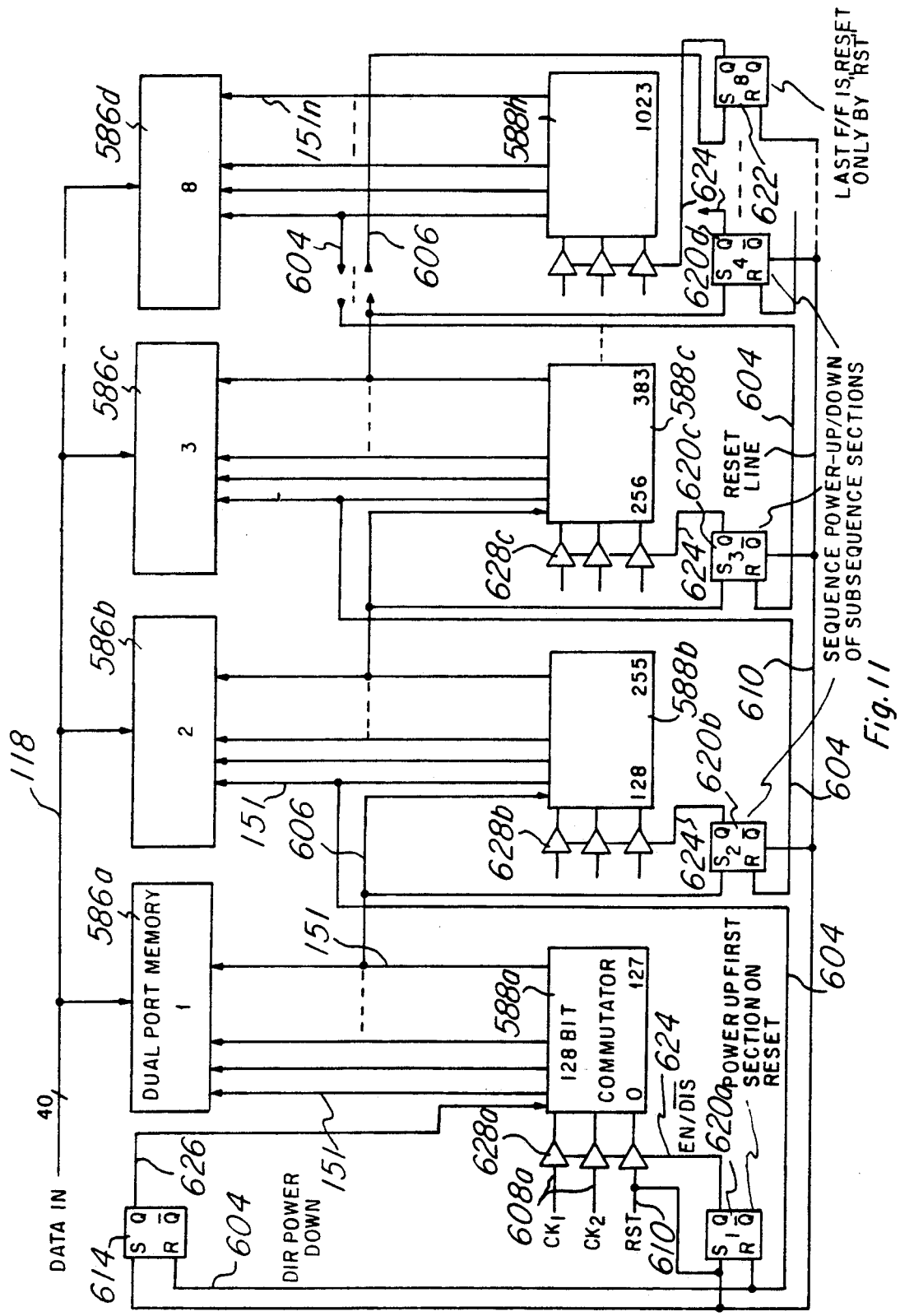
FIG. 11 shows a noise reduction circuit in greater detail than that of FIG. 10.

Referring now to drawing FIG. 11, a logical block diagram of a preferred embodiment of the power drain and noise reduction control circuit 580 depicted in drawing FIG. 10, is depicted in greater detail. In FIG. 11, control circuit 580 is shown comprising subcircuits including flip-flops 614, 620 and 622.

In operation a reset signal at input 610 triggers the S or set input of flip-flops 614 and 620a. The same reset signal 610 triggers the clear inputs to flip-flops 620b--620g and triggers the rest input to flip-flop 622. When set input of flip-flop 620a is triggered its Q output is activated to enable drivers 628. When drivers 628 are enabled, clock signals at their inputs are provided to commutator 588a inputs. Power up of commutator 588a for operation begins with a high level on the Q output signal of flip-flop 614. Commutator enable signal 151 triggers reading of first 40-bits of the video data signal present on lines 118 into the first DIR memory locations. A signal on line 604 resets flip-flop 614 after commutator 588a is finished.

Clock signal 608 triggers commutator 588 timed with the incoming video signal rate as previously discussed. The same clock signals are provided to all clock inputs 608 at the same time. However, because drivers 608b-608h are disabled their corresponding commutators 588b-588h are not activated. Commutator 588a sequentially enables each signal line $151_0$ through $151_{127}$ corresponding to DIR memory locations 0-127 of the first segment. As signal a line $151_{127}$ is enabled for DIR 127 write, the enable signal is also provided to the set input of flip-flop 620b and is provided via line 606 to power up commutator 588b. The set of Q input of flip-flop 620b activates drivers 608b to pass clocking signals to commutator 588b for its operation as described with respect to commutator 588a. As signal line $151_{128}$ is activated by commutator 588b a signal is provided via line 604 to power doen commutators to the reset input of flip-flop 620a to deactivate drivers 628a. The deactivation of drivers 628a occurs after the forty bits of data is input to DIR 127. The power up and power down sequence continues until all commutators 588a-588h have operated to load DIR locations 0-1023. Flip-flop 622 is reset by reset signal 610 after completion of commutator 588h operation.

Control circuit 580 substantially reduces power drain by only powering up the portion of the circuitry being written. This also serves to reduce noise which would otherwise be present on the data lines.

Figure 12:
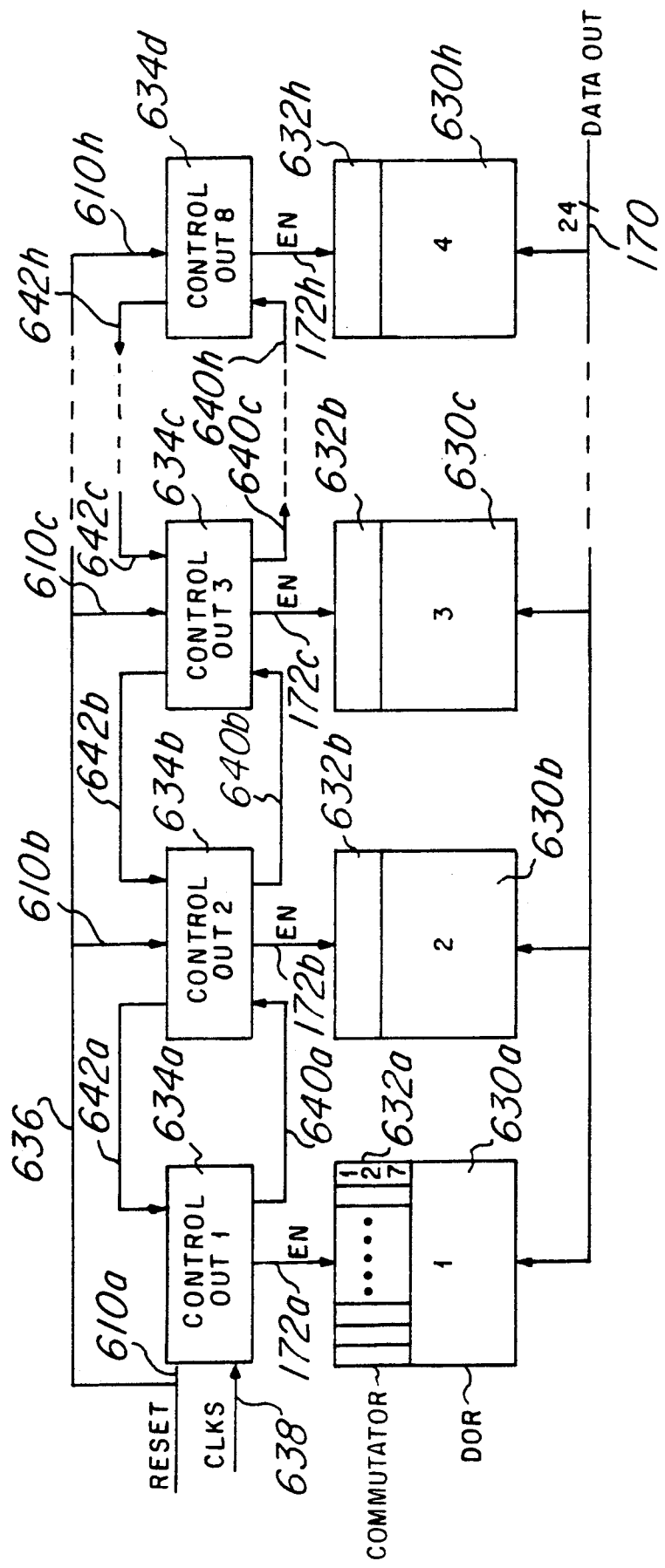
FIG. 12 shows a DIR noise reduction circuit.

FIG. 12 depicts a power and noise reduction circuit for use with the DOR 168 or output side of processor 102. The FIG. 12 circuit operates similarly to FIG. 11 circuit. Breaking the DIR and DOR into eight sections is for purposes of illustration only. Depending on the chip layout it is conceivable to have thirty-two or more sections. Additionally, the commutator can be part of the control unit in an alternative embodiment. Commutator segments 588 can be portions of a single commutator functioning as separate commutators, or there can be a plurality of individual commutators.

STANDARD AND NON-STANDARD SIGNALS

TVs have many signal sources. They can be classified into two types: standard and non-standard. A standard signal is the ideal case for digital circuits, while non-standard signals create many problems for a digital television system. An example of a standard signal is a TV station where the color burst frequency, the horizontal and vertical sync periods, and the phase relationship between these three are all essentially invarient. A home VCR is a good example of a non-standard signal source. It is classified as such because the precise relationship between the horizontal sync pulses and the chroma burst is lost during the record/playback process, and the introduction of tape jitter distorts the timing relationship between successive fields.

Figure 13:
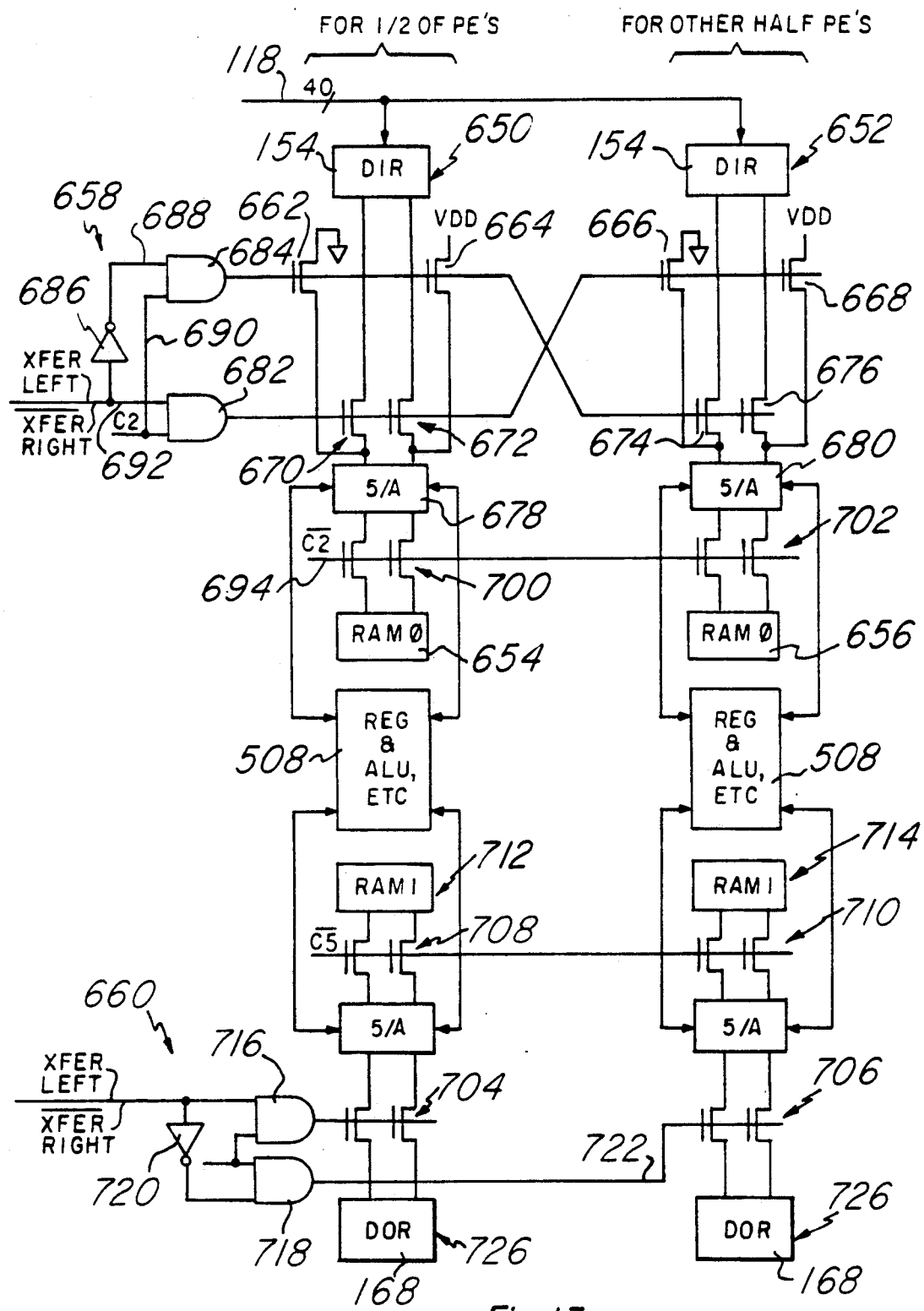
FIG. 13 shows a data input control circuit.

Although video data signals are provided on line 118 to SVP 102 continuously, the array data input registers 109 hold only one video scan line at a time. As previously discussed, during the horizontal blanking period the presently held scan line is shifted into RF0 register files in order to free the input register for a new scan line of data. The new scan line is provided after the horizontal blanking period. During the next blanking period and scan line time, the presently held data in the register files RF0 and RF1 is processed by the PEs. Also register file data can be transferred to other processed elements via the near neighbor communications network. Although not generally performed, data in the DIR or DOR can be processed directly by the processor elements. This sequence of events is not desirable in non-standard signal applications where there does not exist a pause (horizontal blanking period) in the input signal. An example of such an application is when the input signal is a VCR output. In this case there is no time to stop the signal and transfer the data between processor element components; e.g. DIR to RF0 and RF1 to DOR. To solve this problem the SVP architecture depicted in FIG. 13 can be employed. In FIG. 13, the 1024 data input registers 154 are split into two segments, left 650 and right 652. It should be noted that more segments can exist as desired. Each segment 650 and 652 includes one-half (512) of the total processor elements. For ease of illustration and discussion only one processor element from the left side and one processor element from the right side are shown. In operation, data signals on line 118 are transferred into the DIRs of segment 650, while data previously stored in segment 652 is concurrently being transferred into the register files 656. After data from DIR segment 652 is transferred to register files 656, segment 650 DIRs transfer their data to register files 654 while segment DIRs 652 load new data. In this fashion only one-half of the DIRs of the processor need be full before being shifted into the register files.

An example control circuit 688 for controlling segment selection and operation is also depicted in FIG. 13. Control circuit 658 includes DIR select transistors, such as transistors 670 and 672 for the left half and 674 and 676 for the right half. Select transistor 670 has its source and drain connected between the DIR and the processor element sense amp 678. The gate of transistor 670 is connected to the output of AND gate 682. Input lead 692 of AND gate 682 receives a XFERLEFT or XFERIGHT signal. Input lead 690 receives microcode control bit C2. When C2=1 DIR is selected; when C2=0 RF0 is selected.

Transistor 672 is connected in a similar manner between DIR 650 and sense AMP 678. Similarly connected are transistors 674 and 676 of segment 652. Each DIR of each segment control circuit also includes a two transistor network which forces the sense amps to a known state as desired during operation. These are transistors 662 and 664 for the left half DIRs and transistors 666 and 668 for the right half DIRs.

Transistor 662 has its source connected to the source of transistor 670 and its drain is grounded. Similarly, the source of transistor 664 is connected to the source of transistor 672. The drain of transistor 664, however, is connected to $V_{DD}$. The gates of transistors 662 and 664 are connected to the output of AND gate 684. AND gate 684 has two inputs. Input 688 is conducted to the output of inverter 686, the input of which is connected to the XFERLEFT/XFERRIGHT signal. Input 690 of AND gate 684 is connected to control bit C2.

The control output from AND gate 684 is cross coupled from segment half 650 to 652 such that the output controls transistor 662 and 664 on the left side and transistors 674 and 676 on the right side. The output of AND gate 682 is similarly cross coupled between the left and right halfs of processor 102. On the left side gate 682 output controls transistors 670 and 672. On the right side gate 682 controls transistors 666 and 668.

In operation a high level on the XFERLEFT and C2 signals results in a low signal output from AND gate 684 and a high signal output from AND gate 682. This selects the contents of left side DIRs for transfer to RF0 and activates the right side DIRs for loading. A low or XFERRIGHT signal on lead 692 wile C2 is 1, selects the left side DIRs for loading and the right side DIRs for transfer of data to RF0. This sequence is repeated so that the DIR scan continually receives and transfers data alternatively in a piston like manner.

After a full scan line has been loaded into the DIRs and transferred into the register files a software program executed by processor 102 logically ORs the even address data transferred data with zeroes to recover the original data. The odd address data transferred is logically ANDed with ones to recover the original data. This is illustrated in drawing FIG. 14. After the data received from data line 118 has been recovered from the two segment processing as previously discussed can begin.

Figure 15:
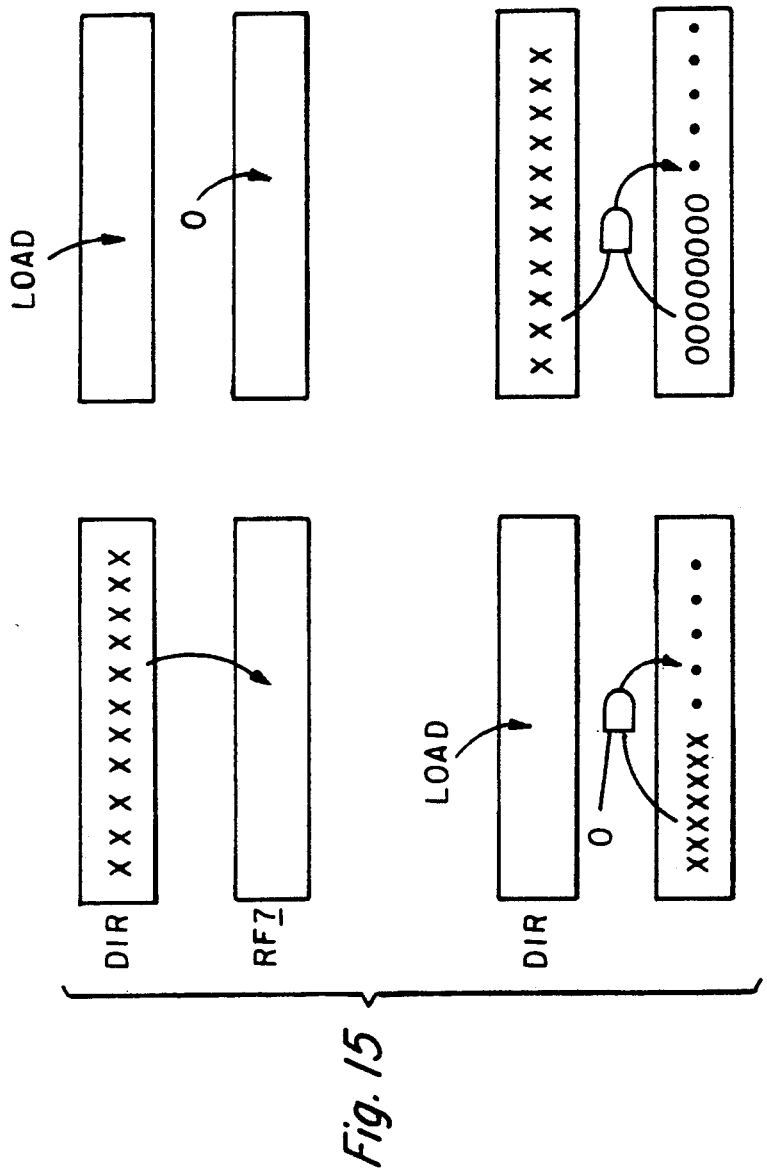
FIG. 15 shows an alternative method of recovering transmitted data.

FIG. 15 shows an alternative scheme for recovering the originally transferred data. Instead of recovering the even and odd addresses separately, the drains of transistors 664 and 668 in FIG. 13 can be tied to ground and add and even addresses can be treated equally. The following would occur. Input first half: (XFERLEFT=1); M=1, A=INP(j), B=0, C=0, R1(n)=SM. Then OR first data with results of first part: (XFERLEFT=0); M=1, A=R1(n); B=INP(j), C=1, R1(n)=CY.

Figure 16:
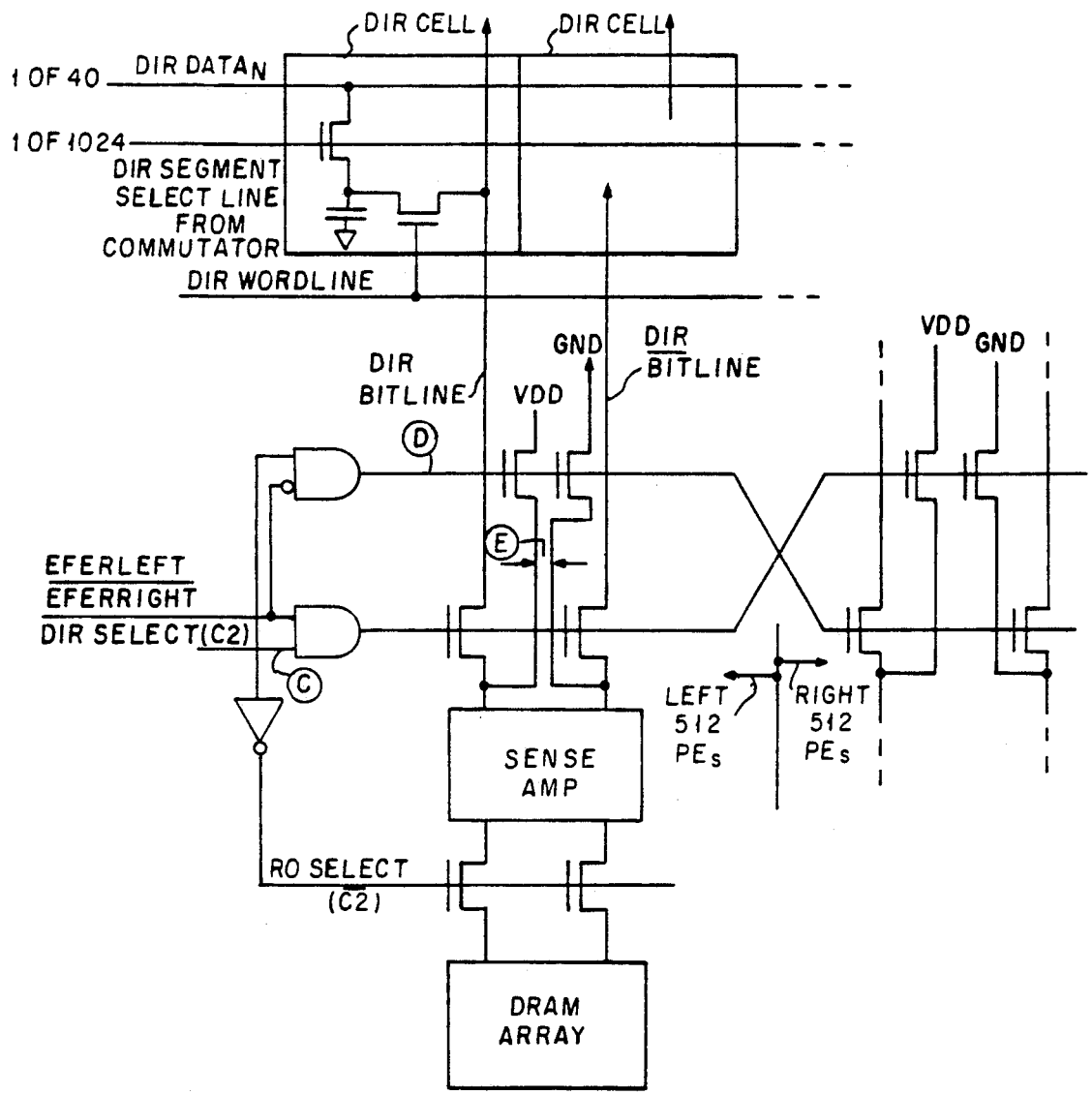
FIG. 16 shows a DOR control circuit.
Figure 17:
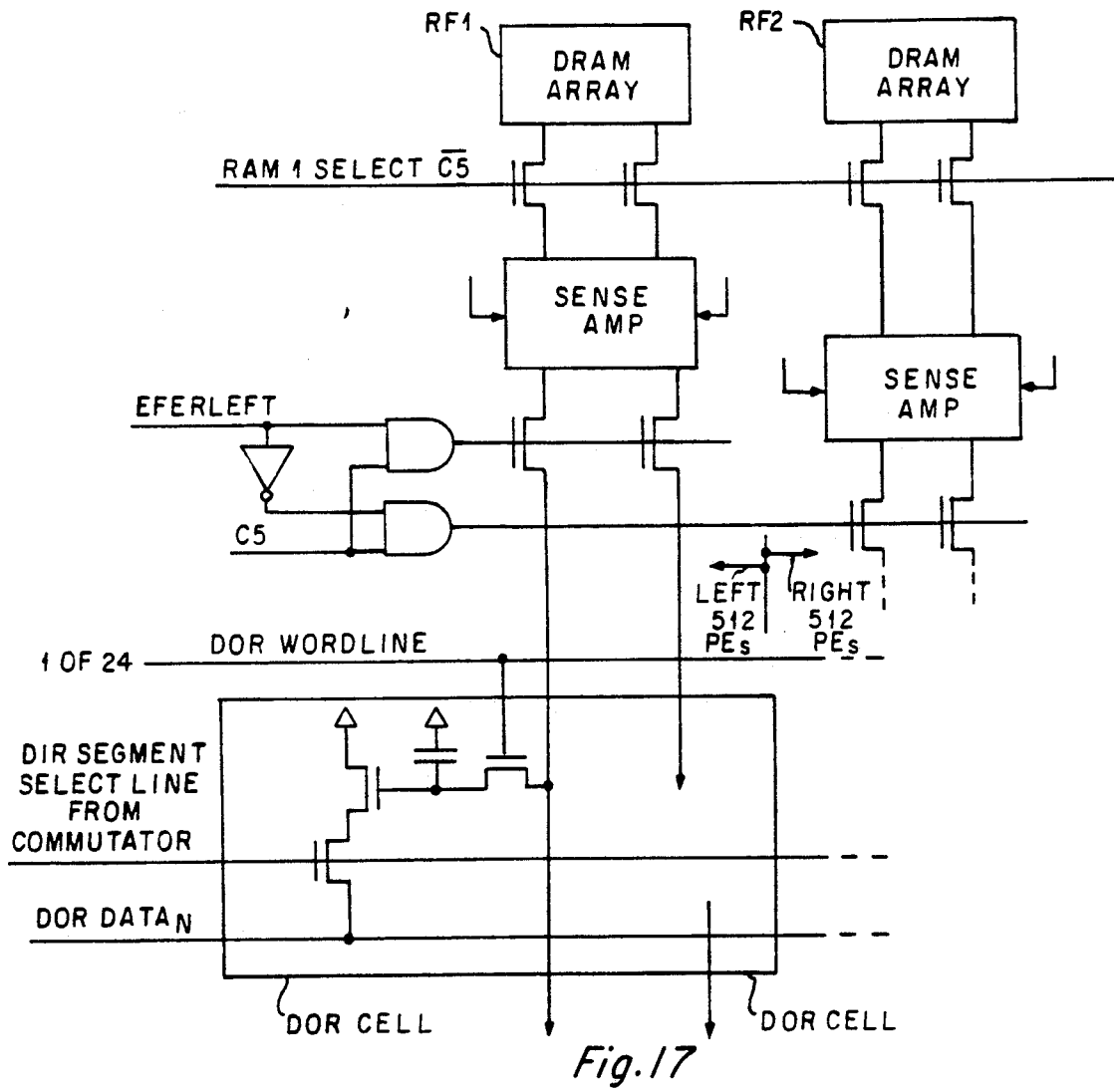
FIG. 17 shows a DIR control circuit.

Drawing FIG. 16 depicts the DIR control circuit of FIG. 13 in greater and slightly different detail. FIG. 17 depicts the DOR control circuit of FIG. 13 in greater and slightly different detail.

REGISTER FILE REFRESH

As discussed hereinabove the Register Files are comprised of dynamic cells which are suitably refreshed in successive refresh periods to maintain their contents. Only those addresses which are used by the software need be refreshed. All remaining addresses may go without refresh since their data is not needed.

A refresh operation is simply a read to each address requiring data retention; therefore, in many applications, the software program will keep the RFs refreshed if the software loop is repeated more frequently than the refresh period.

Refreshing all 256K bits in SVP 102 requires only 64 cycles. This is because each RF actually reads and refreshes 2 bits at a time (for a total of 4 bits per PE). To perform a complete refresh to all of SVP 102, read each RF into any Working Register, increment the address by two each time and repeat 64 times. The following program illustrates a refresh operation.

For Example:

| | | |
|---|---|---|
| A = R0(0): | B = R1(0) | ; Refresh 4 × 1024 bits |
| A = R0(2): | B = R1(2) | ; Increment address by 2 |
| . | | |
| . | | |
| A = R0(124): | B = R1(124) | |
| A = R0(126): | B = R1(126) | ; Refresh completed |

THE ALU

In FIG. 5, the ALU 164 is depicted as a simple full adder/subtractor 260 plus a one-bit multiplier 258 (AND gate). The inputs are from WRM 234, WRA 238, WRB 242, WRC 248, and Control line C21 252. The outputs of ALU 164 are Sum 262 (SM), Carry 264 (CY), and Borrow 266 (BW).

DIAGRAM OF THE ALU

Referring again to FIG. 5 ALU 164 has two operating modes controlled by Control line C21: one in which the multiplier 258 is enabled, and M-dependent instructions are disabled (C21=0) and the second in which the multiplier 258 is 'pass-thru' or disabled and M-dependent instructions are enabled (C21=1).

The selection of the operating mode of the ALU 164 is dependent only on the program instruction being executed. That is, the SVP Assembler sets the ALU 164 operating mode to 'M-dependent instructions enabled' if instruction on a given assembly line requires 'M-dependency', otherwise the operating mode is set to 'Disabled'. This is done to allow the Adder/Subtractor 260 to function properly while M-dependent sub-instructions are in use. That is, the multiplier 258 and the whole class of M-dependent sub-instructions share Working Register M 234, and are therefore mutually exclusive.

Table 10 shows the behavior of ALU 164 depending on whether multiplier 258 is enabled or disabled.

TABLE 10

| C21 | M | A | B | C | SM | CY | BW |
|---|---|---|---|---|---|---|---|
| 0 | 0 | X | 0 | 0 | 0 | 0 | 0 |
| 0 | 0 | X | 0 | 1 | 1 | 0 | 1 |
| 0 | 0 | X | 1 | 0 | 1 | 0 | 1 |
| 0 | 0 | X | 1 | 1 | 0 | 1 | 1 |
| X | X | 0 | 0 | 0 | 0 | 0 | 0 |
| X | X | 0 | 0 | 1 | 1 | 0 | 1 |
| X | X | 0 | 1 | 0 | 1 | 0 | 1 |
| X | X | 0 | 1 | 1 | 0 | 1 | 1 |
| X | 1 | 1 | 0 | 0 | 1 | 0 | 0 |
| X | 1 | 1 | 0 | 1 | 0 | 1 | 0 |
| X | 1 | 1 | 1 | 0 | 0 | 1 | 0 |
| X | 1 | 1 | 1 | 1 | 1 | 1 | 1 |
| 1 | X | 1 | 0 | 0 | 1 | 0 | 0 |
| 1 | X | 1 | 0 | 1 | 0 | 1 | 0 |
| 1 | X | 1 | 1 | 0 | 0 | 1 | 0 |
| 1 | X | 1 | 1 | 1 | 1 | 1 | 1 |

ALU 164 will perform the Logical Operations shown in Table 11 wile M-dependent Instructions are Disabled. If no instruction on a given assembly line is M-dependent, then M-dependent instructions are disabled for all instructions on the entire line.

TABLE 11

| C21 | M | A | B | C | SM | CY | BW |
|---|---|---|---|---|---|---|---|
| 0 | 0 | X | 0 | 0 | 0 | 0 | 0 |
| 0 | 0 | X | 1 | 1 | 0 | 1 | 1 |
| 0 | 0 | X | 0 | c | c | 0 | c |
| 0 | 0 | X | b | 0 | b | 0 | b |
| 0 | 0 | X | 1 | c | NOT c | c | 1 |
| 0 | 0 | X | b | 1 | NOT b | b | 1 |
| 0 | 0 | X | b | c | b XOR c | b AND c | b OR c |
| X | 1 | a | b | 0 | a XOR b | a AND b | (NOT a) AND b |
| X | 1 | a | 0 | c | a XOR c | a AND c | (NOT a) AND c |
| X | 1 | 0 | b | c | b XOR c | b AND c | b OR c |
| X | 1 | a | b | c | a XOR b XOR c | note [1] | note [2] |
| X | 1 | a | b | 1 | a XNOR b | a OR b | (NOT a) OR b |
| X | 1 | a | 1 | c | a XNOR c | a OR c | (NOT a) OR c |
| X | 1 | 1 | b | c | b XNOR c | b OR c | b AND c |
| 1 | X | a | b | 0 | a XOR b | a AND b | (NOT a) AND b |
| 1 | X | a | 0 | c | a XOR c | a AND c | (NOT a) AND c |
| 1 | X | 0 | b | c | b XOR c | b AND c | b OR c |
| 1 | X | a | b | c | a XOR b XOR c | note [1] | note [2] |
| 1 | X | a | b | 1 | a XNOR b | a OR b | (NOT a) OR b |
| 1 | X | a | 1 | c | a XNOR c | a OR c | (NOT a) OR c |
| 1 | X | 1 | b | c | b XNOR c | b OR c | b AND c |
| 0 | m | a | 0 | 0 | m AND a | 0 | 0 |
| 0 | m | a | 0 | 1 | m NAND a | m AND a | m NAND a |
| 0 | m | a | 1 | 0 | m NAND a | m AND a | m NAND a |
| 0 | m | a | 1 | 1 | m AND a | 1 | 1 |
| 0 | m | 1 | b | 0 | m XOR b | m AND b | (NOT m) AND b |
| 0 | m | 1 | b | 1 | m XNOR b | m OR b | (NOT m) OR b |
| 0 | m | 1 | 0 | c | m XOR c | m AND c | (NOT m) AND c |
| 0 | m | 1 | 1 | c | m XNOR c | m OR c | (NOT m) OR c | note [1]: CY = (C AND (a XOR b)) OR (a AND b)
note [2]: BW = (C AND NOT (a XOR b)) OR ((NOT a) AND b)

PE WORKING REGISTERS

In the FIG. 2 embodiment, there are four working registers 162 (WR) per processor element 150 (PE), WRM, WRA, WRB, and WRC. All four registers can be the same except their data sources and destinations differ. As further depicted in FIG. 5, each WR comprises a data selector or multiplexer and a Flip/Flop. All four registers are clocked at the same time by internal SVP timing circuits shortly after valid data arrives from the RFs.

Table 12 shows illustrative sources of data for each of the four Working Registers.

TABLE 12

| Working Register | Source | | | | | | | | | | | | | |
|---|---|---|---|---|---|---|---|---|---|---|---|---|---|---|
| | M | A | B | C | RF0 | RF1 | L | R | L2 | R2 | CY | BW | KCB | 0 | 1 |
| M | * | | * | * | * | * | * | * | * | * | | | | * | * |
| A | | * | | * | * | * | * | * | * | * | | | | * | * |
| B | | * | * | | * | * | * | * | * | * | | | | * | * |
| C | * | | * | * | * | | | | | | * | * | * | * | * | where,
M. A. B. and C are Working Registers
RF0 and RF1 are Register Files
L. R. L2. and R2 are Near-neighbor Inputs
CY and BW are Carry and Borrow outputs from the ALU
KCB is Conditional Carry/Borrow (a function of WRM)
1 and 0 are Logical levels

WORKING REGISTER M (WRM)

WRM 234, the Multiplier Register, is used in multiplication, division, masking operations, some logical operations, and in conditional (M-dependent) operations. WRM 234 is one of the two inputs of multiplier block 258 in the ALU. It additionally connects via line 250 to divide MUX to control the Conditional Carry/Borrow (KCB) instruction, to RF1 MUX 1 via line 382 to control the Conditional Carry write (KCY) instruction, and to RF0 MUX 1 via line 406 to control the Conditional Direction instructions: XB, XR0(n), XR1(p), XINP(m), and XOUT(q). WRM 234 also connects to RF0 MUX 2 input so that it can be written directly to RF0. Generally, WRM 234 should be loaded with a 'one' so that the Multiplier 258 will pass the value of WRA directly to the Adder/Subtractor in the ALU 164.

Data selector 232 (n-to-1 multiplexer) chooses one of ten possible sources of data for WRM 234 as a function of Control lines C20, C19, C18, and C8 as shown in Table 13. Additionally, the data taken from lines R, R2, L, and L2 can be from 1 to 4 sources within the selected near-neighbor 160.

TABLE 13

| C20 | C19 | C18 | C8 | Operating on WRM |
|---|---|---|---|---|
| 0 | 0 | 0 | X | NOP (no operation) |
| 0 | 0 | 1 | X | RF0(n) written into WRM |
| 0 | 1 | 0 | X | RF1(p) written into WRM |
| 0 | 1 | 1 | 0 | L/R line right PE loaded into WRM |
| 0 | 1 | 1 | 1 | L/R line 2nd right PE loaded into WRM |
| 1 | 0 | 0 | 0 | L/R line left PE loaded into WRM |
| 1 | 0 | 0 | 1 | L/R line 2nd left PE loaded into WRM |
| 1 | 0 | 1 | X | (WRC) loaded into WRM |
| 1 | 1 | 0 | X | 0 loaded into WRM |
| 1 | 1 | 1 | X | 1 loaded into WRM |

WORKING REGISTER A (WRA)

WRA 238, the Addend/Minuend Register, is a general purpose working register, and is used in most operations involving ALU 164. WRA is the second 256 of two inputs to multiplier block 258 in the ALU 164, and is the positive term entering adder/subtractor block 260. WRA is also an input to C MUX 244.

Data selector 236 (n-to-1 multiplexer) chooses one of ten possible sources of data for WRA 238 as a function of Control lines C17, C16, C15, and C8 as shown in Table 14. Additionally, the data taken from lines R, R2, L, and L2 can be from 1 to 4 sources within the selected near-neighbor 160.

TABLE 14

| C17 | C16 | C15 | C8 | Operating on WRA |
|---|---|---|---|---|
| 0 | 0 | 0 | X | NOP (no operation) |
| 0 | 0 | 1 | X | RF0(n) written into WRA |
| 0 | 1 | 0 | X | RF1(p) written into WRA |
| 0 | 1 | 1 | 0 | L/R line right PE loaded into WRA |
| 0 | 1 | 1 | 1 | L/R line 2nd right PE loaded into WRA |
| 1 | 0 | 0 | 0 | L/R line left PE loaded into WRA |
| 1 | 0 | 0 | 1 | L/R line 2nd left PE loaded into WRA |
| 1 | 0 | 1 | X | (WRC) loaded into WRA |
| 1 | 1 | 0 | X | 0 loaded into WRA |
| 1 | 1 | 1 | X | 1 loaded into WRA |

WORKING REGISTER B (WRB)

WRB 242, the Addend/Subtrahend Register, is a general purpose working register, and is used in most operations involving ALU 164. In a subtraction operation, WRB 242 is always subtracted from WRA 238. WRB is also an input to L/R MUX 305.

Data selector 240 (n-to-1 multiplexer) chooses one of ten possible sources of data for WRB as a function of Control lines C14, C13, C12, and C8 as shown in Table 15. Additionally, the data taken from lines R, R2, L, and L2 can be from 1 to 4 sources within the selected near-neighbor 160.

TABLE 15

| C14 | C13 | C12 | C8 | Operating on WRB |
|---|---|---|---|---|
| 0 | 0 | 0 | X | NOP (no operation) |
| 0 | 0 | 1 | X | RF0(n) written into WRB |
| 0 | 1 | 0 | X | RF1(p) written into WRB |
| 0 | 1 | 1 | 0 | L/R line right PE loaded into WRB |
| 0 | 1 | 1 | 1 | L/R line 2nd right PE loaded into WRB |
| 1 | 0 | 0 | 0 | L/R line left PE loaded into WRB |
| 1 | 0 | 0 | 1 | L/R line 2nd left PE loaded into WRB |
| 1 | 0 | 1 | X | (WRC) loaded into WRB |
| 1 | 1 | 0 | X | 0 loaded into WRB |
| 1 | 1 | 1 | X | 1 loaded into WRB |

WORKING REGISTER C (WRC)

WRC 248, the Carry/Borrow Register, is the Carry (or Borrow) input to ALU 164. In multi-bit additions, WRC 248 holds the CY 264 from the previous addition between bits, while in multi-bit subtractions, WRC 248 holds the BW 266 bit. WRC output goes to A, B and M registers and to RF0 MUX1.

Data selector 244 (n-to-1 multiplexer) chooses one of nine possible sources of data for WRC 248 as a function of Control lines C21, C11, C10, and C9 and by the contents of WRM 234, as shown in Table 16. That is, with certain combinations of these four control lines, the data to be directed to WRC 248 depends on the contents of Working Register M 234. These form instructions called M-dependent instructions which allow more processor 102 flexibility. WRC 248 executes any M-dependent instruction containing the operand specifier KCB (Conditional Carry/Borrow).

TABLE 16

| C21 | C11 | C10 | C9 | (WRM) | OPERATION ON WRC |
|-----|-----|-----|----|-------|------------------|
| X | 0 | 0 | 0 | X | NOP (no operation) |
| X | 0 | 0 | 1 | X | RF0(n) loaded into WRC |
| X | 0 | 1 | 0 | X | RF1(p) loaded into WRC |
| X | 0 | 1 | 1 | X | (WRA) loaded into WRC |
| 0 | 1 | 0 | 0 | X | CY loaded into WRC |
| 1 | 1 | 0 | 0 | 0 | BW loaded into WRC |
| 1 | 1 | 0 | 0 | 1 | CY loaded into WRC |
| X | 1 | 0 | 1 | X | BW loaded into WRC |
| X | 1 | 1 | 0 | X | 0 loaded into WRC |
| X | 1 | 1 | 1 | X | 1 loaded into WRC |

NEAR-NEIGHBOR COMMUNICATIONS AND GLOBAL OUTPUT

A near-neighbor communications system can be provided in each PE 150 to allow direct memory and register read/write capability of the four closet neighbor PEs: the two to the left and the two to the right of the immediate PE 150. In addition, the same circuitry may be used to create a global flag called GO or Global Output 178. The GO 178 signal is a way of flagging an internal event to the outside of the SVP without having to load and clock out the DOR 168.

NEAR-NEIGHBOR COMMUNICATIONS

Referring again to FIG. 2, each PE generates one output 308 called L/R (or Left/Right) which is fanned out to its four neighbor PEs. Each PE 150 also inputs four L/R signals, one signal from each of its four neighbors. They are named L2 312 (PE 2nd to the left), L 310 PE 1st to the left), R 322 (PE 1st to the right), and R2 324 (PE 2nd to the right). FIG. 15 shows this interconnect system in a continuous fashion across several processor elements.

Data selector 305 (4-to-1 multiplexer) chooses one of 4 data sources within PE(n) to output to L/R line 308 as a function of Control lines C7 and C6. A logical ZERO 304, the contents of WRB 268, or a location from either of the register files RF0 (RAM0) 288 or RF1 (RAM1) 286 may be communicated to a near-neighbor processor element.

In Table 17, the data sources for L/R 308 are listed as a function of the control lines.

| C7 | C6 | Operation on L/R |
|----|----|------------------|
| 0 | 0 | Output a Logical ZERO to L/R |
| 0 | 1 | Output RF0(n) to L/R |
| 1 | 0 | Output RF1(p) to L/R |
| 1 | 1 | Output (WRB) to L/R |

GLOBAL OUTPUT

Figure 18:
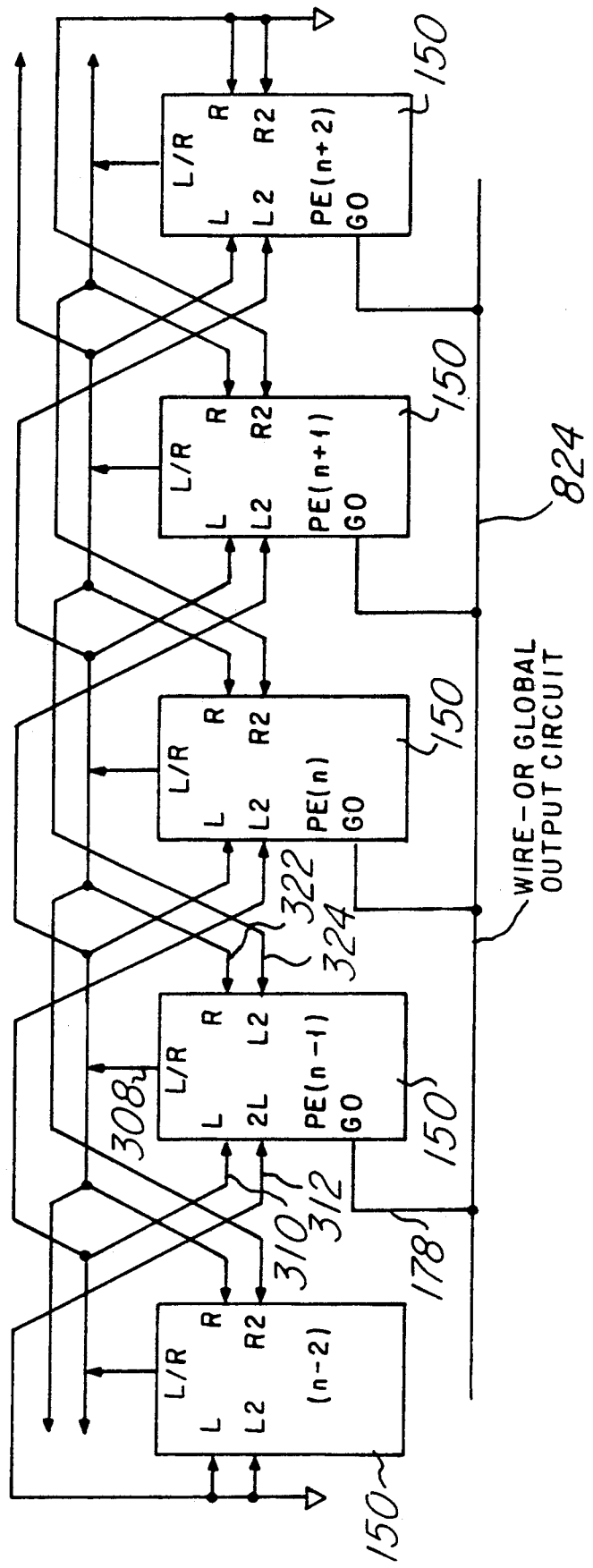
FIG. 18 shows a processor element near-neighbor interconnection.
Figure 19:
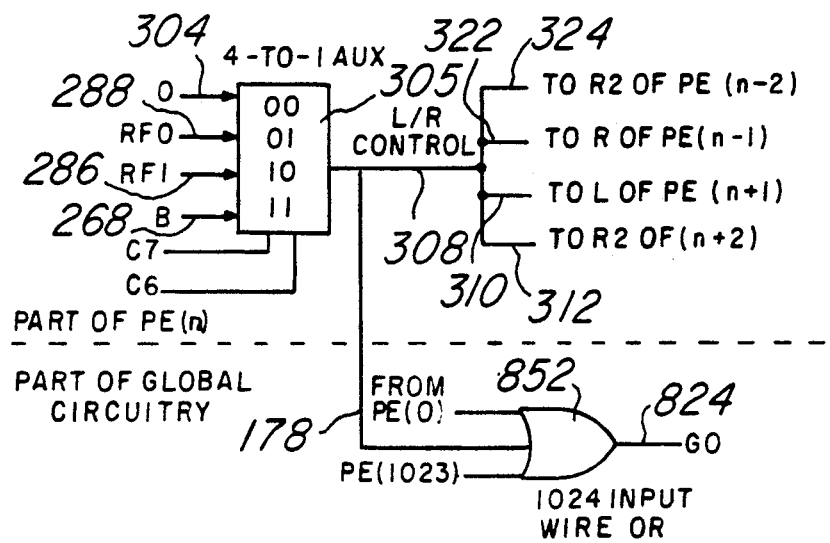
FIG. 19 shows a logical diagram for a global output.

Referring now to drawing FIGS. 18 and 19, Global output signal 824 is equivalent to the logical OR 852 of all 1024 L/R lines 178 exiting the PEs. That is, if one or more PEs 103 in Processor Array 102 outputs a logical ONE level on its L/R line 178 the GO signal 824 will also output a logical ONE. The GO signal is active high. FIG. 19 also shows the generation of the L/R signal exiting PE(n) and its relation to the global flag signal, GO (Global Output).

Care should be taken when using near-neighbor communications instructions on the same Assembly line with GO instructions since both share the same hardware, therefore their use is generally mutually exclusive. In any case, the SVP Assembler will flag any conflicts which may occur.

CASCADING SVP CHIPS

Figure 20:
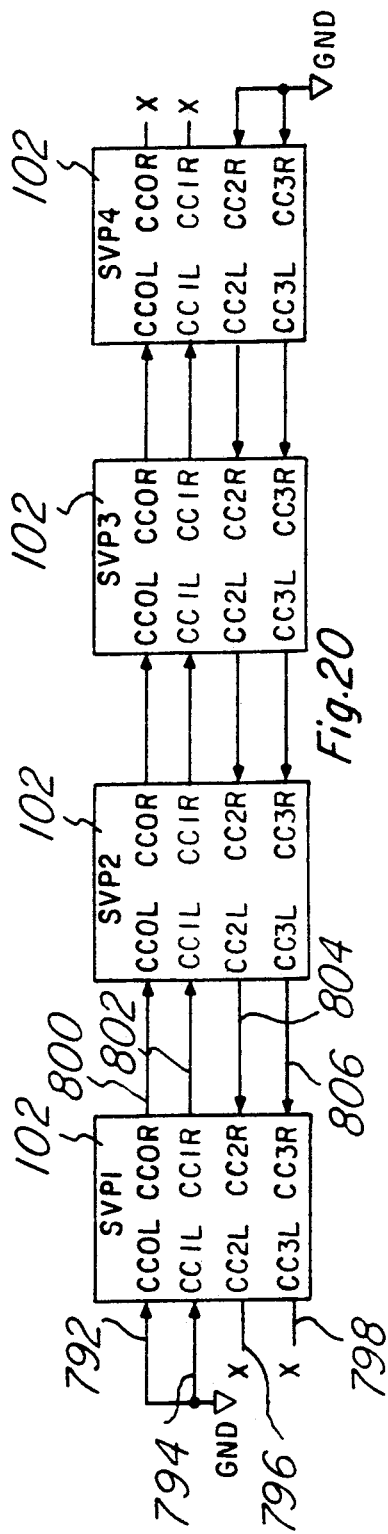
FIG. 20 shows a multiple SVP chip interconnection.

At the chip level depicted in FIG. 20, the near-neighbor communicators lines are brought out to the outside so that multiple SVP's may be cascaded if a processing width of more than 1024 bits is required. On the left of SVP 102 are L and 2L outputs and L and 2L inputs. To the right there are R and 2R outputs and R and 2R inputs. To avoid confusion with the interconnect, these points are named CC0L 792, CC1L 794, CC2L 796, CC3L 798 and CC0R 800, CC1R 802, CC2R 804, CC3R 806 so it is only necessary to connect CC0L to CC0R, etc.

Figure 21:
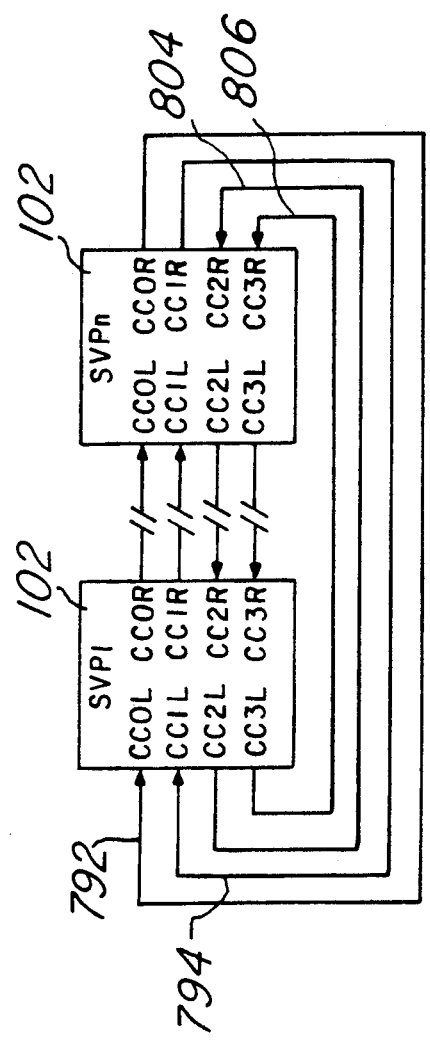
FIG. 21 shows an alternative multiple SVP interconnection.
Figure 24:
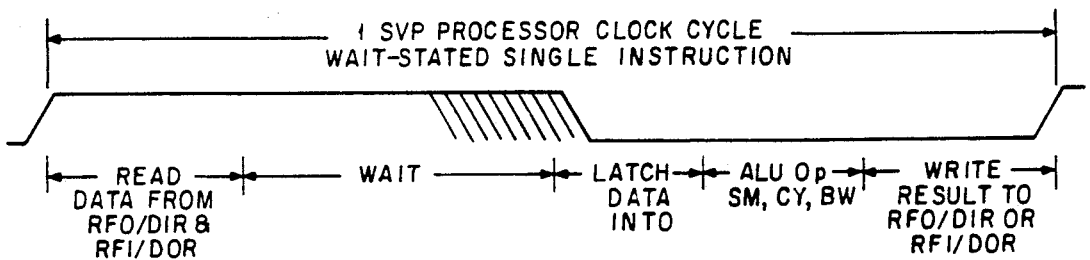
FIG. 24 shows a timing diagram for a wait-stated single instruction mode.

FIG. 20 depicts cascading interconnection for 2 or more SVPs. The inputs at the extremes should be grounded in most cases as in the figure, but this depends on the particular application. An alternative interconnection of SVPs is depicted in FIG. 21. The interconnect of FIG. 21 allows the image in a video processing system to be wrapped around a cylinder by providing the warp around connection. When using these lines, a wait stated cycle must be used with instructions which involve R/L/2R/2L transfers to allow sufficient propagation time between SVP chips. An internal bus timing diagram for a wait-stated single instruction is depicted in FIG. 24.

INSTRUCTION MODES

There are four instruction modes in the SVP: Single, Double, Wait-stated Single, and Idle. The first two of the modes will work in combination with any valid assembly instruction line, the third works with instructions which communicate data to the left and right of an immediate processor element, while the fourth is an Idle mode in which the PEs are not clocked in order to conserve power.

All instructions require only one clock cycle to complete, but the duration of that clock cycle varies depending on the type of cycle. The two cycle lengths are 'normal' and 'extended.' The length of an 'extended' cycle is approximately 1.5 times the length of a 'normal' cycle. The 'extended' time allows for the wait portion of the Wait-stated Single Instruction, or for the additional ALU operations performed during the Double Instruction. The Idle Instruction is extended only to further reduce power.

There are two control bits that set the mode of the instruction of the current cycle. The four modes are shown in Table 18 as a function of Control bits C23 and C22.

TABLE 18

| C23 | C22 | Instruction Type | PCK Clock Period |
|---|---|---|---|
| 0 | 0 | Single Instruction | normal |
| 0 | 1 | Wait-stated Single Instruction | extended |
| 1 | 0 | Double Instruction | extended |
| 1 | 1 | Idle Instruction | extended |

During an assembly, the default is Single Instruction Mode. When appropriate Single Instruction pairs appear in the assembly sequence, each pair will be automatically replaced with one Double Instruction, unless disabled by an Assemble directive. The use of Double Instructions reduces total execution time.

SINGLE INSTRUCTION MODE

The Single Instruction mode is the most basic of the four modes. A <READ>-<REGISTER>-<ALU>-<WRITE> sequence is performed in a single normal clock cycle. Table 19 details the op-code structure for the Single Instruction.

TABLE 19

| Instruction | RF1Aj 6-----0 | RF0Aj 6-----0 | C2 3 | C2 2 | C2 1 | -- | -- | -- | -- | -- | -- | C0 -0 |
|---|---|---|---|---|---|---|---|---|---|---|---|---|
| Sinlge | aaaaaaa | bbbbbbb | 0 | 0 | n | nnn | nnn | nnn | nnn | nnn | nnn | nnn | where,
{aaaaaaa} = 7 bit address field for RF1,
and {bbbbbbb} = 7 bit address field for RF0.
and {n nnn ... nnn} register control bits of opcode

WAIT-STATED SINGLE INSTRUCTION MODE

The Wait-stated Single Instruction mode is a time-extended vrersion of the Single Instruction mode. A <READ>-<WAIT>-<REGISTER>-<ALU>-<WRITE> sequence is performed in a single extended clock cycle. The added 'wait' period allows propagation time of signals traversing chip boundaries when two or more SVP devices are cascaded. This instruction mode is generally unnecessary if SVP's are not cascaded.

SVP Assembler directives allows this mode to be enabled on a line-by-line basis. The Assembler examines the instruction to see if it uses any near-neighbor communications and generates the appropriate wait-stated instruction. There are four assembly-time directives: WAITL, WAITR, WAITB, and WAITN.

WAITL - Mode = Wait if any instruction on the assembly line contains a reference to data entering the SVP from the left, for example, A = LR0(n), or A = XR0(n), otherwise, Mode = Single.

WAITR - Mode = Wait if any instruction on the assembly line contains a reference to data entering the SVP from the right, for example, A = RR0(n), or A = XR0(n), otherwise, Mode = Single.

WAITB - Mode = Wait if any instruction on the assembly line contains a reference to data entering the SVP from either direction, for example, A = RR0(n), or A = LR0(n), or A = XR0(n), otherwise, Mode = Single.

WAITN - Mode = single regardless of data direction instructions. This directive is used to turn off any WAITx directive previously issued.

Table 20 details the opcode structure for the Wait-stated Single Instruction.

TABLE 20

| Instruction | RF1Aj 6-----0 | RF0Aj 6-----0 | C2 3 | C2 2 | C2 1 | -- | -- | -- | -- | -- | -- | C0 -0 |
|---|---|---|---|---|---|---|---|---|---|---|---|---|
| Wait-stated Single | aaaaaaa | bbbbbbb | 0 | 1 | n | nnn | nnn | nnn | nnn | nnn | nnn | nnn | where,
{aaaaaaa} = 7 bit address field for RF1,
and {bbbbbbb} = 7 bit address field for RF0.
and {n nnn ... nnn} register control bits of opcode

DOUBLE INSTRUCTION MODE

The SVP Assembler and hardware is capable of automatically generating and executing an instruction which is the equivalent of two single instructions but requires an extended cycle for execution. An overall thruput advantage is incurred from this ability. During this extended cycle, a <READ>-<REGISTER>-<ALU>-<REGISTER>-<ALU>-<WRITE> sequence is performed. The additional time to the extended cycle is used for a second ALU and Register operation. This is possible because extended cycles work from a 2-bit Cache for each Register File during read/write operations. The SVP Assembler determines how to make the best use of these Caches by converting Single Instructions to Double Instructions whenever possible. This operation may be turned on and off by two assembler directives, DRI and ERI respectively.

The double instruction will be used if the patterns of two sequential instructions are as in Table 21a, b. The register file addresses only need to be as indicated if they are being read or written.

TABLE 21a

| Instruction | RF1Aj 6-----0 | RF0Aj 6-----0 | C2 3 | C2 2 | C2 1 | -- | -- | -- | -- | -- | -- | C0 -0 |
|---|---|---|---|---|---|---|---|---|---|---|---|---|
| Both instructions read/write RF0 and RF1: | | | | | | | | | | | | |
| first single | aaaaaa0 | bbbbbb0 | 0 | 0 | n | nnn | nnn | nnn | nnn | nnn | nnn | nnn |
| second single | aaaaaa1 | bbbbbb1 | 0 | 0 | n | nnn | nnn | nnn | nnn | nnn | nnn | nnn |

TABLE 21a-continued

| Instruction | RF1Aj 6-----0 | RF0Aj 6-----0 | C23 | C22 | C21 | -- | -- | -- | -- | -- | -- | C0 -0 |
|---|---|---|---|---|---|---|---|---|---|---|---|---|
| Both instructions read/write RF0 only: | | | | | | | | | | | | |
| first single | xxxxxxx | bbbbbb0 | 0 | 0 | n | nnn | nnn | nnn | nnn | nnn | nnn | nnn |
| second single | xxxxxxx | bbbbbb1 | 0 | 0 | n | nnn | nnn | nnn | nnn | nnn | nnn | nnn |

TABLE 21b

| Instruction | RF1Aj 6-----0 | RF0Aj 6-----0 | C23 | C22 | C21 | -- | -- | -- | -- | -- | -- | 0 -0 |
|---|---|---|---|---|---|---|---|---|---|---|---|---|
| Both instructions read/write RF1 only: | | | | | | | | | | | | |
| first single | aaaaaa0 | xxxxxxx | 0 | 0 | n | nnn | nnn | nnn | nnn | nnn | nnn | nnn |
| second single | aaaaaa1 | xxxxxxx | 0 | 0 | n | nnn | nnn | nnn | nnn | nnn | nnn | nnn |
| Neither instruction reads/writes RF0 or RF1: | | | | | | | | | | | | |
| first single | xxxxxxx | xxxxxxx | 0 | 0 | n | nnn | nnn | nnn | nnn | nnn | nnn | nnn |
| second single | xxxxxxx | xxxxxxx | 0 | 0 | n | nnn | nnn | nnn | nnn | nnn | nnn | nnn | where,
xxxxxxx = don't care
aaaaaa0 = 7 bit address for RF1, first instruction
bbbbbb0 = 7 bit address for RF0, first instruction
aaaaaa1 = 7 bit address for RF1, second instruction
bbbbbb1 = 7 bit address for RF0, second instruction
n nnn ... nnn = 22 bit control opcode The assembler will optionally assemble these four types of instruction patterns into double instructions and their respective opcodes become as shown in Table 22.

TABLE 22

| Instruction | RF1Aj 6-----0 | RF0Aj 6-----0 | C23 | C22 | C21 | -- | -- | -- | -- | -- | -- | C0 -0 |
|---|---|---|---|---|---|---|---|---|---|---|---|---|
| double | aaaaaa0 | bbbbbb0 | 1 | 0 | n | nnn | nnn | nnn | nnn | nnn | nnn | nnn |
| double | 0000000 | bbbbbb0 | 1 | 0 | n | nnn | nnn | nnn | nnn | nnn | nnn | nnn |
| double | aaaaaa0 | 0000000 | 1 | 0 | n | nnn | nnn | nnn | nnn | nnn | nnn | nnn |
| double | 0000000 | 0000000 | 1 | 0 | n | nnn | nnn | nnn | nnn | nnn | nnn | nnn | where,
0000000 = assembler fills zeros when meomry is not used
aaaaaa0 = 7 bit address for RF1, double instruction
bbbbbb0 = 7 bit address for RF0, double instruction
n nnn ... nnn = 22 bit control opcode pipeline is correctly filled when processing resumes. Table 23 details the opcode structure for the Idle Instruction.

TABLE 23

| Instruction | RF1Aj 6-----0 | RF0Aj 6-----0 | C23 | C22 | C21 | -- | -- | -- | -- | -- | -- | C0 -0 |
|---|---|---|---|---|---|---|---|---|---|---|---|---|
| Idle | xxxxxxx | xxxxxxx | 1 | 1 | 0 | 000 | 000 | 000 | 000 | 000 | 000 | 000 | where,
(xxxxxxx) = 7 bit address field for RF1 is Don't Care
and
(xxxxxxx) = 7 bit address field for RF0 is Don't Care
0 000 ... 000 = 22 bit control is zero during idle

IDLE INSTRUCTION MODE

The Idle instruction is primarily intended to save power. It may be executed anytime the PEs have completed processing of the current data packet and are waiting for the next packet. When an Idle instruction is encountered, all circuits of the parallel processors stop being clocked except the DIR and DOR which are independently controlled.

The WRs are static, and therefore, maintained; however, the RFs are dynamic. Bits which need to be maintained must be selectively refreshed as discussed hereinabove.

During an Idle Instruction, the remainder of the opcode field is latched into an instruction register but is ignored by subsequent logic blocks. Bits C21 through C0 should be zero during this time to assure the internal

EXTERNAL BUS OPERATION

The External Bus 130 operation for the SVP chip is simple, as the only requirement is to present the device with a 38 bit microcode instruction (24 control, 14 address) and strobe PCK with the proper setup and hold times. Since the Data Input 154 and Data Output 168 Registers are asynchronous to the Processor Array 105, some form of synchronization is required prior to the Processor Array 105 transferring data to/from the IDr or DOR. In video applications, this is possibly handled by transferring during horizontal blanking time.

INTERNAL BUS OPERATION

Figure 22:
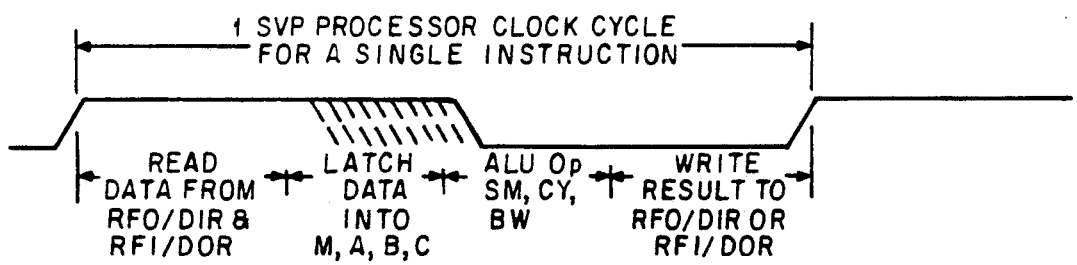
FIG. 22 shows a timing diagram for single instruction mode.

The rising edge of the external Processor Clock( PCK) triggers a series of internal clocks which creates the timing for the internal bus 171. FIG. 22 shows the sequence of events on the internal buses 171 of the SVP 102 for Single Instruction Mode.

The SVP Assembler automatically generates what is called a Double Instruction from two singe instructions providing they are identical except for address fields.

Figure 23:
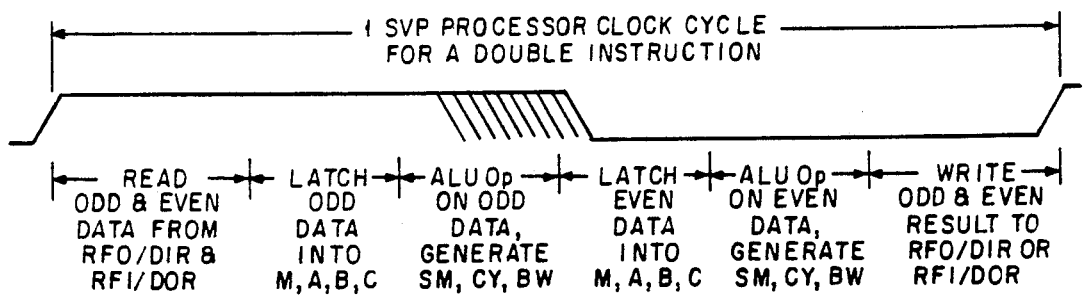
FIG. 23 shows a timing diagram for a double instruction mode.

The Double instruction created by the Assembler requires a corresponding hardware mode. FIG. 23 shows the sequence of events for the double instruction cycle.

When cascading SVPs (FIGS. 20 and 21), a slow propagation path between chips requires extra time when using the Near-neighbor communications. Slow cycles are accommodated by having a Wait-stated Single cycle. This cycle performs the operation of a single instruction cycle but requires the time of a double instruction cycle as shown in FIG. 24.

Figure 25:
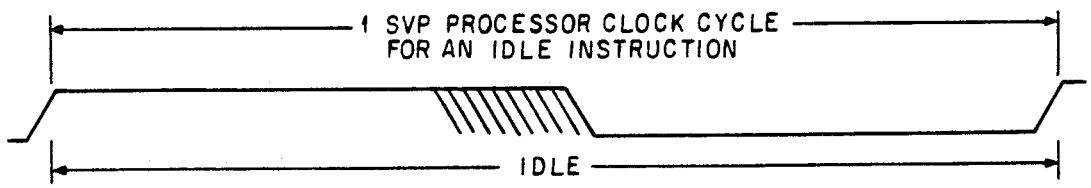
FIG. 25 shows a timing diagram for an idle instruction mode.

The Idle cycle allows the PA 105 to be mostly powered down until needed. This is shown in FIG. 25.

INSTRUCTION RULES

The SVP is programmed at the microcode level. These microcode 'sub-instructions' combine to make the instruction portion of an instruction line in the SVP Assembly language. This section explains how to construct these instructions and how the assembler checks for conflicts. Some of the major topics in this section are:

- Rules for forming Instruction Lines
- Operand Destination/Source Names
- Rules for Combining Sub-instructions
- The Opcode Field
- The Instruction Conflict Mask

RULES FOR FORMING INSTRUCTION LINES

The SVP Assembly source is similar to that of other assemblers; each line contains an instruction, an assembler directive, component, or macro directive. The SVP assembly line, however, differs in that a single line containing one instruction comprises several sub-instructions. These sub-instructions combine to generate a single opcode when assembled.

An 'instruction line' is made up of an optional label, one or more sub-instructions plus an optional comment field.

A valid 'instruction' is made up of one or more sub-instructions such that no sub-instruction conflicts with another.

A 'sub-instruction' comprises three parts: A destination operand, an assignment operator (the SVP Assembler recognizes the '=' sing), and a source operand, in that order.

$$<destination_{13}operand> = <source_{13}operand>.$$

OPERAND DESTINATION/SOURCE NAMES

Table 24 lists legal Operand Destination/Source names for the sub-instructions and the valid ranges of their operands (in Decimal):

TABLE 24

| | | | | |
|---|---|---|---|---|
| A, B, XB, C, M | | | Are Working Registers | |
| SM, CY, KCY, BW, KCB | | | Are ALU outputs | |
| R0(n), | XR0(n), | X2Ra(n) | Register File R0, address n, | $0 <= n <= 127$ |
| | LR0(n), | L2R0(n) | | |
| | RR0(n), | R2R0(n) | | |
| INP(m), | XINP(m), | X2INP(m) | Data Input Register bits, | $0 <= m <= 39$ |
| | LINP(m), | L2INP(m) | | |
| | RINP(m), | R2INP(m) | | |
| R1(p), | XR1(p), | X2R1(p) | Register File R1, address p, | $0 <= p <= 127$ |
| | LR1(p), | L2R1(p) | | |
| | RR1(p), | R2R1(p) | | |
| OUT(q), | XOUT(q), | X2OUT(q) | Data Output Register bits, | $0 <= q <= 23$ |
| | LOUT(q), | L2OUT(q) | | |
| | ROUT(q), | R2OUT(q) | | |
| AUX(h), | AUXi(j) | | Are Auxiliary Register outputs | $0 <= h <= 31$ |
| | | | | $0 <= i <= 3$ |
| | | | | $0 <= j <= 7$ |
| GO | | | Global Output line | | where,
K, X indicate a Conditional Instruction based on the state of WRM;
K indicates the conditional source is the immediate ALU,
X indicates the conditional source is from a neighbor processor.

RULES FOR COMBINING SUB-INSTRUCTIONS

A source operand may be specified more than once in an instruction line:

| | |
|---|---|
| B = A , C = A | is legal |

A destination operand may be specified in an instruction line:

| | |
|---|---|
| B = A , C = B | is legal |
| C = A , C = B | is not legal |

Each Register File may be specified more than once as a source operand if the address is the same for each sub-instruction:

| | |
|---|---|
| A = R0(13) , B = R0(13) | is legal (same address) |
| A = R0(13) , B = R0(100) | is not legal (same RF, different address) |
| A = R0(13) , B = R1(100) | is legal (different RF) |

Only one of RF0, RF1, DIR and DOR may be specified as a destination operand in an assembly line:

| | |
|---|---|
| C = BW, R0(10) = SM | is legal (single memory write) |
| R0(13) = A, R1(13) = B | is not legal (simulataneous write to tow memory banks) | if R0, R1, INP, or OUT is specified as a source operand and a destination operand the source and destination address must be the same:

$Y_{13}$). This is necessary to over negative numbers. Initially there is no carry. An instruction set for such an addition is excerpted and placed in Table 25.

TABLE 25

| INSTRUCTION | | INSTRUCTION LINES NUMBER | CYCLES SINGLE | CYCLES DOUBLE | DOUBLE CYCLE TIME |
|---|---|---|---|---|---|
| M=1, A=R0(0), B=R1(10), | C=0, R0(0)=SM | 1 | 1 | 1 | 1 |
| M=1, A=R0(1), B=R1(11), | C=CY, R0(1) =SM | 2 | 1 | 1 | 1 |
| M=1, A=R0(2), B=R1(12), | C=CY, R0(2) = SM | 3 | 1 | 1 | |
| M=1, A=R0(3), B=R1(13), | C=CY, R0(3) = SM | 4 | 1 | | 1.5 |
| | C=CY, R0(4) = SM | 5 | 1 | 1 | 1 |
| Total | | 15 | 5 | 4 | 4.5 |

| | |
|---|---|
| B = R0(22), R0(22) = SM | is legal (read/modify/write) |
| C = R0(22), R1(123) = C | is legal (different RF) |
| C = R0(22), R0(123) = C | is not legal (same RF, different address) |
| B = R1(25), INP(10) = SM | is legal (different RF's) |
| B = R0(25), INP(10) = SM | is not legal (R0 & INP are |

In general, any rule demonstrated above for Register Files R0 and R1 applies to the INP (DIR) and OUT (DOR) instructions as well, with the exception that the address range of 'n' and 'p' is 0 to 127 while 'm°' is 0 to 39, and 'q' is 0 to 23, respectively:

That is, since the instruction:

| | |
|---|---|
| B = R0(10), R0(10) = SM | is legal, |
| then | |
| B = INP(10), INP(10) = SM | is also legal. |
| | in same RF) |

Figure 26:
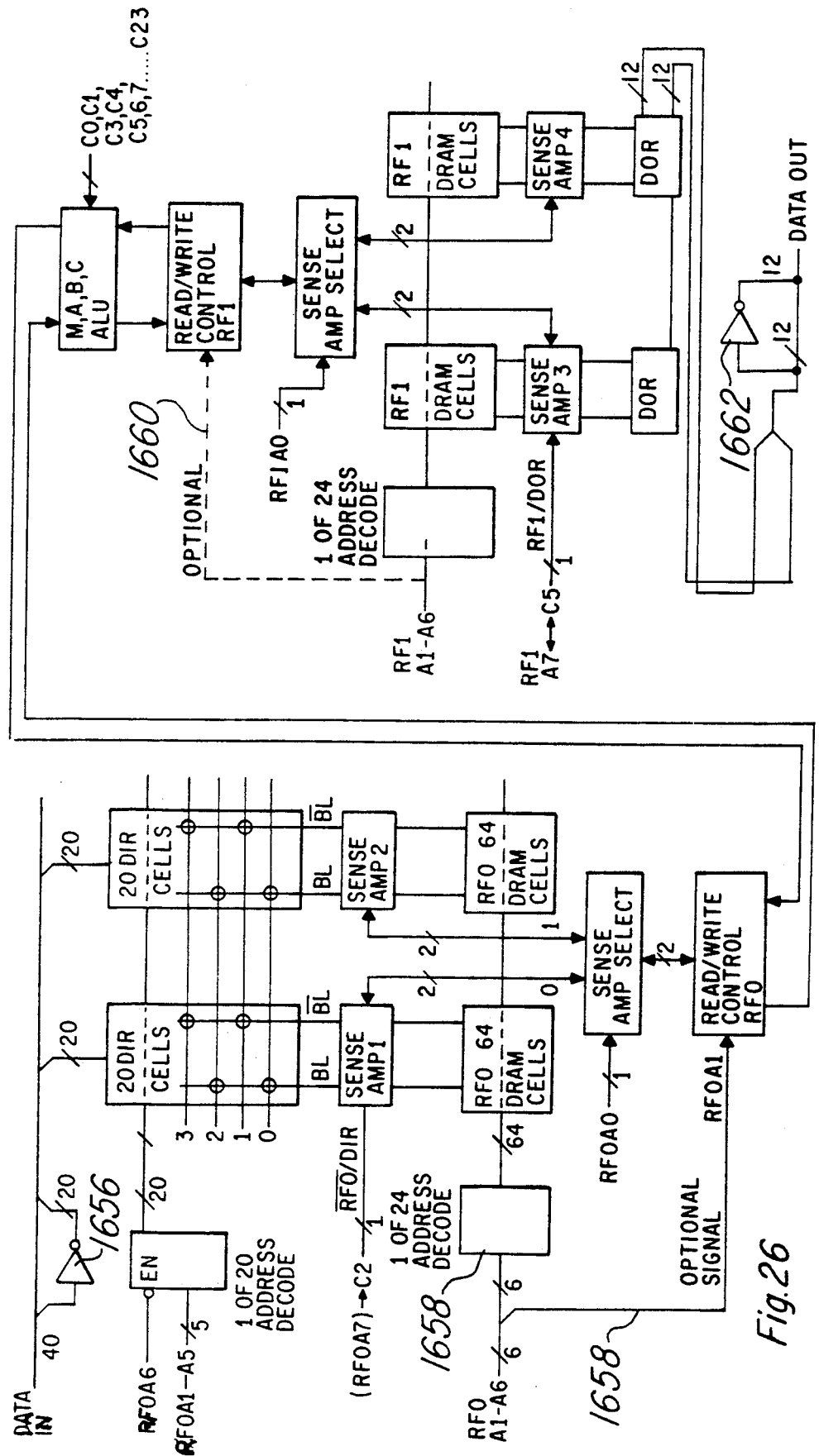
FIG. 26 shows a processor element having four sense amplifier.

FIG. 26 shows an alternative embodiment of a processor element 150. As depicted processor element 151 of FIG. 26 includes four sense amps per processor element. Two for DIR/RF0 write and read operations. Two for DOR/RF1 write and read operations. With the FIG. 26 embodiment, register file 0 and register file 1 each read two bits of data in each memory cycle (total of four bits per cycle). However, only two of the four data bits are used during a single cycle operating mode. To avoid wasting these read operations the four bits can be processed in a manner that forms two two-bit cache memory banks. In this format the otherwise unused sensed data is used and a reduction of cycle time is obtained.

To compensate for the reading of data and data(bar) inverted address signals 1658 and 1660 are provided to the respective read/write control circuits. Alternatively, the input data lines may have every other signal inverted. In this embodiment every other data out line would be inverted also.

FIG. 27a illustrates a single cycle operation to read data from each register file in a processor element and to write the data in one of the register file memory banks. FIG. 27b illustrates how the double instruction cycles allows the read to occur twice in one cycle with successive addresses. However, instead of requiring two full cycle times to complete, only approximately 1.5 cycle times are required.

This is illustrated in FIG. 28 and by the following example. Consider an addition of the 4-bit numbers $X_3X_2X_1X_0$ and $Y_{13}Y_{12}Y_{11}Y_{10}$. The sum will be a 5-bit number replacing X, $X_4X_3X_2X_1X_0$. $X_4$ is obtained from the sum of the previous carry and the 2MSBs ($X_3$ and In the execution of the first instruction to effectuate the add of bits $X_0$ and $Y_{10}$, the sense amp reads the data stored in addressed location RF0(0) and RF1(0). These address locations can be designated the even bit line locations of the DRAM column. The subsequent instruction sets reads bits X1 and Y11 from address locations RF0(1) and RF1(11) respectively-the next bit lines in the array. These can be designated the odd bit lines following the even bit lines for each sense amp. This is repeated until the addition is completed.

Referring again to the instruction set of Table 25, it is seen that instruction lines 2, 3 and 4 are identical except for the different addressed locations of the stored data. If, as previously discussed, the read sequence starts on an even bit line it is seen that the data is read concurrently from successive even-odd, even-odd blocks. Therefore if the instruction following an even read of data is identical it is possible to use the previously read data which would otherwise be wasted. As applied to the above example, instructions 1 and 2 are not convertible to a double instruction (DI). Although one of the address rules for a double instruction is met (both addressed registers reading from even locations following by odd addressed locations) the instructions are not the same. Note that instruction 1 says carry (CY) equals 0 while instruction 2 says CY equals carry propagated forward via 'C' register. Examining instructions 3 and 4 it can quickly be seen that the instructions can be combined to form a double instruction. Note even address read followed by a odd address read and both instructions are identical (except for addressed locations). Instruction number 5 to compute the final bit is a stand alone and as such cannot be combined as there is no instruction to combine therewith. Table 25 illustrates the saving in cycle time in the above simple example due to combining of instructions. In the above example cycle time is reduced form 5 to 4.5 cycles.

In accordance with the double instruction concept, more than two sense amps can be employed for each register set. For example, if three or four (total of six and eight sense amps per processor element respectively) are employed, triple and quadruple compression for a further reduction in cycle time can be done.

THE OPCODE FIELD

The control portion of the opcode is made up of eight octal digits. Each of the digits corresponds to one of the circuit blocks of FIG .5 so a little familiarity with the opcode format permits the user to read the opcode directly. Table 26 indicates which bits correspond with which blocks. 'CIC' is Conditional Instruction Control.

TABLE 26

| Control Line: | C21 | .... | .... | .... | .... | .... | .... | ..C0 |
|---|---|---|---|---|---|---|---|---|
| Octal Digit Weight | 7 | 6 | 5 | 4 | 3 | 2 | 1 | 0 |
| Binary Bit Weight | 2 1 | 2 1 1 0 9 8 | 1 1 1 7 6 5 | 1 1 1 4 3 2 | 1 1 1 0 9 | 8 7 6 | 5 4 3 | 2 1 0 |
| Corresponding Circuit Block | CIC | WRM | WRA | WRB | WRC | NNC | RF1 | RF0 |

Where,
CIC = Conditional Instruction Control
WRM = Working Register 'M'
WRA = Working Register 'A'
WRB = Working Register 'B'
WRC = Working Register 'C'
NNC = Near Neighbor Control
RF1 = Register File 1 and Data Output Register Control
RF0 = Register File 0 and Data Input Register Control In FIG. 29, a controller 128 is shown connected to SVP 102 and to a software program development and television operation emulation system 900. Development system 900 includes a host computer system 912, a host computer interface logic 914, a pattern generator 916 and a data selector 918.

Host computer system 912 can take a variety of forms in development system 900. Such forms include a personal computer, a remote control unit, a text editor or other means for developing a control algorithm. Host computer interface logic 914 includes circuitry for emulating a television set's main micro-controller. In development system 900 host computer interface logic 914 cooperatively works with pattern generator 916 to interface host computer system 912 and local communication bus 930. Pattern generator 916 generates timing and other patterns to test program algorithms for algebraic accuracy. Pattern generator 916 also provides real-time test video data for SVP algorithm and hardware debugging. A data pattern programmer (or selector) 918 is used to select data for input to SVP from among the forty input lines 920 or from data patterns generated by data patter generator 916. As depicted data selector 918 is inserted in series between the forth data input lines 920 and the forty SVP input pins 118. In development system 900 a computer (or field) memory 121 is provided to capture processed data from 8 of the 24 output lines 170. The desired 8 of the 24 output lines is selected by a 3→1 octal multiplexer 171. In this manner a field of processed video data can be captured (or stored) and provided back to host interface 914 and/or host computer system 912 for real time analysis of the SVP's operations.

Hardware interface 932 between host computer interface logic 914 and most computer 912 is achieved in development system 900 by conventional parallel interface connections. In an alternative embodiment a conventional EIA RS-232C cable can be used when interface speed is not a primarily concern. A IIC bus manufactured by PHILLIPS ELECTRONICS CORPORATION can be used as interface line 930 between host computer interface logic 914 and controller 128.

In video signal processing applications, controller 128 generates control signals for the SVP processor device 102 which are synchronized with the verticals synchronization component and horizontal synchronization component of the incoming television signal on line 110 of FIG. 1.

Figure 30:
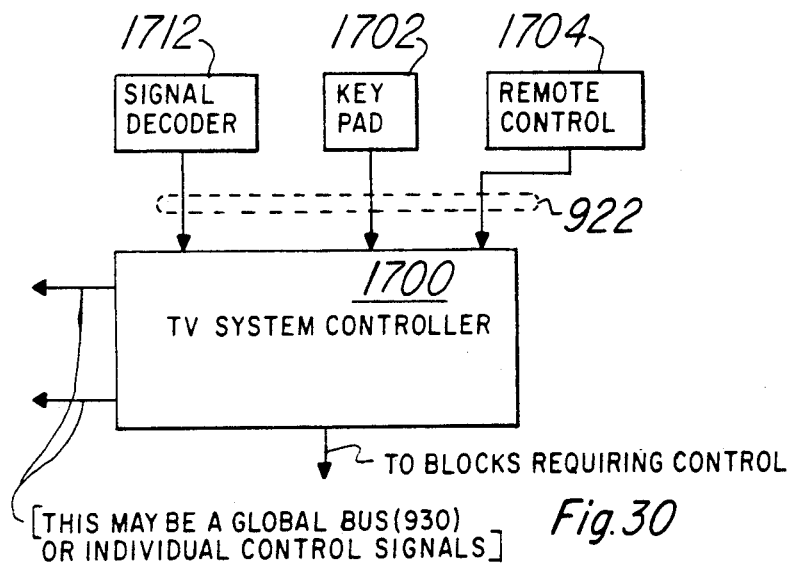
FIG. 30 shows a television controller.

FIG. 30 depicts a television micro-controller 1700. Micro-controller 1700 presents internal television circuitry upon initialization (system power-up) Micro-controller 1700 receives external signals, such as those from a personal computer key pad 1702, a remote control unit 1704 or a video signal decoder 1712, decodes them and transmits control signals to other television system components. Such system components include controller 128, SVP processor device 102, audio processing circuitry, UHF and VHF tuners, etc. For example, these external control signals include contrast, brightest and hue. Video signal decoder 1712 receives and decodes signals such as subtitle and second language signals.

Referring again to drawing FIG. 30, a controller 128 comprises a master controller 902, a vertical timing generator 904, a horizontal timing generator 906, a constant generator 908 and an instruction generator 910. In operation controller 128 provides SVP processor device 102 with operating constants via lines 946, control instructions via lines 948 and timing signals via lines 950. External control lines 938 from horizontal timing generator 906, 952 from vertical timing generator 904, and 934 from master controller 902 provide timing and control signals to other development system components. As is explained hereinbefore with respect to FIGS. 20 and 21, several SVP processor devices can be cascaded together. Such components include special purpose multiplexers and external field memories.

Figure 31:
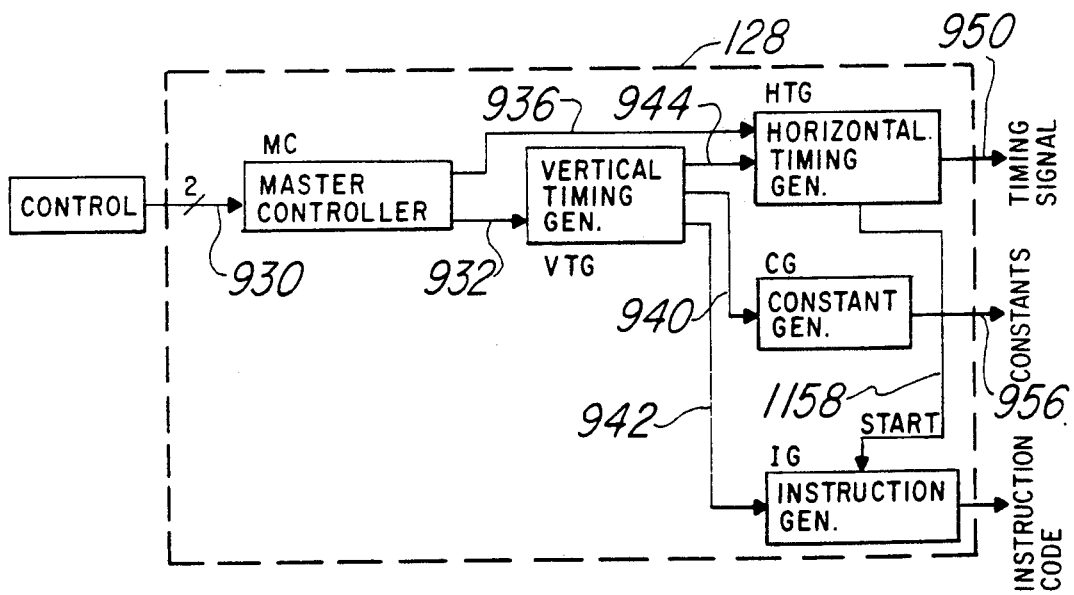
FIG. 31 shows a controller for a SVP video system.

FIG. 31 depicts controller architecture 128 of FIG. 31 separated from development system 900. FIG. 31 shows controller 128 as it can exist as a separate integrated circuit. In this embodiment external control lines 934, 938 and 952 are not provided. Master Controller 902 (MC) interpret external commands from the user as translated by host computer interface logic 914 or TV system micro-controller 1700 and generates a series of control codes to Vertical Timing Generator 904, Horizontal Timing Generator 906, Instruction Generator 910, special features multiplexers (not shown) and other desired external logic which requires switching once every field or frame. Master controller 902 may include externally programmable memory which will enable the user to download software. Preferably, however, the master controller logic and programs are implemented on chip in firmware.

Data output from master controller 902 is provided on lines 932 and 936 to vertical timing generator 904 and horizontal timing generator 906 respectively. Vertical timing generator 904 provides a control signal via lines 944, 940 and 942 to the horizontal timing generator 906, constant generator 908 and instruction generator 910 respectively. Timing signal outputs from horizontal timing generator 908 provided to processor 102 via lines 950. Similarly constant generator 908 provides operating constants and instruction generator 910 provides control instructions to processor 102 via lines 946 and 948 respectively.

Briefly, in overall operation matter controller 902 controls the video signal processing by field or frame rate, while vertical timing generator 904 controls the vertical direction operation by line rate. Horizontal timing generator 906 controls the horizontal direction operation by pixel rate. Control commands are passed from the TV system controller 1702 to Master Controller 902 over a simple 2-wire synchronous serial bus 930.

Both the mode of operation (to request different special features such as picture-in-picture, multi-screen picture, still picture, and others) and the contents of the Auxiliary Registers, 1196 of FIG. 52. Auxiliary registers 1196 are discussed in detail hereinafter. Briefly however they pass SVP processor device system variables such as 'sharpness', etc.) via command bus 930. The Master Controller 902 is a firmware programmable state-machine with a variety of instructions including conditional and vectored jumps.

Figure 32:
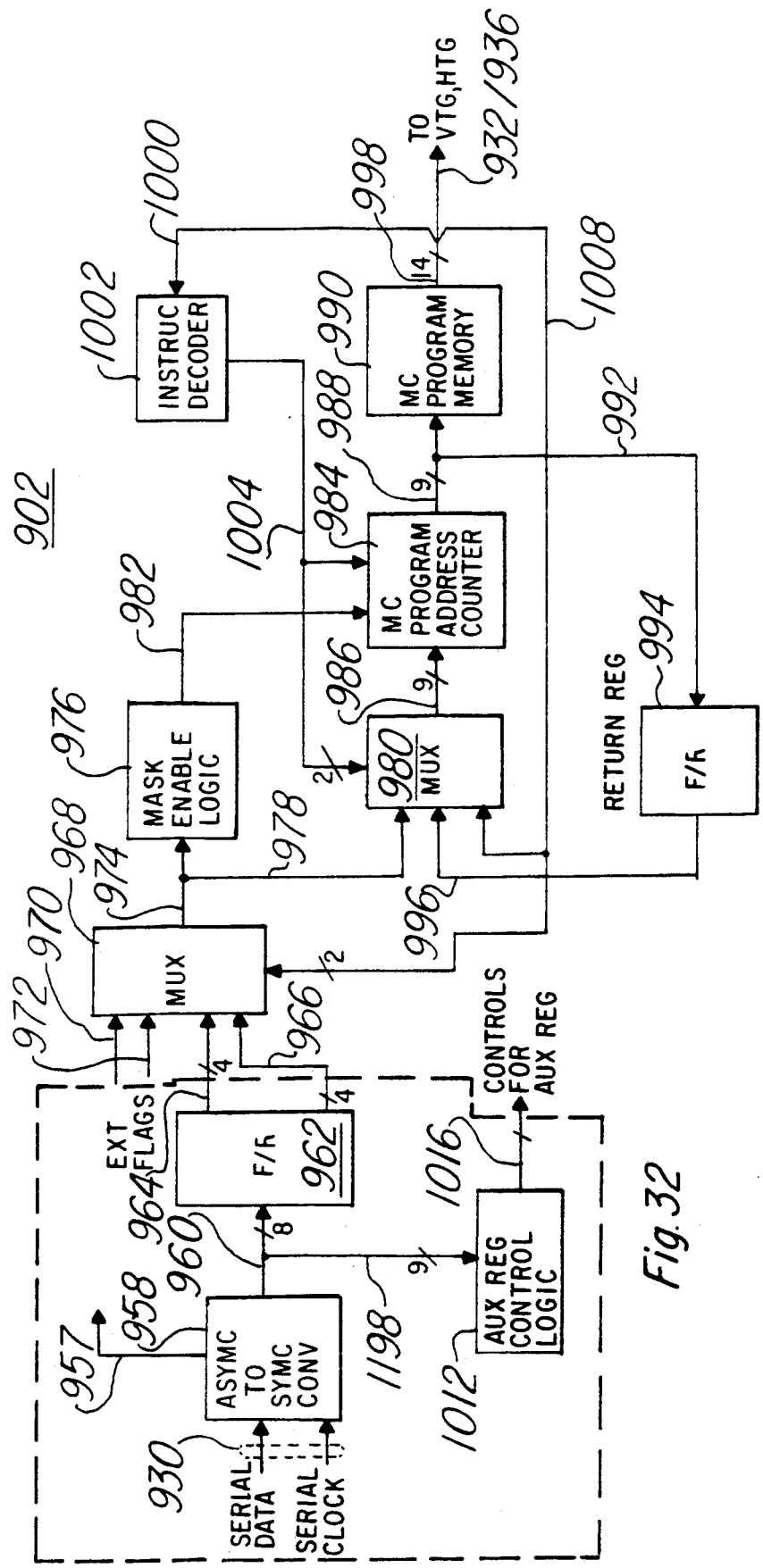
FIG. 32 shows the master controller section of the FIG. 31 controller.

In FIG. 31, master controller 902 is further detailed. The master controller embodiment of FIG. 32 includes asynchronous to synchronous conversion logic section 958 having a serial data input 954 and a serial clock input 956. Data transfer from micro-controller 1700 to master controller 902 is by a serial communication method, through a serial data input 930. In a preferred embodiment, the format of the serial data is a 10-bit word with most significant bit first.

As previously mentioned, the serial clock and serial data output from micro-controller 1700 is provided to master controller 902 via data lines 930a and 930b. Asynchronous-to-synchronous conversion logic 958 receives the serial signal inputs on lines 930 and converts them from the serial format to a parallel format. Asynchronous-to-synchronous conversion logic 958 includes registers for achieving this task. Once placed in a parallel format, the data is held in the registers and presented on data lines 960 or 1198 at a desired time. Eight of the ten data bits from logic 958 are loaded in parallel in 8- bit register 962. The top four bits are transferred to multiplexer 968 via data lines 964; the bottom four bits are similarly transferred via data lines 966. Multiplexer 968 also receives external flag inputs on lines 970 and 972. Asynchronous-to-synchronous conversion logic 958 also provides a 1-bit flag output on line 957.

In operation the four bits from lines 964 indicate a control instruction or a mode of operation for controller 128 (picture-in-picture (PIP)), etc. If a PIP mode is designated, the four bits transferred on data lines 966 describe the point on the television screen to place the subpicture. With four lines one of sixteen possible locations can be designated. External flags 970 and 972 enable synchronization of the asynchronous operations when two or more SVPs are cascaded, or between an SVP and additional external hardware controllers if they exist in addition to indicating at what instruction in a software program controller 128 should begin execution of a new signal.

Multiplexer output 974 is provided to mask enable logic 976. Logic 976 performs test on the data bits from register 962. Mask enable logic output on line 982 controls either master controller address counter 984 will continue addressing in sequence or perform a jump. The output of multiplexer 968 is also provided via line 978 as an input to multiplexer 980. Multiplexer 980 has nine output lines 986 providing inputs to master controller address program counter 984. The address on lines 988 from master controller address counter 984 address memoru locations in master controller program memory 990. The address signal is also provided to return register 994 via lines 992 for subroutine call operations. The output of register 994 is provided via line 996 as another input to multiplexer 980.

Master controller program memory 990 has 14 output lines 998. The microcode output includes address and operational mode instructions for the vertical timing generator 904 and the horizontal timing generator 906. Thee signals are provided to HTG and VTG via lines 936 and 932. Some of the microcode output bits on lines 998 are also provided to and decoded by instruction decoder 1002 which in turn provides operation control signals via lines 1004 to multiplexer 980 and master controller program address counter 984. Additionally, microcode output bits from lines 998 are provided via lines 1008 as another input to multiplexer 980 and as control for multiplexer 968.

Master controller 902 also includes auxiliary register control logic 1012. Nine signal lines 1198 from asynchronous-to-synchronous conversion logic 958 are connected as in input to auxiliary register control logic 1012. Operation of auxiliary registers is discussed hereinafter with reference to FIG. 40.

Figure 33:
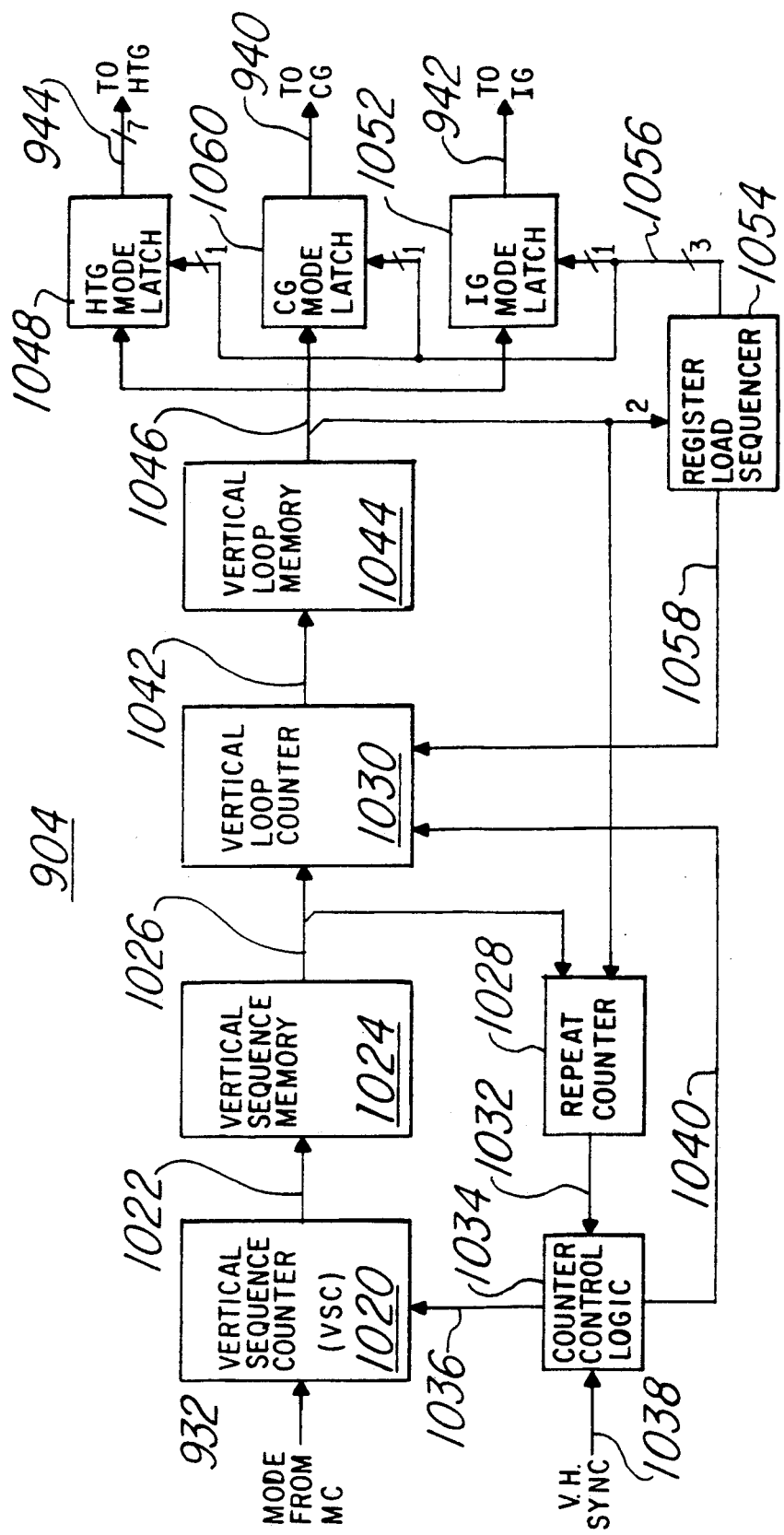
FIG. 33 shows the vertical timing generator section of the FIG. 31 controller.

Referring now to drawing FIG. 33, vertical timing generator 904 of drawing FIG. 31, is depicted in greater detail. Vertical timing Generator (VTG) 904, generates control codes on outputs 944, 940 and 942 for Horizontal Timing Generator 906, Constant Generator 908, and Instruction Generator 910 respectively. In development system 900 constant generator 908 also provides timing to circuits requiring a resolution of one horizontal line via external control line 952. Vertical timing generator 904 includes a vertical sequence counter (VSC) 1020. Vertical sequence counter 1020 is an up counter. Counter 1020 receives a control mode signal from master controller 902 via lines 932. The mode signal designates, among other things, whether, for example, a picture-in-picture operation is desired. The mode signal is essentially a starting address for vertical sequence counter 1020. VSC 1020 provides an address for vertical sequence memory 1024. Vertical sequence memory 1024 stores timing and other signals for initializing and synchronizing operations of horizontal timing generator 906, instruction generator 910 and constant generator 908. The information sequences stored in vertical sequence memory 1024 are repeated during a typical operation. Memory 1024 in addition to storing the information sequences stores the number of times the stored sequences are repeated. Sequence memory 1024 can comprise Random Access Memory (RAM), Read Only Memory (ROM) or other forms of Programmable Logic Arrays (PLA).

The repeater number is provided via line 1027 to repeat counter 1028. Repeat counter 1028 is a down counter which counts down from the repeat sequence number. When a end of repeat bit is encountered by counter 1028 a control signal is provided via line 1032 to counter control logic 1034. Counter control logic 1034 provides a signal on line 1036 to signal vertical sequence counter 1020 to step to next address location. Another signal is provided via line 1040 to increment vertical loop counter 1030. Initialization of counter control logic 1034 is controlled by the vertical and horizontal synchronizing signal of the incoming television signal. The synchronizing signals are provided via lines 1038.

Referring again to vertical sequence memory 1024, the control component of the signal on line 1026 is provided to vertical loop counter 1030 to start the loop counter at a desired location. The vertical loop counter output provided on lines 1042 addresses memory locations in vertical loop memory 1044. Memory 1044 can also be RAM, ROM or PLA. Memory 1044 stores loop patterns (programs), starting addresses and labels for HTG, VTG and instruction generator (IG). Control data bits from vertical loop memory 1044 are provided to repeat counter 1028 to indicate that a looping sequence is complete and to increment. Bits are also provided to register load sequencer 1054. Register load sequencer 1054 includes a decoded clock to control latches 1048, 1050 or 1054. Register load sequencer 1054 also provides an increment signal for incrementing vertical loop counter 1044. Data is clocked from latches 1048, 1050 and 1052 at a rate up to once every horizontal line time.

In operation vertical loop counter 1030 provides an output signal 1042 to vertical loop memory 1044 which in turn fans out mode control signals which are latched by horizontal timing generator mode latch 1048, constant generator mode latch 1050, instruction generator mode latch 1052, register load sequencer 1054 and repeat counter 1028. Register load sequencer 1054 provides an output to vertical loop counter 1030 and to latches 1048, 1050 and 1052. Each of the mode latches provide their respective signals to the horizontal timing, the constant generator and the instruction generator on output lines 944, 940, and 942 when triggered.

Vertical timing generator 904 functions also include changing the horizontal timing to a different mode, changing operational instructions to process television signals in zoom or with a different filter algorithm and changing external multiplexers. This list is merely illustrative and is not to be considered exhaustive of the numerous functions.

Figure 34:
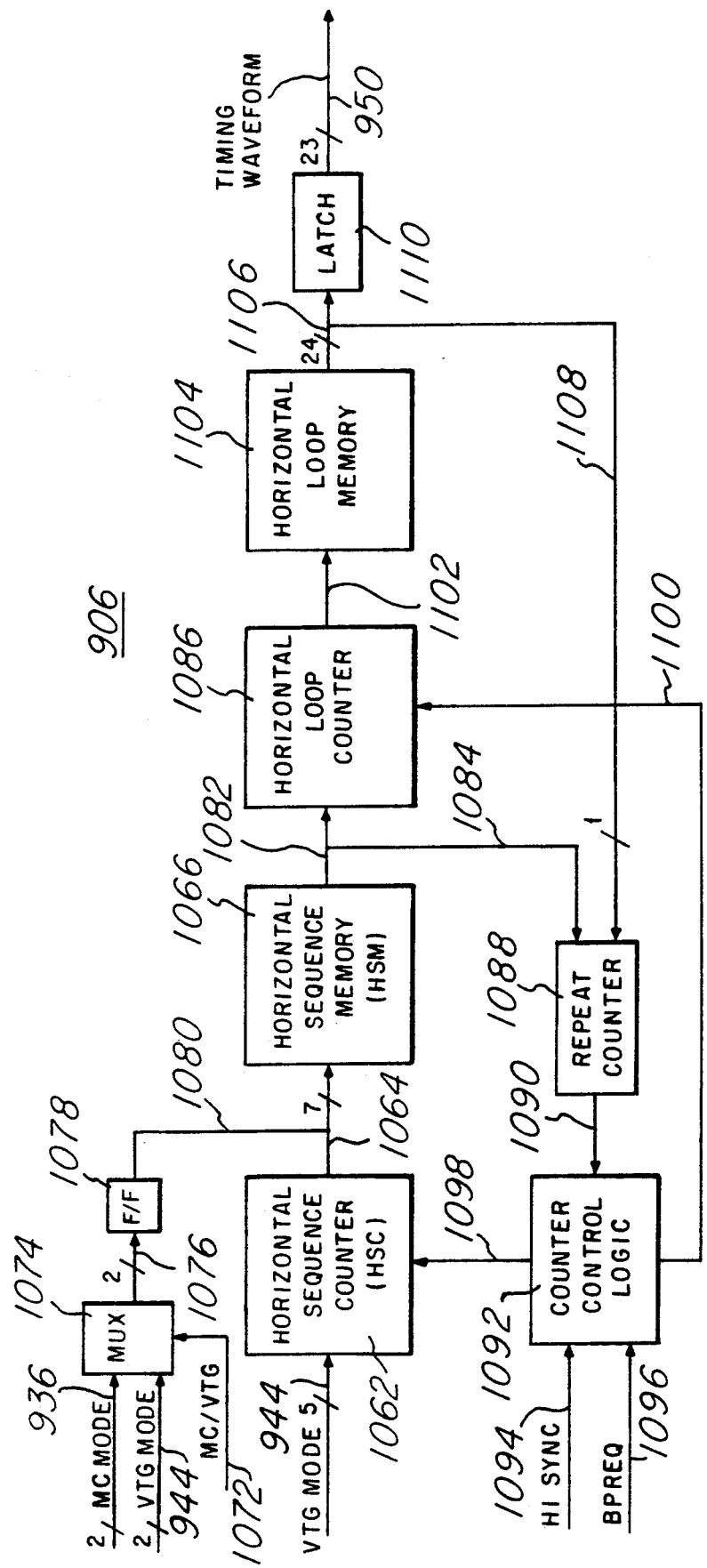
FIG. 34 shows the horizontal timing generator section of the FIG. 31 controller.

Referring now to drawing FIG. 34, there is shown in greater detail horizontal timing generator 906 of FIG. 31. Two of the seven output lines from vertical timing generator 904 are provided to horizontal sequence counter (HSC) 1062. The remaining two of seven are provided as an input to multiplexer 1074. The other two input lines 936 to multiplexer 1074 are mode control signal from master controller 902 of FIG. 31. A control signal from television system controller 1702 of FIG. 30 controls selection between the inputs. In some television operating modes, such as 16 sub-picture picture-in-picture, some patterns in the vertical timing generator will not change even though patterns in the horizontal timing generator do not change. In this case multiplexer 1074 is used to bypass two of the VTG control bits around the vertical timing generator directly to the horizontal timing generator. Accordingly the seven HTG control bits can all come from VTG or five can be from the VTG with the remaining two from the master controller. The output of multiplexer 1074 is latched by latch 1078. Latch 1078 is clocked by a master clock of the television system.

The VTG mode signal input on lines 944 is a start location for horizontal sequence counter 1062. The counter starting location output of counter 1062 is combined with two bit from latch 1078 to address a memory location in horizontal sequence memory 1066. With a 7-bit VTG mode input up to 128 different patterns can be identified. Each pattern is 23-bits wide—the bus line width 950. Horizontal sequence memory 1066 stores information indicating when a desired loop (or pattern) occurs on the television screen. For example if there are sixteen possible subpicture locations, the timing initiation will vary depending on which location the subpicture is placed. The repeat count value is provided via lives 1084 to repeat counter 1088. Counter 1088 is a up counter which counts the number of times a loop is repeated. When the desired number of repeats has occurred, counter control logic 1092 signals horizontal sequence counter 1062 to sequence. Counter control logic 1092 is initialized by the horizontal signal of the television signal provided on line 1094.

The host interface 914 of FIG. 31 can provide break point request (BPREQ) or interrupt flags to all functional blocks and read and write circuitry. Using break point signals a programmer can stop program execution, for example, at any horizontal line to examine the algorithm, timing, etc.

A component of the Memory output from HSM 1066 provides a starting location for horizontal loop counter 1086. A control signal is provided via line 1100 to control operation of HSM 1086. horizontal loop counter 1086 provides an address to horizontal loop memory 1104. Loop memory 1104 holds data describing what the repeated patterns look like. One of the twenty-four output bits from memory 1104 is provided on line 1108 to indicate signal that the end of a loop has occurred. The remaining twenty-three bits are latched in latch 1110 for input to SVP processor 102.

In operation, Horizontal Timing Generator (HTG) 906 generates timing signals for SVP circuits requiring timing edges at pixel clock rates, field memory devices, DIR, DOR, external multiplexers, D/A converters, etc. It is capable of producing timing edges down to a resolution of one sample clock. The horizontal timing generator also describes what the timing will look like in the horizontal direction. If special effects are desired, the horizontal timing will change according to whether a picture in picture, multiplicure, zoom, etc., is desired. In this mode the horizontal timing can be changed at a particular horizontal line to allow manipulation of data.

Figure 35:
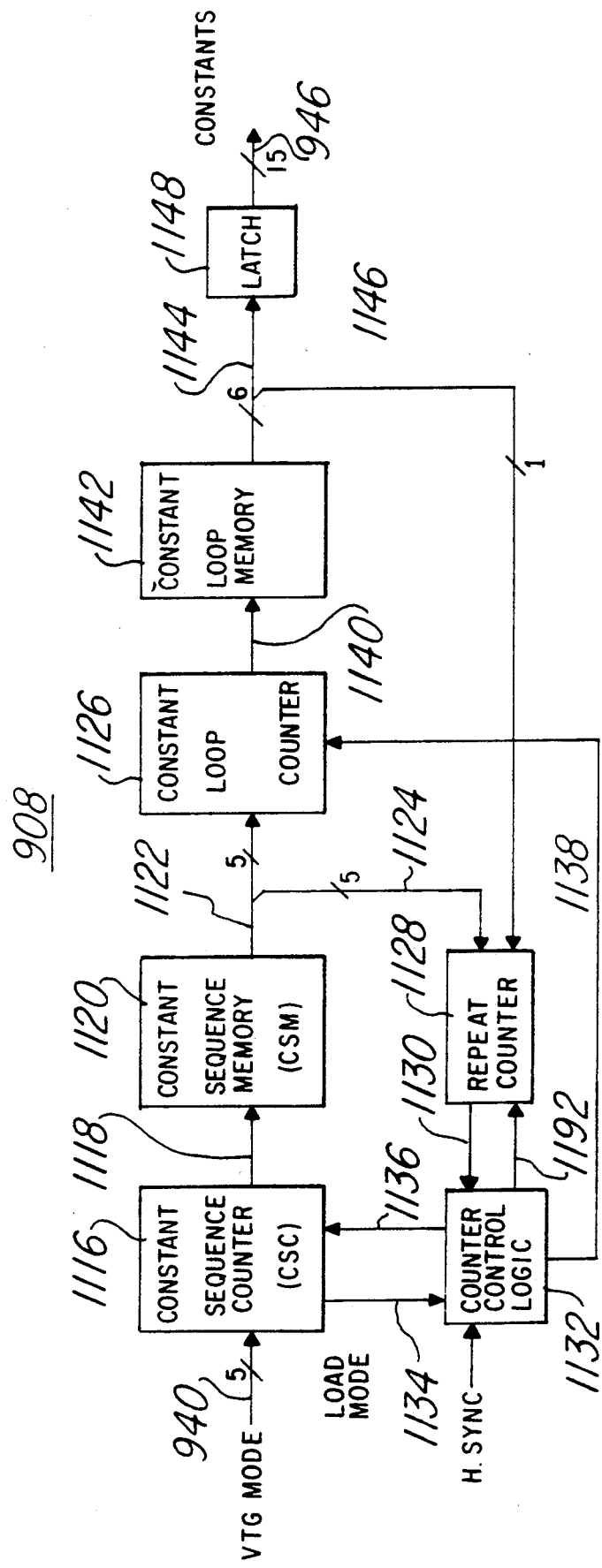
FIG. 35 shows the constant generator section of the FIG. 31 controller.

FIG. 35, depicts a block diagram of constant generator 908 of FIG. 31. Five vertical timing generator mode bits are provided to constant sequence counter 116. The five bit can identify into 32 different constant strings. Each constant string can have up to 15-bits—the output bus width 946. The CSC ouput on lines 1118 addresses the loop address values and corresponding repeat value stored in constant sequence memory 1120. The constant sequence memory address selects a starting location for constant loop counter 1126. Counter 1126 starts at the indicated location and increments until it reaches an end of loop bit. The repeat value which ranges from 0 to 31 is provided to repeat counter 1128, a down counter. When the repeat counter decrements to zero a signal on line 1130 signals counter control logic 1132 to increment constant sequence counter 1116. Counter control logic also increments loop counter 1126 until an end of loop signal is encountered. Constant loop counter 1126 indicates a starting memory location for constant loop memory 1142. One of the 16 output bits from constant loop memory 1142 provides an end of loop signal to decrement repeat counter 1128.

Loop memory 1142 stores unique operating constants for the individual processor elements. Such data includes the values for the emulated filters. CG 908 works synchronously with the HTG to clock the generated data into the Data Input Registers. Subsequently, a resident program in the IG transfers these constants into the processor register files. The Constant Generator is capable of producing a data stream with a resolution of one sample clock period.

Figure 36:
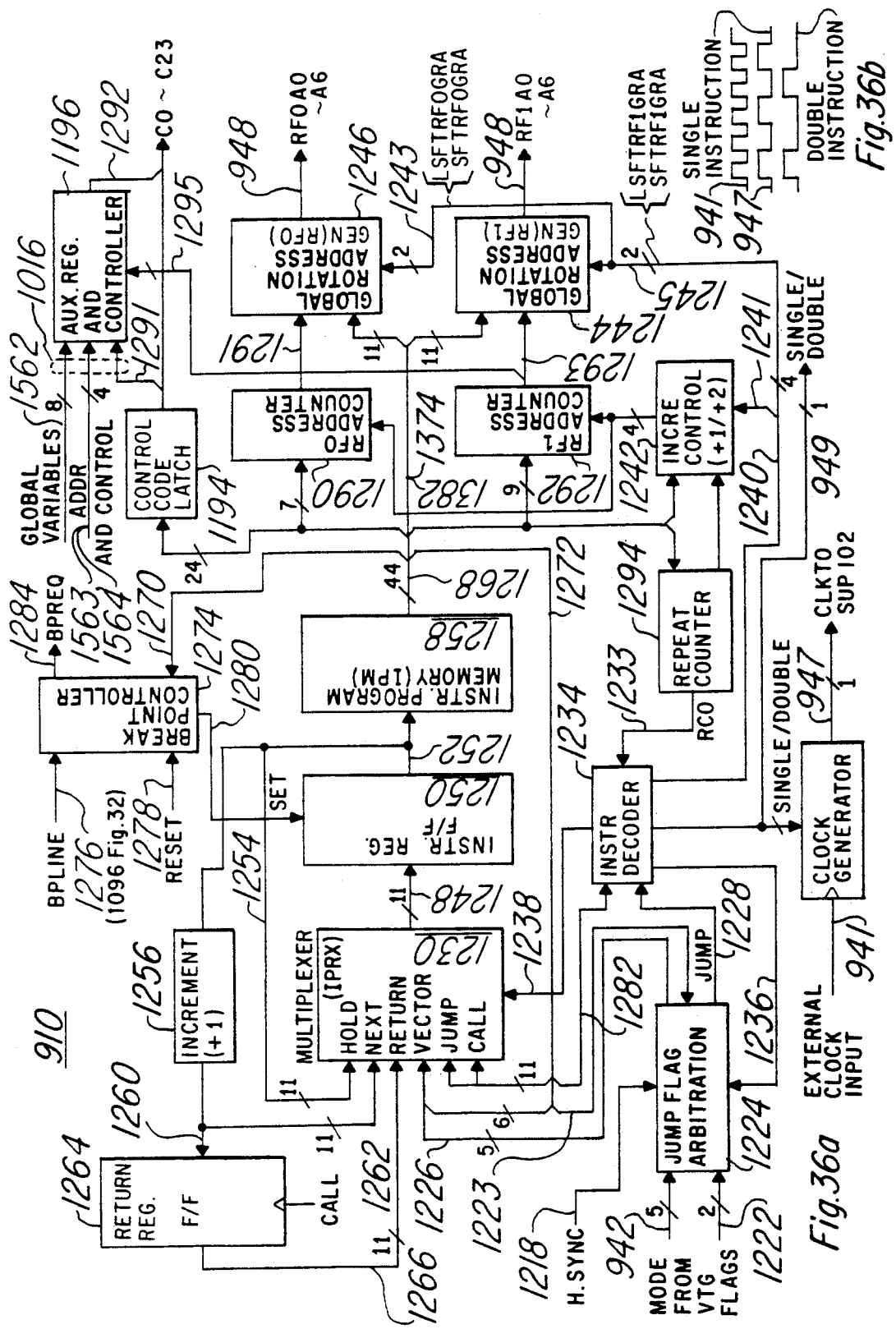
FIGS. 36a and 36b show the instruction generator section of the FIG. 31 controller.

FIG. 36 depicts instruction generator 910 of FIG. 31 in greater detail. Instruction generator 910 includes jump flag arbitration control logic 1224 which receives a horizontal synchronization signal 1218, a mode control signal 1220 from vertical timing generator 904, and flag signals 1222. Jump flag arbitration logic 1224 provides 5 of eleven vectored jump address bits to input 1226 of instruction program register multiplexer (IPRX) 1230. The five bits on lines 1226 are the least significant of the eleven total. Jump flag arbitration logic 1224 also provides a jump signal 1228 to instruction decoder 1234. Instruction decoder 1234 provides multiple output signals. A line 1236 carries one of the output signals back to an input of jump flag arbitration logic 1224. Lines 1238 carry a 4-bit decoded multiplexer output control signal 1238 to IPRX 1230. Lines 1240 carry control signals to increment control logic 1242 and to a global rotation address generator (RF1) 1224 and to a global rotation address generator (RF0) 1246. The 4-bit control signal provided on lines 1240 instructs the global rotation address generator 1244 and 1246 to load or shift data for their respective register files. The signal provided to increment control logic 1242 set the address counter 1290 and 1292 increment for +1 increment if single instruction operation is emplemented and to +2 increment if double instruction operation is emplemented.

IPRX 1230 provides an 11-bit instruction address on lines 1248 to instruction program register 1250. Output signal 1252 from instruction point register 1250 is an address for instruction program memory 1258. Address 1252 is also provided back to the HOLD input 1254 of IPRX 1230. The hold input holds the output memory address for a readdress if desired. Address 1252 is also provided to a +1 increment control logic 1256. Increment logic 1256 increments return register 1264 or instructs the IPRX 1230 to step to the next address. Return register is latched by a CALL input signal.

Instruction program memory (IPM) 1258 stores the SVP system array instruction set in microcode. The array instruction set is presented earlier herein. A complete description of the 44 bits is provided therein. The 44 instruction bits from instruction program memory 1258 are branched to various locations as set forth in the array instruction set. For example, bit number forty-three is a break point flag. This bit is provided via line 1270 to break point controller 1274. Other control bits are provided to the VECTOR, JUMP and CALL Inputs of PRX 1230, and to input 1282 of instruction decoder 1234. A mask value bit for selecting a flag is provided via a line 1223 to jump flag arbitration logic 1224. IF break point controller 1274 is enabled during a break point bit read, a break signal on lines 1280 and 1284 to stop operation to provide a test. Break point controller 1274 also receives a break point line (BPline) input signal 1276 and a reset signal input 1278. Instruction bits 0 through 23 are branched from Instruction program memory (IPM) 1258 to control code latch 1288. Bits 25 through 31 are branched to RF0 address counter 1290. Bits 32 through 38 are branched to RF1 address counter 1292. Bits 39 through 42 are branched to repeat counter 1294 and to increment control logic 1242. Increment control counter 1242 also receives inputs 1240 from the instruction decoder, which also provides a 4-bit control input to global rotation address generators (RF1) 1244 and (RF0) 1246. The latched instruction output 1194 from control code latch 1288 is provided to auxiliary register and controller logic 1196 which also receives global variables signal on line 1198. Output 1194 is also provided directly as microcode bits 0 through 23 on line 1200. Outputs 948 and are provided to the SVP processor device.

In operation, Instruction Generator 910 feeds the SVP processor array with a stream of data, instructions, addresses, and control signals at a desired clock rate. The generated microcode manipulates and instructs the processor element arithmetic logic units, multiplexer, registers, etc. of SVP 102 of FIG. 1. Instruction generator 910 can, in addition to the core instructions, generate instructions which allow the SVP core processor to operate in the manner of a simple microprocessor. In this mode, instructions such as unconditional jump, call, and jump on certain flag test instructions flag 0, 1, etc., will be performed. The flags can be externally tested. Instruction generator 910 can receive internal control codes from Vertical Timing Generator 904 or Master Controller 906, and receive flags from Horizontal Timing Generator 906.

During operation, instruction microcode stored in instruction Program Memory (IPM) 1258 are fetched, interpreted and executed by Instruction Decoder 1234. Some of the decoded signals can be used as the address selection of Instruction Program Register Multiplexer (IPRX) 1230 to change the address latched in the Instruction Program Register (IPR) 1250. The instruction codes control the various types of Instruction Sets, for instance, conditional or unconditional jump, subroutine call or return, vector addressing with updated mode value, single or double instruction, auxiliary register control for the distribution of global variables, and the global rotation for RAM FILE(0 and 1) addresses, etc.

When the break point signal is asserted during the debugging stage, break point controller 1274 sets the content of IPR 1250 with a pre-determined value to move the flow of the program into specific subroutines in order to test the data processed by the SVP operations. This break function can be controlled by the maskable input of BPLINE 1276 Horizontal line within a given frame of the video signal.

Repeat counter 1294 reduce the required amount of memory locations in IPM 1258 by representing a number of successive, identical instructions as a combination of this instruction code and the number of repeating count. For example, when repeat counter 1294 is not zero the instruction program memory is not step because the same instruction is repeated only with a different address. This allows repeating of an instruction without having then stored in multiple memory locations. As illustrated in the instruction set, the instruction repeat value is coded in the microcode as bits 39 through 42.

Figure 37:
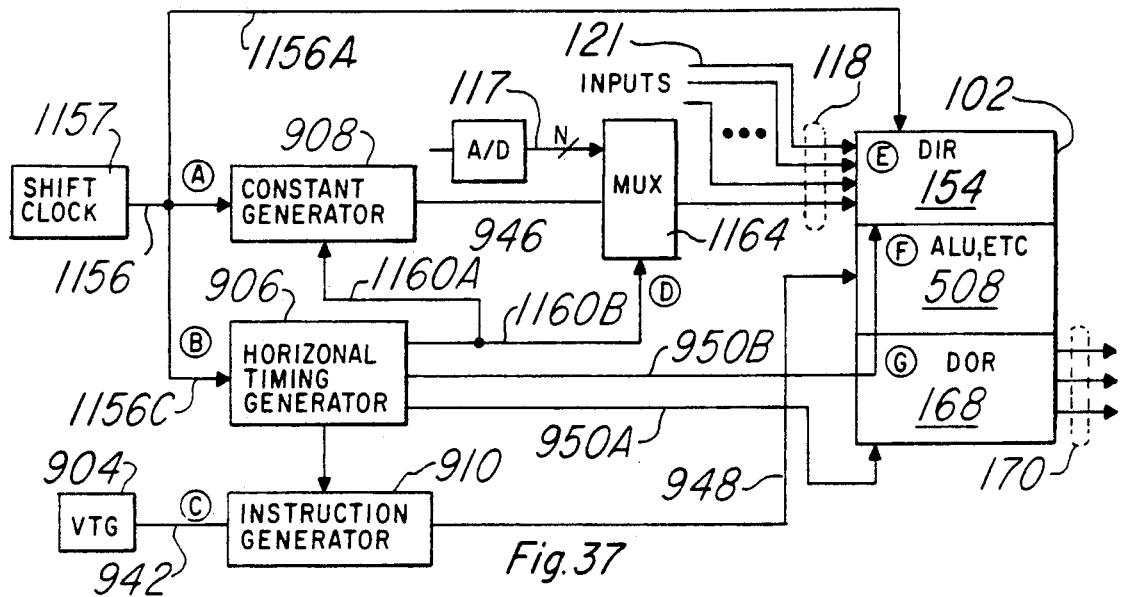
FIG. 37 shows an alternative instruction generator.

FIG. 37 depicts an alternative connective relationship between controller 128 and SVP processor device 102 of FIG. 1. Oscillator 1157 is depicted providing timing signals to various SVP system components via lines 1156. The oscillator is triggered by horizontal and vertical synchronization signal of the incoming video signal. Output lines 1160a and 1160b provide clocking signals to constant generator 908 and multiplexer 1164. A clocking signal is also provided via line 1158 to instruction generator 910. Similar connections may be made to other components as necessary. In FIG. 37, multiplexer 1164 selects as a data source to data input registers 154 the incoming digitized video signal or the constants from constant generator 908. Other inputs to data input register 154 include the output from field memories such as field memory 120 of FIG. 1 or other data sources.

Constants are provided in predeterminable patterns to the individual processor elements register files for use during data processing. The constant generator allows each processor element to have unique constant values if desired. In contrast, global variables tell all SVP processor elements the same thing. To avoid conflict with the incoming video signal constants, are loaded separately from the incoming video signal. The constants are shifted into DIR 154 by timing provided by horizontal timing generator 906. In video applications, it is possible to provide new constants as often as once every horizontal line.

Figure 38:
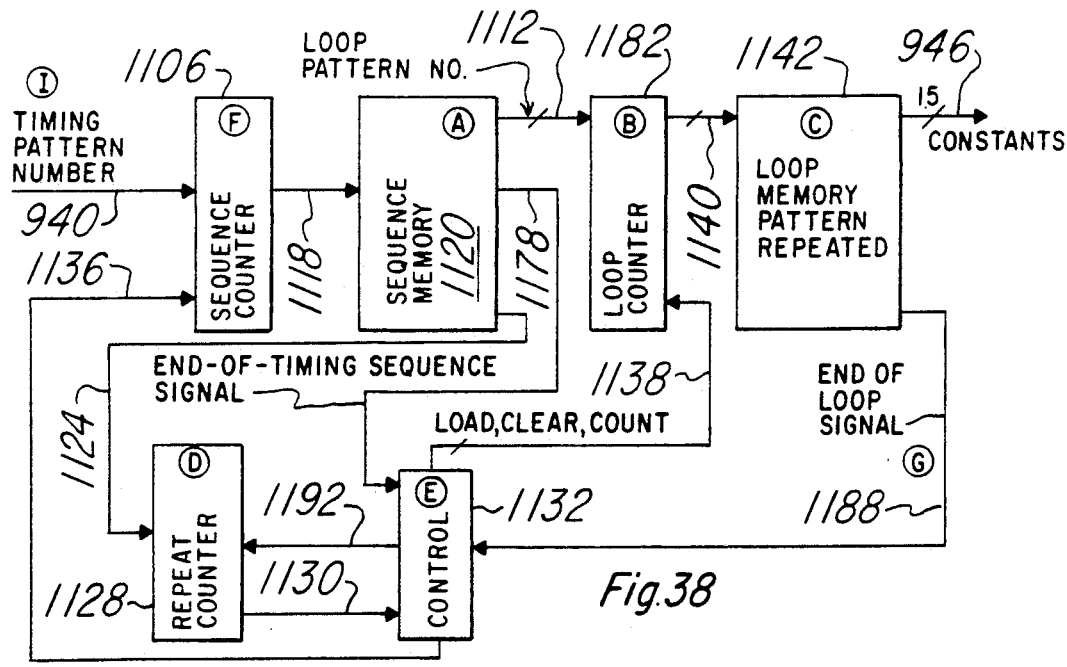
FIG. 38 shows an alternative constant generator.

FIG. 38 shows an alternative embodiment of the constant generator architecture of FIG. 35. The FIG. 38 circuit comprises sequence memory 1120 {having input line 1176 for receiving a timing pattern number} having output lines 1122, 1178 and 1124. Output 1122 provides a loop pattern number to loop counter 1182, which in turn provides an address via lines 1184, to loop memory 1142. Output 1178 provides an end of timing sequence signal to control logic 1132, which also receives an end of loop signal from loop memory 1142 via line 1188. Output 1124 provides an N-bit number indicating the number of repetitions of an instruction pattern to repeat counter 1128.

FIG. 39 and 40 are examples of contents stored in sequence memory 1120 and loop memory 1142. In FIG. 39, column I has entries for the timing pattern number of patterns stored in memory 1120. Column II has entries for the end of timing sequence signal. In this example the signal is a logical high or 1, following string a of logical lows or zeros if there are several loop patterns to be repeated. A single bit is provided if there is only one loop pattern. Column III has entries for the number of repeats for each loop pattern. Column IV has entries for the loop pattern number of the loop patterns to be repeated.

FIG. 40 tabulates the contents of loop memory 1142, column I has entries for the loop pattern number corresponding to column IV of FIG. 39. Column II has entries for the end of loop signal. This signal is a logical a high or 1, following a plurality of zeros. In this illustration four different loops are stored in memory 1142. Column III list the constants to be repeated.

Figure 41:
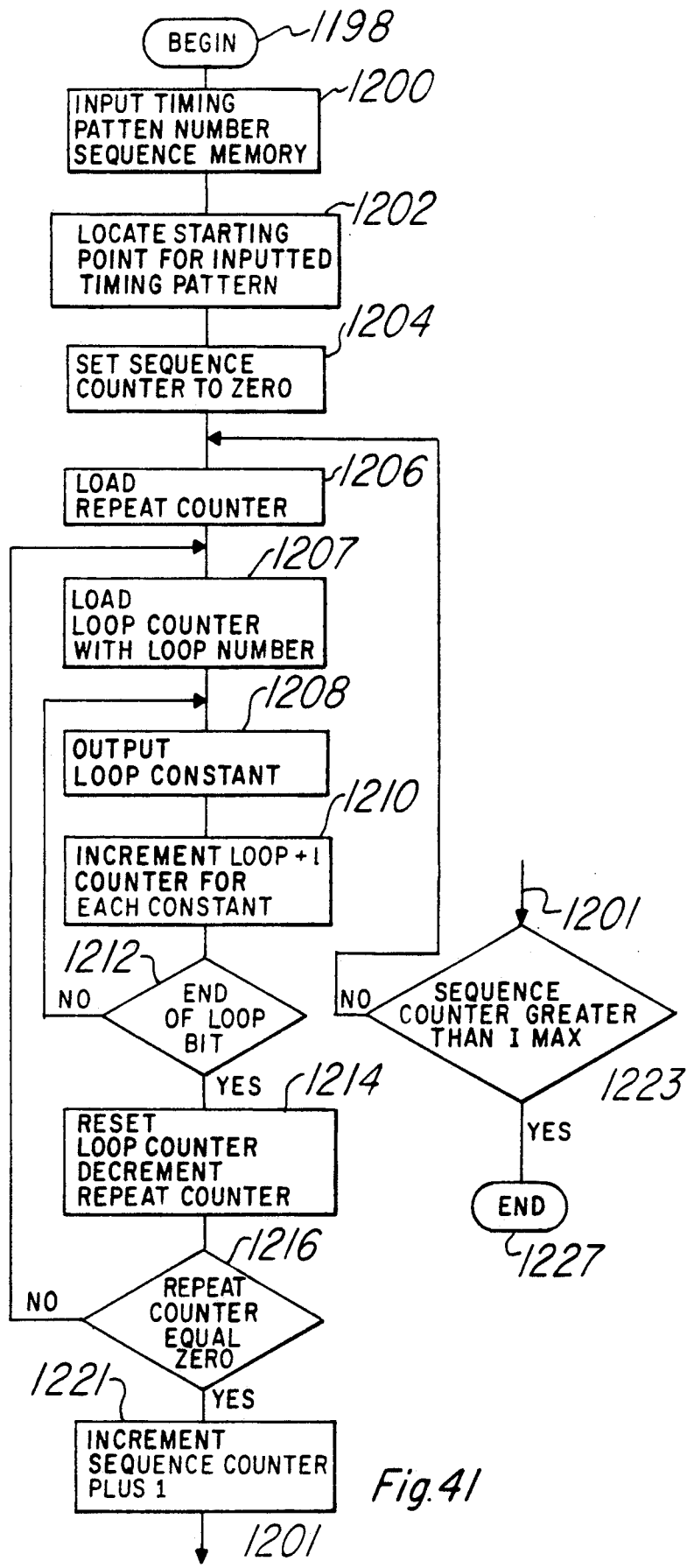
FIG. 41 is a flow diagram for the FIG. 38 constant generator.

FIG. 41 is a flow diagram for the sequence of events for providing the constants of timing pattern #4 to SVP processor device 102. The sequence begins a location 1198 when a program instruction instructs constant generator 908 to provide constant to SVP processor 102. The sequence proceeds to step 1200 to input timing pattern number to counter 1116. The timing pattern number from counter 1116 is used to address a sequence of patterns in sequence memory 1120. The timing pattern number is four in this example. The sequence then proceeds to step 1202 and counter output 1118 addresses the starting memory location for timing pattern sequence #4. The sequence then proceeds to step 1204 and sequence memory 1120 signals control logic 1170 to reset sequence counter 1116 to zero. The sequence then proceeds to step 1206 and sequence memory 1120 loads repeat counter 1128 with the number of times to repeat the loop and loads loop counter 1182 with the first loop.

In this example there are three loops in timing pattern 190 4. The first loop, loop pattern #3, is to be repeated thirty-one times. The second loop is also loop pattern #3 and it is repeated 31 times. The 5-bit address sets the maximum number of repeats at 31 in this example. By changing the bit width a larger number can be designated. In the present case if it is desired to repeat more than thirty-one times, one merely needs to repeat the same loop pattern. This is done with timing pattern #4.

After step 1206, the sequence proceeds to step 1207 and sequence memory 1120 loads repeat counter 1128 with the repeat number of the first loop pattern. This is #3 in this example. The loop counter output addresses a memory location in loop memory 1142. The sequence then proceeds to step 1208 and loop memory 1174 outputs the string of constants corresponding to loop #3. In this example the constant string is 8-5-7-3-2-19. The sequence then proceeds to step 1210 and control logic 1132 increments loop counter 1182 upon passing of each constant. At step 1212, if the end of loop bit is not encountered by control logic 1132, the operation repeats from step 1208 until the last constant in the loop is passed and the "1" end of loop signal is encountered. The sequence then proceeds to step 1214 and control logic 1170 resets loop counter 1182 and decrements repeat counter 1128 via signals on lines 1186 and 1192 respectively. Next the sequence proceeds to step 1216. At step 1216, if repeat counter 1128 has not reached zero the sequence returns to step 1207. If repeat counter 1128 has reached zero the sequence proceeds to step 1221 and control logic 1132 increments sequence counter +1 and the sequence returns to step 1206 and the steps are repeated. If at step 1223 the sequence counter count is greater than the number of sequences the operation stops at step 1227.

GLOBAL ROTATION ADDRESS COUNTER (FOR RF0 and RF1)

Figure 42:
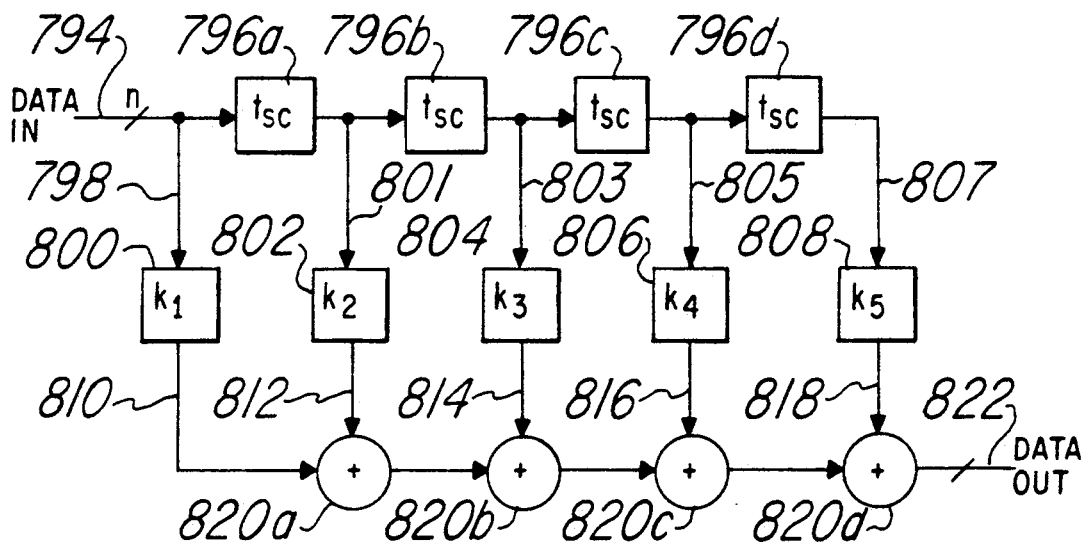
FIG. 42 shows a finite impulse response filter.

In FIG. 42, there is depicted a five pole finite impulse response (FIR) filter 792 of N-bit resolution which can be implemented in the present SVP device 102. By using the second nearest neighbor architecture of FIG. 18, 2N instructions can be saved over single near-neighbor architecture. For example, referring to the instruction set included hereinafter it is shown that processor 102 requires N instructions to move N bits from 2L to 1L to perform an add. Similarly, N instructions are required to move N-bits from 2R to 1R. By having second nearest-neighbor connections, 2N instructions are saved over a single near-neighbor communication network. If for example, a 12-bit FIR is implemented the second-nearest-neighbor arrangement would require less than 68% of the execution time of a single-near-neighbor network.

As the SVP is a software programmable device, a variety of filters and other functions can be implemented in addition to the FIR of FIG. 42 (horizontal filter). These include for example, vertical and temporal FIR filters and IIR filters (vertical temporal).

Figure 43:
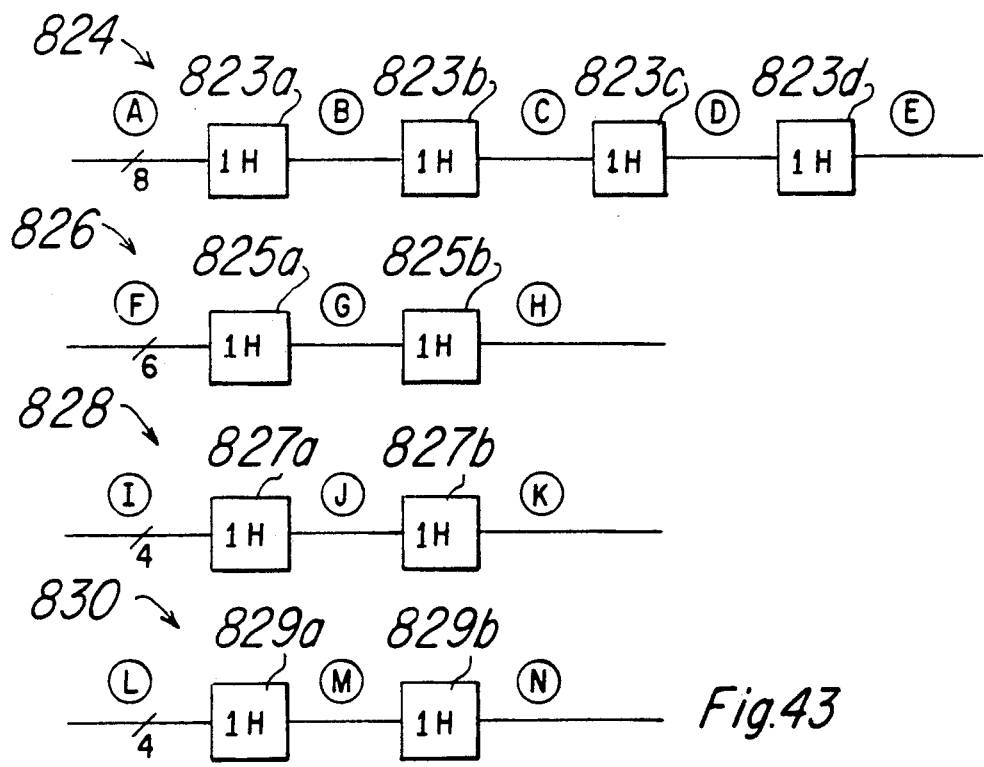
FIG. 43 shows an illustration of line memories.
Figure 44A:
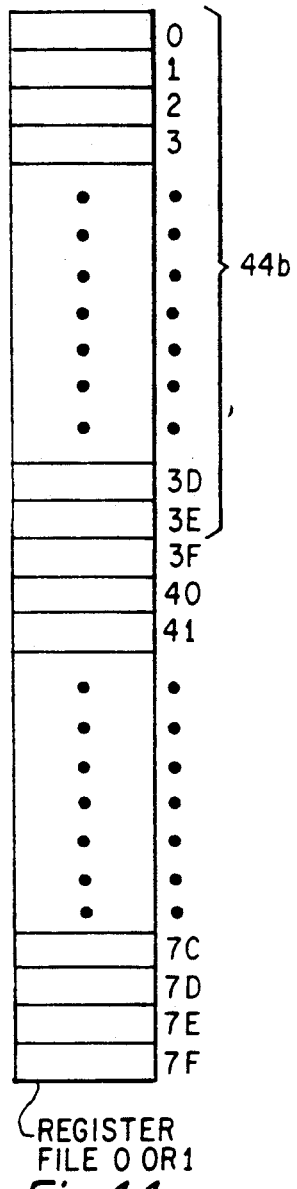
FIG. 44a shows a graphical depiction of a SVP register file.

In FIG. 43 four line memories are illustrated: an eight bit line memory 824; a six bit line memory 826; and two four bit line memories 828 and 830. These line memories can be emulated in the present SVP device 102. To illustrate the technique, assume that FIG. 44*a* represents a register file, such as RF0 of processor element n, having bit locations 00 through 7F (0 through 127). The 44*a* register file can broken into multiple pieces. In this example the register file is broken into two pieces-lower and upper (not necessarily equal). The upper part comprises bit locations 00 through 3F. The lower bit locations 40 through 7F. If the upper part is designated the global rotation memory, the lower part can be used as the normal operating register file. For ease of understanding the global rotation part can be, for example, reorganized as "P" words of "Q" bits where P×Q is less than or equal to the total global rotation space. This is illustrated in FIG. 18b, which is an exploded view of the upper part of FIG. 44a. Each line of the FIG. 44b global rotation area comprises 8-bits of the register file transposed in a stacked horizontal fashion. When an address in this memory area is specified, it is offset by a "rotation value =Q" modulus the total global rotation space. Thus instead of requiring that the data be shifted throughout the memory bank the individual line memory subset of the register file are circularly rotated. This is illustrated by the following example.

Figure 44B:
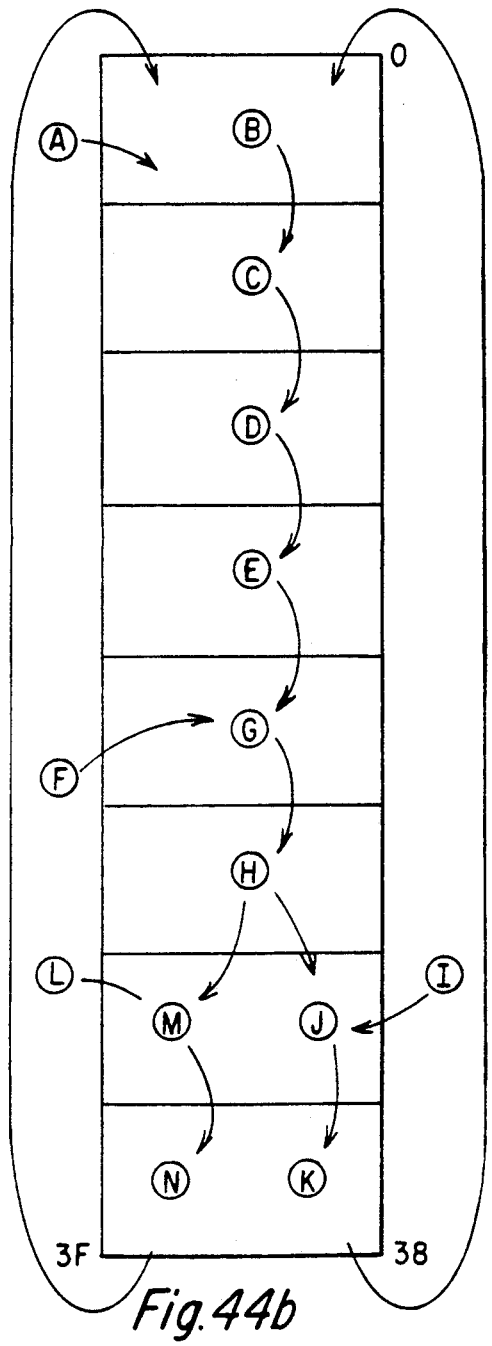

If the four example line memories of FIG. 43 are stored in the global rotation area of FIG. 44b, and a global rotation instruction is performed, the apparent effect is for the data to follow: B→C; C→D; D→E; E→G; G→H; H→M and J; M→N; J→K; N and K→B. At first glance the movement E→G, H→M and J, and N and K→B would appear to be an error since the old data existing prior to a global rotation appears to have been merely shifted. This is not the case however since immediately after the global rotation the new data values A, F, I and L are written into those locations and thus the old values E, H, K and N are lost—as would be expected in a line memory. To emulate the 1-horizontal delays, the global rotation instruction is executed once each horizontal line time. The SVP hardware allows the setting of the value of Q and the maximum vale of the global rotation space.

Figure 45:
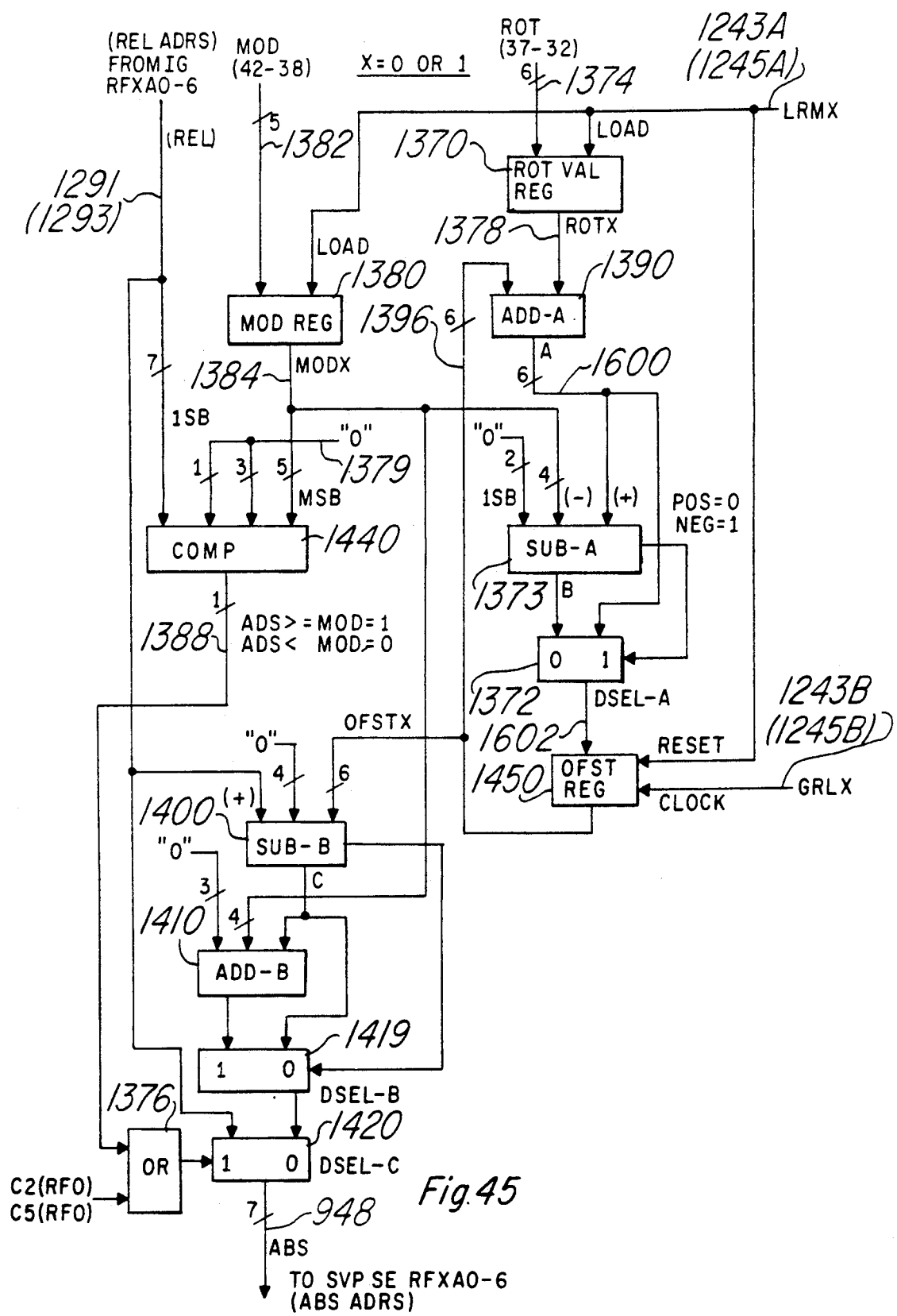
FIG. 45 shows a global rotation circuit.

FIG. 45 is a logic diagram of global rotation address generator for register file 0 (RF0) 1246 of FIG. 36. Global rotation address generator for register file 1 1244 of FIG. 36 is identical and accordingly the following discussion applies to both generators. Global rotation address generator 1246 receives a relative register address from register file 0 address counter via lines 1291. This relative address is provided to address register locations in register file 0 via lines 948. Microcode bits 32 through 37 are six of the eleven bits provided via lines 1374 and 1382 from instruction program memory 1258. The six bits provided via lines 1374 define the amount of registers in the total register area to rotated during a rotation step. This is the word length P in the previous example. For engineering design purposes the value defined by bits 32 through 37 is scaled by a factor of 2 in this example. The scaled P value is provided to registers 1370. Microcode bits C48 through 42, provided from instruction program memory 1258 via lines 1382, define the total global rotation area, or Q in the previous example. For engineering design purposes the rotation areas is scaled by a factor of 8. The scaled Q value is provided to registers 1380. When a global rotation is to begin, instruction decoder 1234 of FIG. 36 provides a signal LMRx (x=0 for RF0 and x=1 for RF1) via lines 1243A for RF0. Signal LMRx is provided to modulus register (MOD REG) 1380, rotational value register (ROT VAL REG) 1370 and offset register (OFST REG) 1450. The function of OFST REG 1450 will be discussed further hereinafter. The LMRx signal loads the values present on lines 1374 and 1382 into registers 1370 and 1380 respectively and resets register 1450. It is only necessary to execute LRMx instruction once before using global rotation. If the global rotation size is not changed or a new global rotation is not started, there is no need to reexecute.

Adder (ADD-a) 1390 adds the contents of ROT VAL REG 1370 to the current contents of OFST REG 1450. OFST REG output provided on lines 1396 is one-half the difference between that register file absolute address and the register file relative address provided on lines 1291. ADD-a outputs a new offset value on lines 1600 to the "+" input of subtractor-a 1373 and to the "1" input of data selector-a 1372. Subtractor-a 1373 subtracts the four most significant bits (MSBs) of the modulus value from MOD REG 1380 and the six bit output from ADD-a 1390. Before performing this subtraction two zero least significant bits (LSBs) are added to the global rotation area output value from register 1380. The addition of two zero LSBs multiplies the global rotation area output by 4. Subtractor 1373 is optional and tests if the offset value is outside the defined global rotation area. In this example a the offset value is within the global rotation area if the subtractor output is positive (logical low). Data selector output 1602 is provided to the "0" input of data selector-a 1372.

Data selector 1372 selects as an input the output of subtractor 1373 if the selector output is positive. The output from ADD-a 1390 is selected if the selector output is negative—indicating an offset out side the global rotation area. The output of data selector-a 1372 is a corrected offset value. The new offset value output from data selector-a 1372 is latched by offset register 1450 when clocked by signal GRLx 1243 from instruction generator. The GRLx instruction is executed to initiate a global rotation. This usually occurs at the beginning or ending of a scanning line or before a DIR to RF0 or RF1 to DOR transfer. Performing a transfer during a horizontal line scan is also possible.

Referring now to input lines 1291 of FIG. 45, the seven bits defining the register file relative address is provided as one input to comparator (COMP) 1440 and as one input to data selector-c (DSEL-c) 1420. The seven bits provided to COMP 1440 are the LSB bits of an eight bit input. The MSB is a zero bit provided on line 1379. The second input to COMP 1440 is a 5-bit output from MOD REG 1380. The five output bits provide the most significant bits of an eight bit input to COMP 1440. The three LSB bits are provided as zeros from lines 1379. Comparator 1440 compares the relative address 1291 with the output of modulus value register 1384. As mentioned output 1384 is a scaled value. The addition of three zero LSBs multiples the scaled value by eight. Comparator 1440 test for global rotation. If the relative address is greater or equal to the modulus register 1380 output, the register file locations addressed is outside the defined global rotation area and a global rotation is not performed. The comparator output 1388 is provided as one of two inputs to OR gate 1376. The second input is microcode control bit C2 (C5 if register file 1 is being addressed). As previously discussed hereinabove if microcode bit C2 (or C5) is 1 addressing is to DIR (DOR) or auxiliary registers. If C2 (C5) is 1 do not global rotate. When the relative address is outside the register file global rotation area data selector DSEL-c 1420 responsive to a signal output from OR gate 1376 selects the relative address input as its absolute address output 948.

Subtractor-b SUB-b 1400 receives as one of two inputs the relative address. The other input is the offset register 1450 output 1604 plus an added ) LSB bit. Subtractor-b 1400 is optional and performs a global rotation test. Subtractor-b subtracts between the relative address value 1291 and the defined offset value. The output on lines 1402 is the absolute address. The absolute address value 1402 is provided as one of two inputs to adder-b (ADD-b) 1410 and as one of two inputs to data selector-b (DSEL-b) 1419. If ouput 1402 is negative, signal 1394 to DSEL-b 1419 causes DSEL-b 1419 to select output 1606 from ADD-b as the absolute address. ADD-b corrects for the occurrence of a negative address since there are no negative addresses. ADD-b 1410 adds modulus register value 1384 (with three added 0 LSB bits) to subtractor-b output 1402. This results in a positive absolute address output from ADD-b. FIG. 42a is a flow diagram for the foregoing sequence of events and is a continuation of flow diagram 42a.

In the foregoing FIG. 42 logic diagram, ADD-a is a 6-bit adder, ADD-b is a 6-bit adder, SUB-a is a 4-bit subtractor, SUB-b is a 6-subtractor, DSEL-a is a 4-bit data selector, DSEL-b is a 4-bit data selector, DSEL-c is a 6-bit selector and COMP is a 8-bit comparator.

The value of [MOD REG] is <modulus value>/8, as follows:

<modulus value> = 0, 8, 16, 24, . . . 112, 120, 128

[MOD] = 0, 1, 2, 3, . . . 14, 15, 16.

The value of [ROT VAL REG] is <rotation value>/2, and for the above example is any number between 0 and [MOD REG]*4.

If address the relative address from instruction generator (REL ADRS) is greater than or equal to contents of [MOD REG]*8, the (REL ADRS) is outputted by the DSEL-c. Otherwise, modulo address is outputted by the DSEL-c to perform global rotation.

IF (REL ADRS)<[MOD REG]*8: ((REL ADRS)- −[OFST REG]*2) mod ([MOD REG]*8 If (REL ADRS)> =[MOD REG]*8: (REL ADRS).

FIGS. 46a and 46b are parts of a flow diagram for a global rotation.

In FIG. 47, example circuitry for pipelining of address, data, control and other signals received from controller 128 is depicted. The illustrative circuit comprises an address buffer 1436 providing an input 1438 to factor generator 1440, the output of which is provided to address factor decoder 1448 by driver 1444. The output 1450 of decoder 1448 is provided to latch 1452 which is clocked at the sample frequency provided on line 1454. Latch 1452 can be reset between clocking by and active low input on line 1458. The output of latch 1452 is provided to the control line input of the section under control, such as word line 1462 of a data input register, input register file, output register file or data output register. If an external controller is used chip pad contact 1432 is provided to input the control signal to the SVP core 102. The FIG. 47 type circuit can be used on the DOR side also. FIG. 48 is a table of various inputs and outputs for a pipeline circuit.

In FIG. 49, a timing diagram is provided to illustrate the improved speed of the device resulting from the ability to continuously provide signals to the SVP without requiring that the outcome of previously executed instructions be determined. Signal 1431 is a valid memory address signal being provided to SVP device 102 core via external contact pad 1432. Signal 1450 is the decoded signal output of address decoder 1448. Signal 1462 illustrates the signal output of driver 1456 being provided to, for example, the DIR word line. If at time t0 a valid address signal is provided, the signal is decoded and provided to the latch 1452 at time t1, whereat it is latched in at time t3. Upon sampling, the decoded address is provided to selected word lines. Speed of operation is substantially improved by being able continuously provide the subsequent signals to the address buffer before the previous signal has been executed. In the present circuit, the latch holds the state of the current operation's address while the new address (for the next operation) is pipelining through the input buffer, factor generator/driver, wiring and address decoder. As previously mentioned hereinabove the present pipelining technique applies to data signals, control signals, instructions, constants and practically all other signals that are provided in a predeterminable sequence.

In FIG. 50, it is illustrated how to further pipeline the signals by configuring the input buffer as a latch. These latches can then be reset and clocked by some derivation of the reset 1482 and/or sample signals 1484. Contact pad 1486 receives a master clock input signal which is eventually provided throughout the pipelining system. Similarly, clock generator 1496 generates the latching and reset signals for the system. A device of this type can be provided for all control and address signals from the controller.

FIG. 51 depicts a controller circuit suitable for controlling distribution of global variables. Controller as previously discussed provides addressing and control and data signals to the SVP processing elements. To load variables into the SVP and distribute those variables globally the controller hardware of FIG. 51 can be used.

As depicted the controller can be modified to include a set of auxiliary registers 1570 and an addressing structure which modulates the M registers of the SVP processing elements to distribute the variables. The auxiliary registers and modulation section 1196, comprises an auxiliary storage register 1510 such as a RAM memory and a 2→1 multiplexer (MUX) 1574. Auxiliary registers 1570 has an 8-bit load data input 1562, a data write input 1564 and a register address or read port 1568 organized as 5-bit by 1. The auxiliary register write port is organized as 2-bit by 8. Auxiliary register output 1572 is provided to trigger the High input of MUX 1574. The Low input to MUX 1574 is bit C18 of the opcode output. Line 1576 provides an auxiliary register instruction enable signal to MUX 1574. The auxiliary registers 1570 are discussed in greater detail hereinafter.

Referring to FIG. 51, a memory map of the register file 1 (RF1) and data output register (DOR) of a processor element is depicted. As mentioned the auxiliary register address in the memory map is part of the unused addresses for RF1/DOR. In operation the act of addressing the area "above" the DOR address in the memory selects the auxiliary registers. Data stored in the auxiliary registers are written s 4 words of 8-bits each, but read as 32 words of 1-bit each. When the state of an auxiliary register bit is read, either the auxiliary register output or original opcode bit C18 is passed directly to the M register data selector MUX depending on the state of auxiliary register MUX enable line. A zero or one is selected in register M if opcode bits C19 and C20 are both 1; i.e., M output =0 if {C20,C19,C18}={110} and M output=1 if {C20,C19,C18}={111}.

FIG. 52 depicts auxiliary register and controller block 1196 of FIG. 36. There are 4 8-bit registers 1608A-B in the register set for storing a total of 32 1-bit global variables. The variables are provided to the registers via lines 1562. Each register set 1608A-B has a clock signal input for receiving a write clock signal from an auxiliary via line 1563. Each register set also includes a load (LD) or write enable input 1610 and an output enable (OE) 1612 connected as an output from 1→4 decoder 1616. The read/write enable for registers 1608A-B are connected via respective lines 1614A-B to corresponding decoder outputs. A 2-bit register address is provided to decoder 1616 via line 1618 from a 2→1 data selector 1620. Data selector 1620 has three inputs. Input 1295 is a 2-bit address identifying the register to written with the 8-bit provided on lines 1562. Input 948A is a 2-bit address identifying the register to be read. The 2-bits are bits 3 and 4 of the register file address bits. Either input 1295 or 948A is selected by auxiliary write enable clocks signal 1564. Bits 0 through are provided to a select input of a 8→1 data selector 1622. When decoder 1616 provides an output enable signal to a particular register while a clock signal is present at the registers clock input, register file address bits 0 through 2 identify a bit in the register set for input via line 1572 to 2 to 1 data selector 1574. As previously stated data selector 1574 selects either a global variable 1604, which is used by the up counter 1592 for the RF0 operand address; a similarly 7-bit address 1606, which is used by the provided via RF1 address up counter 1594. Additionally, a 1-bit control signal 1607 is provided to control logic 1586 to indicate whether a single or double instruction is being implemented.

The repeat counter's ripple carry ouput is input to the count/hold input of the program counter to signal it to stop operation until the repeat sequence is finished. Once the instruction has been repeated the proper number of times, the ripple carry output signals the program counter to resume its operation. This ripple carry signal is also input to the control logic to put it i the proper state for the given condition: If the repeat counter is operating, control logic outputs a 2-bit coded to the register file up-counter to put them in the count mode. If the repeat counter is not operating, the register file up-counters will be put into the latch mode. This 2-bit output also indicates whether the count should be by one for single instruction mode or by two for double instruction mode.

A 32-bit addition example will illustrate benefits of the above circuitry. An instruction set for the addition of two 32-bit words is set forth below in abbreviated form in Table 27.

TABLE 27

```
1) M=1, A=R0(1),   B=R1(1),   C=0,    R1(1)=SM    ⎫
2)      A=R0(2),   B=R1(2),   C=CY,   R1(2)=SM    ⎪
         (3),      (3),                (3)=       ⎪   "DOUBLE INSTRUCTION"
         |         |          |        |          ⎪   COMPRESSES 30 INSTRUCTIONS
         |         |          |        |          ⎬   INTO 15 INSTRUCTIONS, THEN
         |         |          |        |          ⎪   "REPEAT" COMPRESSES 15
         |         |          |        |          ⎪   INSTRUCTIONS INTO 1
         (30)      (30)                (30)       ⎪   INSTRUCTION.
        A=R0(31), B=R1(31),   C=CY,   R1(31)=SM   ⎪
3)      A=R0(32), B=R1(32),   C=CY,   R1(32)=SM   ⎭
4)                            C=CY,   R1(33)=SM
``` as the C18' bit for input to SVP processor array or the original C18 bit. Selection is determined by register address bits 5 and 6 and C5 control bit. Although the above example details addressing global variables into register file 1, the principle applies to addressing register file zero also. When addressing register file 0, control bit C5 would be control bit C2.

In the Memory Map for RF1, DOR (Table 4) the addresses of the auxiliary registers is in the reserved area. The hardware however, is located in instruction generator 910. In this manner the auxiliary registers can be implemented with one set (not N sets) of registers. Only register bit is addressed by one address value, as opposed to the DOR, where N bits (i.e., 1024 bits corresponding with the number of processing elements) are addressed simultaneously by one address value. When an address outside of the physical memory of the SVP core is made the auxiliary register are addressed.

Figure 53:
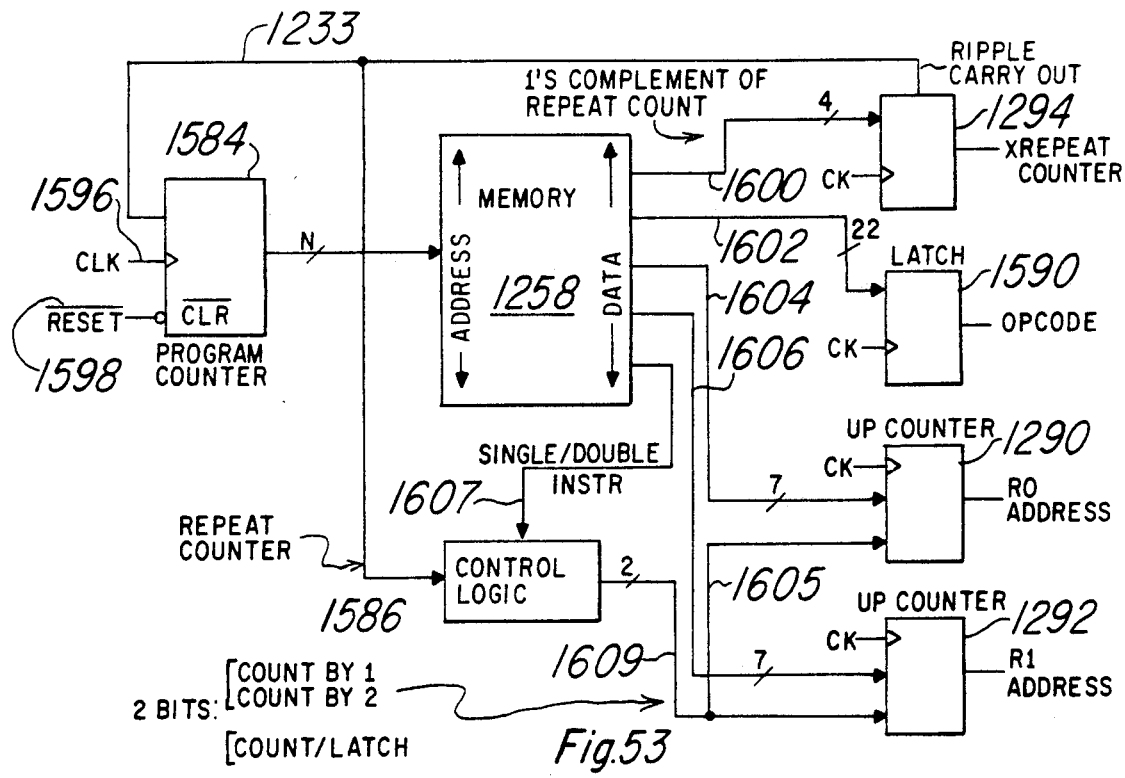
FIG. 53 shows memory reduction control circuitry.

In FIG. 53, a SVP controller having ROM memory, for example, is depicted on association with circuitry fore reducing memory requirements of the controller memory. Briefly, this reduction is achieved by adding repeat counter 1588 and count/hold input to program counter 1584 to controller as depicted. The controller data and address locations are sequenced by the N-bit output of the program counter. The program counter is clocked and reset via signal inputs 1596 and 1598 respectively. The controller provides a plurality of output signals: 4-bit count signal 1600 which is input to repeat counter 1588 allow a repeat count up to 16; the 24-bit opcode 1602 also referred to as microcode or microinstructions which are latched via latch 1590; 7b-t address If considered in conjunction with the two 4-bit word addition example discussed earlier (Table 25) it is clear that instructions 2 through 31 of the instruction set can be compressed into 15 double instructions. By then implementing the repeat counter mode, the 15 double instructions an be assembled as a single instruction repeated 15 times by the included hardware. Thus, an addition of two 32-bit words is reduced from 33 to 4 instructions. When the repeat counter is engaged, the program counter stops and the two address counters auto-increment 1 for signals instructions or by 2 for double instructions. It should be apparent from the above discussion of operation that controller memory reduction as described in accordance with the present invention may be implemented with or without concurrent use with double instructions. If for example, the above 32-bit add example is implemented without double instructions the repeat count bit value can be increased to allow for a larger repeat count or the first repeat can be performed twice.

Figure 54:
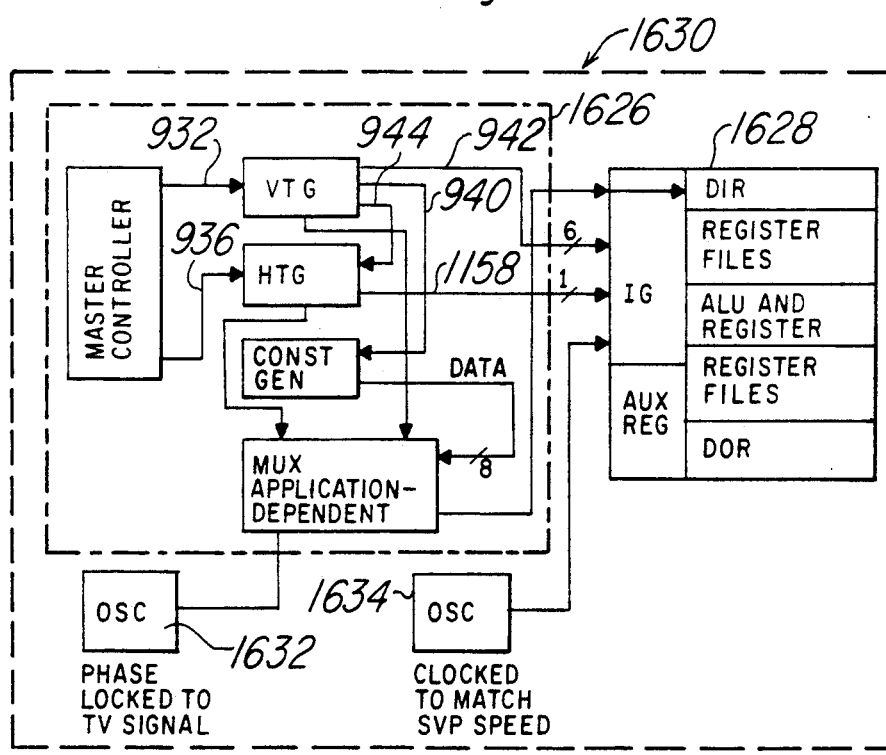
FIG. 54 shows an alternative SVP controller/processor system.

FIG. 54 depicts an alternative embodiment of the present synchronous vector processor/controller chip. In FIG. 54 the instruction generator an auxiliary registers are included on chip with the SVP processor core array. As previously mentioned hereinabove controller 1626 and SVP device 1628 can be manufactured on one silicon chip forming device 1630. Clock Oscillator 1632 is phase locked to the transmitted television signal and provides clocking signals to the controller section.

Clock oscillator 1634 is generally checked to match the SVP operating speed.

Figure 55:
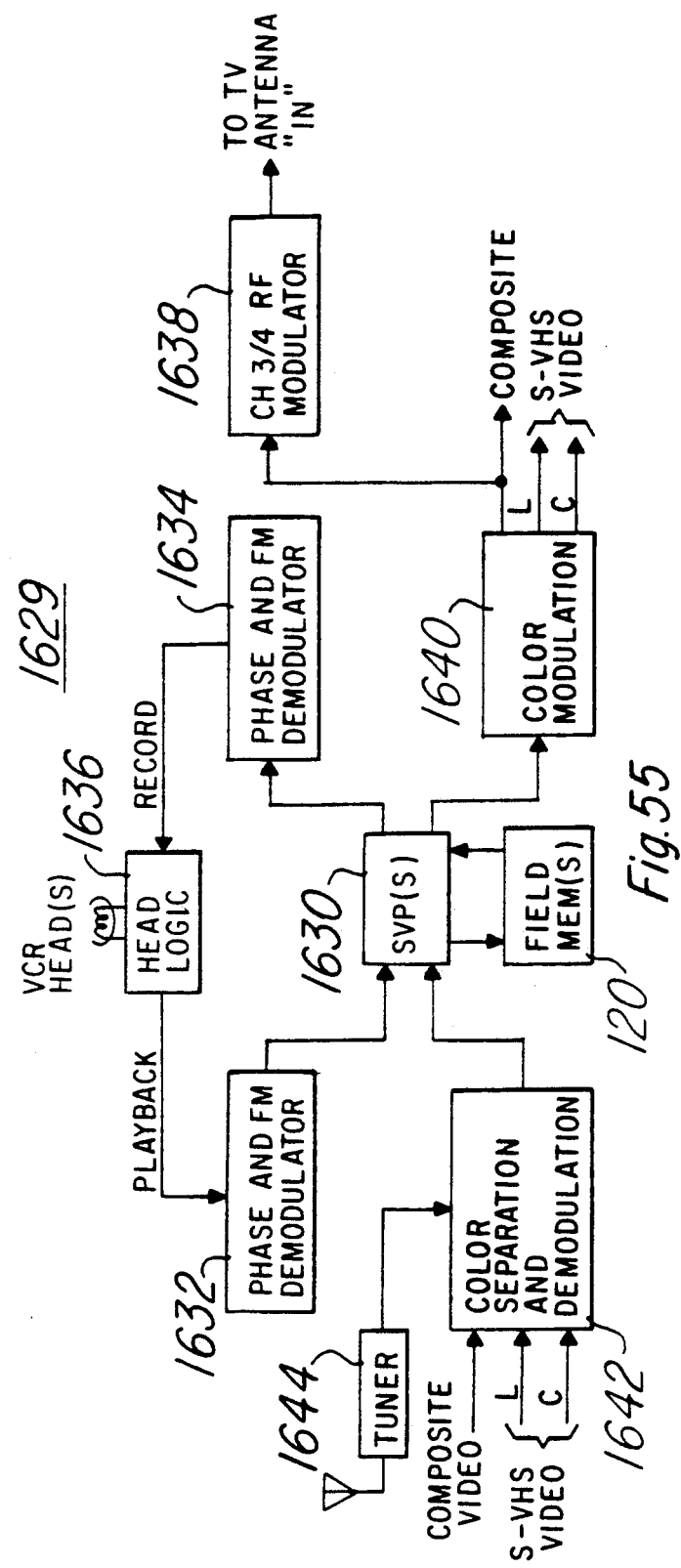
FIG. 55 shows an SVP video tape recorder system.

FIG. 1 and descriptions relating thereto details how the SVP device and controller are incorporated into a television system. Also included is a description of how a video cassette/tape recorder 134 can have its output 136 provided to the SVP processor in place of the transmitted video signal. Alternatively a SVP device/controller system can be incorporated directly within a video tape recorder. An example of how this can be done is depicted in FIG. 55. Block 1630 may contain one or more SVP devices for system 1629. System 1630 includes conventional tuner circuitry 1644 for tuning reception of composite or S-VHS video signals. Color separation and demodulation circuitry 1642 processes the tuned signal and the output is provided to SVP system 1630 in the manner previously discussed. A processed signal output is color modulated by circuitry 1640 and either a composite video signal or a S-VHS video signal is output from modulator 1640. The composite video signal is RF modulated by circuitry 1638 and provided to a television antenna input or monitor input for display.

During a record mode the processed video signal is phase and FM modulated by circuitry 1634 and recorded by head logic 1636 in the conventional manner. During a playback the recorded signal is read from the tape and transmitted to phase and FM demodulation circuitry 1632. Thereafter the signal can again be processed by SVP system 1630 and provided as an output. One or more field memories 120 may be used to capture data in the manner previously discussed with respect to FIG. 1.

The synchronous vector processor device and controller system disclosed and described herein is not limited to video applications. The SVP's unique real-time performance offers flexible design approaches to a number of signal processing applications. Some of the applications are listed in Table 27.

TABLE 27

| General Purpose DSP | Medical |
|---|---|
| Digital Filtering | Patient Monitoring |
| Convolution | Ultrasound Equipment |
| Correlation | Diagnostic Tools |
| Fast Fourier Transforms | NMR Imaging |
| 2nd Dimension | PET Scan Imaging |
| Adaptive Filtering | Military |
| Neural Networks | Radar Processing |
| Consumer | Sonar Processing |
| Radar Detectors | Image Processing |
| Digital Video/Audio TV | Navigation |
| Music Synthesizer | Missile Guidance |
| Industrial | Radio Frequency Modems |
| Robotics | Sensor Fusion |
| Visual Inspection | Telecommunications |
| Graphics/Imaging | Echo Cancellation |
| Robot Vision | ADPCM Transcoders |
| Image Transmission/Compression | Equalizers |
| Pattern Recognition | Data Encryption |
| Image Enhancement | FAX |
| Homomorphic Processing | Cellular Telephones |
| Workstations | Speaker Phones |
| Animation/Digital Map | Digital Speech |
| Instrumentation | Interpolation (DSI) |
| Spectrum Analysis | Video Conferencing |
| Function Generation | Spread Spectrum |
| Pattern Matching | Communications |
| Seismic Processing | Automotive |
| Transient Analysis | Vibration Analysis |
| Digital Filtering | Voice Commands |
| | Digital Radio |

TABLE 27-continued

| Cellular Telephones |
|---|
| Global Positioning |

Figure 56:
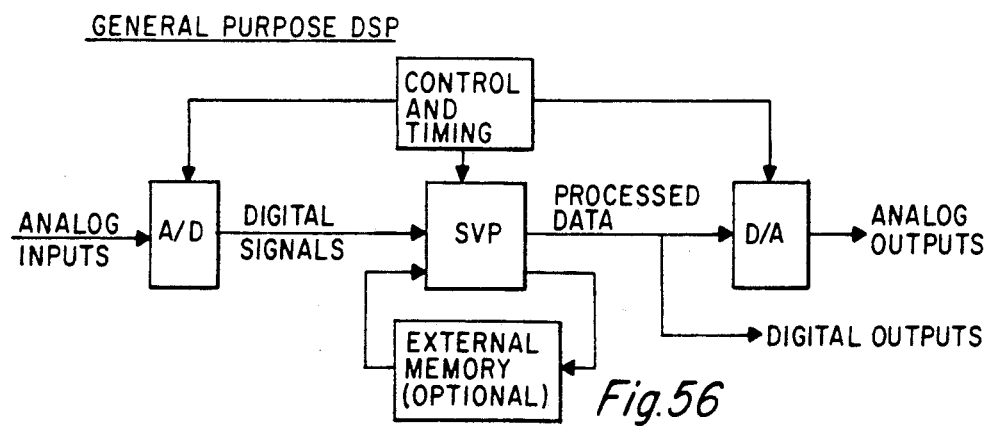
FIG. 56 shows an SVP based general purpose digital signal processing system.

FIG. 56 depicts a general purpose digital signal processing (DSP) system. The FIG. 56 system is general and can be used for digital filtering, convolution, correlations, fast fourier transforms, cosine, sine, Hadamard, Walsh transforms and adaptive filtering to list just a few examples. The FIG. 56 system includes an analog-to-digital converter for converting analog inputs to digital signals. A SVP system is disposed in the data stream to receive the digital signal an provide a processed data signal output. The processed data can be converted to analog by an analog-to-digital converter or the processed digital signal can be provided directly as an output. Timing and control for the system can be provided by a timing and control circuit.

Figure 57:
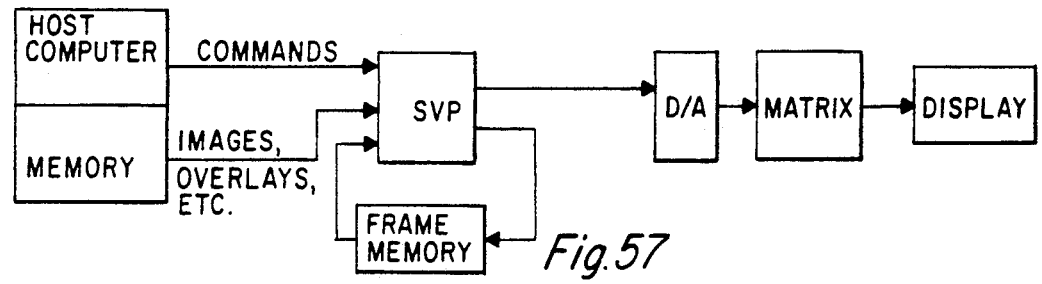
FIG. 57 shows an SVP based graphics/image processing system.

FIG. 57 depicts a graphics/image processing system incorporating a SVP system. The SVP device receives commands from a host computer and receives images, overlays, etc. from a memory associated with the host computer. A frame memory can be used to capture a frame of data for reinput for further processing. The SVP output can be digitized by a digital-to-analog converter, processed by a matrix and displayed by display. The general purpose system of FIG. 57 can be used to perform various operations on images. System 57 can be used to replace a graphics board in many computers. Some of the possible operations are combing images (overlays), alter colors, zoom in/out, filtering, spectral analysis and creation of drawings (draw lines, circles, text, etc.).

Figure 58:
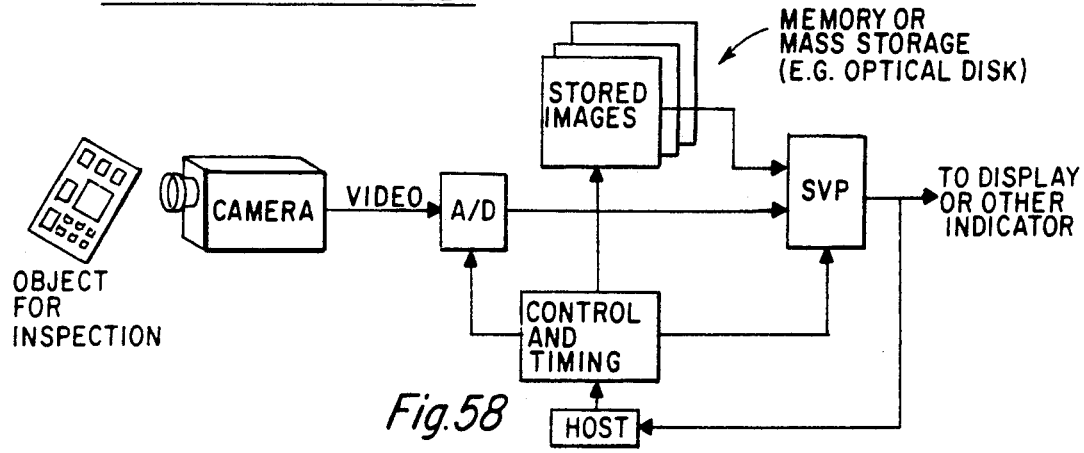
FIG. 58 shows an SVP based visual inspection system.

FIG. 58 depicts a vision inspection system incorporating a SVP system. The system includes a video camera for viewing objects to be inspected, or otherwise analyzed. The camera outputs a video signal to the inputs of an A-to-D converter which digitizes the analog video signal and provides a digital input to SVP system. The SVP system may also be provided with stored images from a memory or mask storage source such as an optical disk. The SVP can provide an output to a display or other indicator means and also to a host computer. The host computer may be used to control a timing and control circuit which also provides signals to the A analog to digital converter, the memory and the SVP device system. The visual inspection system of FIG. 58 can perform inspection of devices by comparing them to stored master images. The output can be an image showing differences, a simply pass/fail indicator, or a more complex report. The system can automatically determine which device is being inspected. Other type sensors could be used as well, such as infrared, x-ray, etc. A pre and post processing of the images could be performed to further enhance the output.

Figure 59:
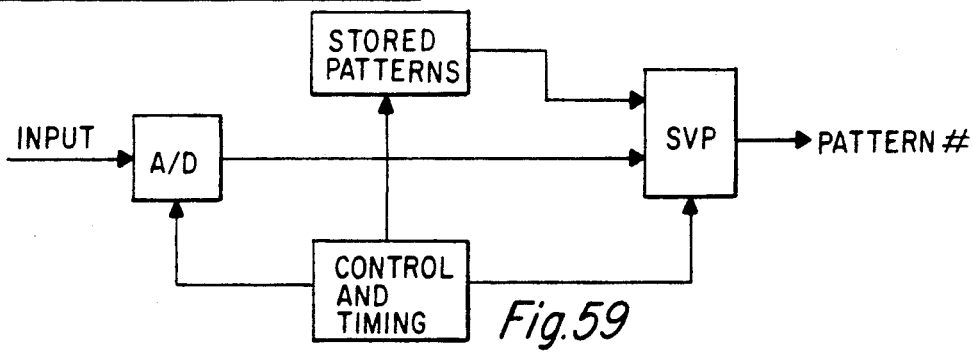
FIG. 59 shows an SVP based pattern recognition system.
Figure 60:
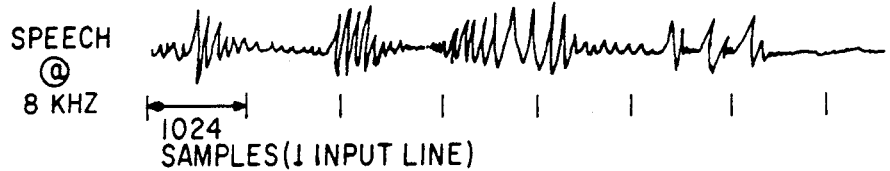
FIG. 60 shows an illustrative speech signal.

FIG. 59 depicts a pattern recognition system incorporating a SVP system. The SVP device receives digitized input signals from the output of an analog-to-digital converter. Stored patterns may also be provided to the SVP for processing from an external memory. The input data is processed and a pattern number is output from the SVP. The analog-to-digital converter, stored pattern memory and SVP may operate under control of output signals from a control and timing circuit. The pattern recognition system compares input with stored data. This system goes beyond the visual inspection system and classifies the input data. Due to the SVP's speed many comparisons can be made in real-time. Long sequences of data can be classified. An example speech recognition application is illustrated FIG. 60. FIG. 60 depicts a speech data sample having a frequency of 8 kilohertz. Since speech is digitized at relatively low rates, 8 kilohertz, the SVP has plenty of time to perform many calculations on the transmitted speech data. An input of 1024 samples long would give approximately one-eight second to process data, which corresponds to around 1.4 million instructions. In addition, the SVP can store many lines of data and thus recognize words, phrases, even sentences.

Figure 61:
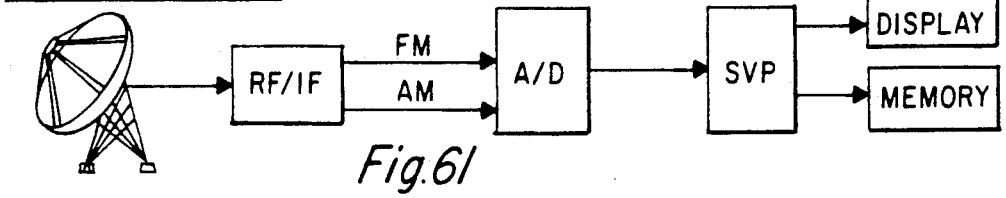
FIG. 61 shows an SVP based radar processing system.

FIG. 61 depicts a typical radar processing system utilizes an SVP. Detected radar signals are transmitted from the antenna to an RF/IF circuit and the FM/AM outputs are provided to analog digital converter. The digitized output signal is processed by the SVP and the output is provided to a display or stored in memory. This system processes pulse radar data an either stores or displays the results.

Figure 62A:
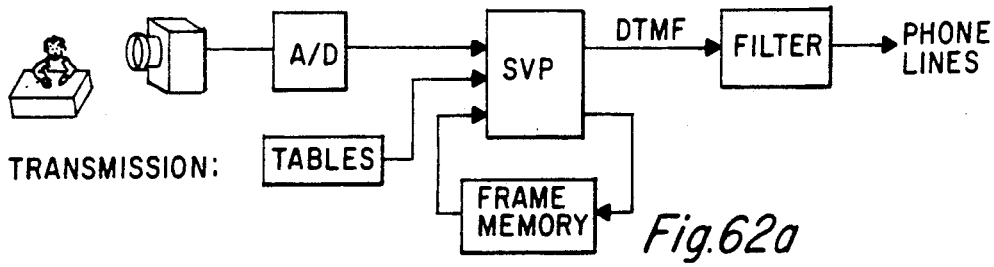
FIGS. 62a and 62b show an SVP based picture phone system.
Figure 62B:
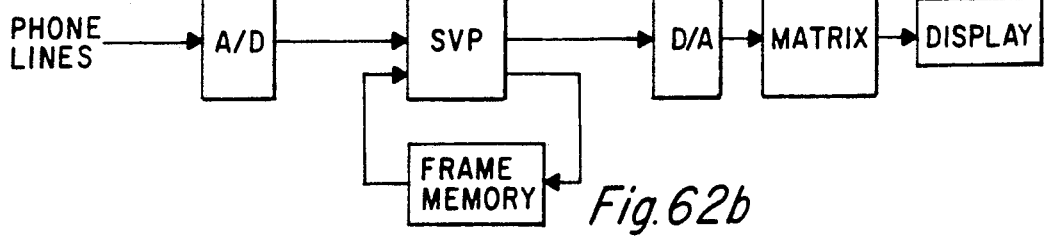

FIG. 62 is a picture phone system utilizing an Synchronous Vector Device. FIG. 62 depicts the transmission and reception side. The video camera views the subject and the analog signal is digitized by analogs digital converter. The digitized output is provided as an input to the SVP device. Other inputs include tables and the output of a frame memory. The SVP DTMS output is filtered in the filter circuit and provided to the phone lines. On the reception end, the phone lines transit the transmitted data to an analog to digital converter where the digitized signal is processed by a Synchronous Vector Device. The input signal may be processed along with stored data in a frame memory. The SVP output is converted to analog by digital by digital to analog converter and placed in a matrix and displayed by a display. The picture phone system compresses input images, then encodes them as DTMF values and sends them over phone lines to a receiver. Sign tables are used to generate the tones directly in the SVP. On the receiving end the DTMF tones are digitized then detected and decompressed in the SVP.

Figure 63A:
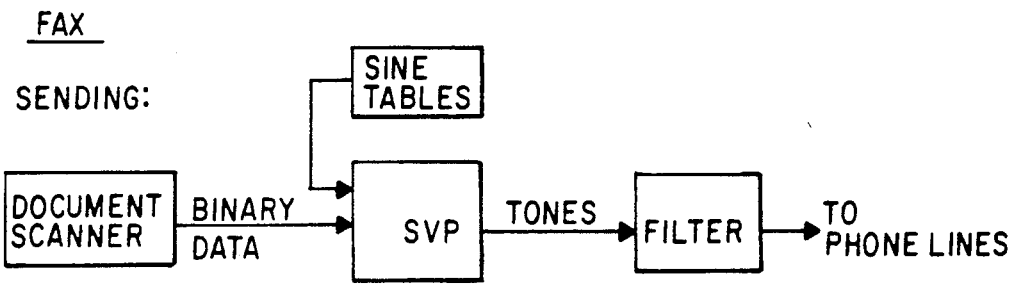
FIGS. 63a and 63b show an SVP based facsimile system.
Figure 63B:
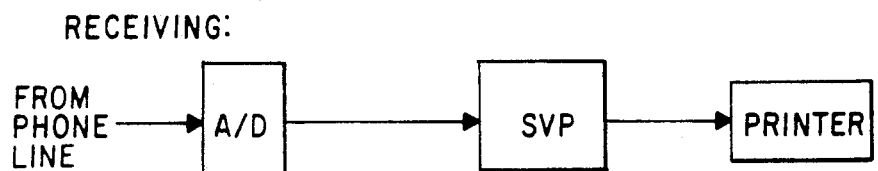

FIG. 63a and 63b depict a facsimile system utilizing a Synchronous Vector Processor. FIG. 63 depicts the transmitting or sending in. A document scanner would scan the document to be transmitted and the scanned binary data is provided as an input to the SVP. Time tables can be used to generate tones directly in the SVP. The SVP performs encoding and tone generation. The tones are outputs to filter and then provided to the phone lines. On the receiving end, the received data from the phone line is converted to digital by analogs digital converter and provided to the SVP for tone detection and decoding. The decoded SVP output is then printed by a printer.

Figure 64:
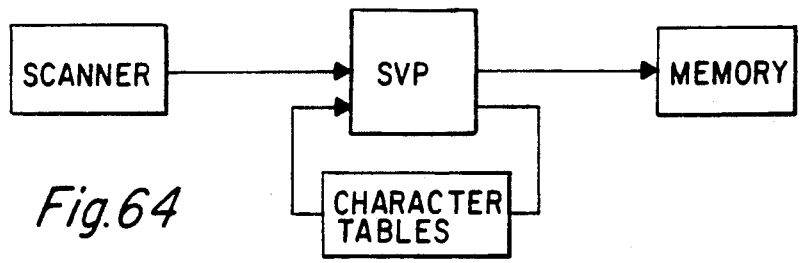
FIG. 64 shows an SVP based document scanner.

FIG. 64 is a SVP based document scanner system which converts scanned documents to ASCII files. The scanner output is provided to the SVP where it is processed along with character tables and the processed output is stored in memory. The document scanner system digitizes data like a FAX machine, but performs pattern recognition on the data and converts it to ASCII format.

Figure 65:
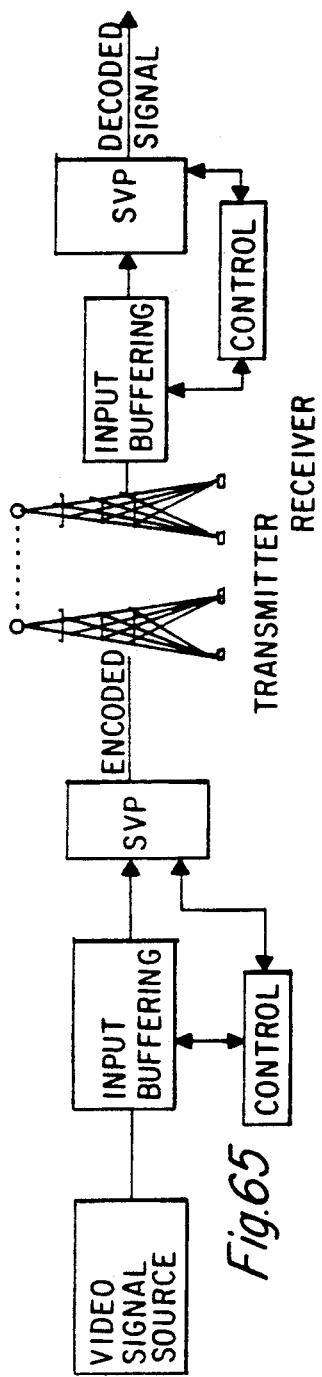
FIG. 65 shows an SVP based secure video transmission system.
Figure 66:
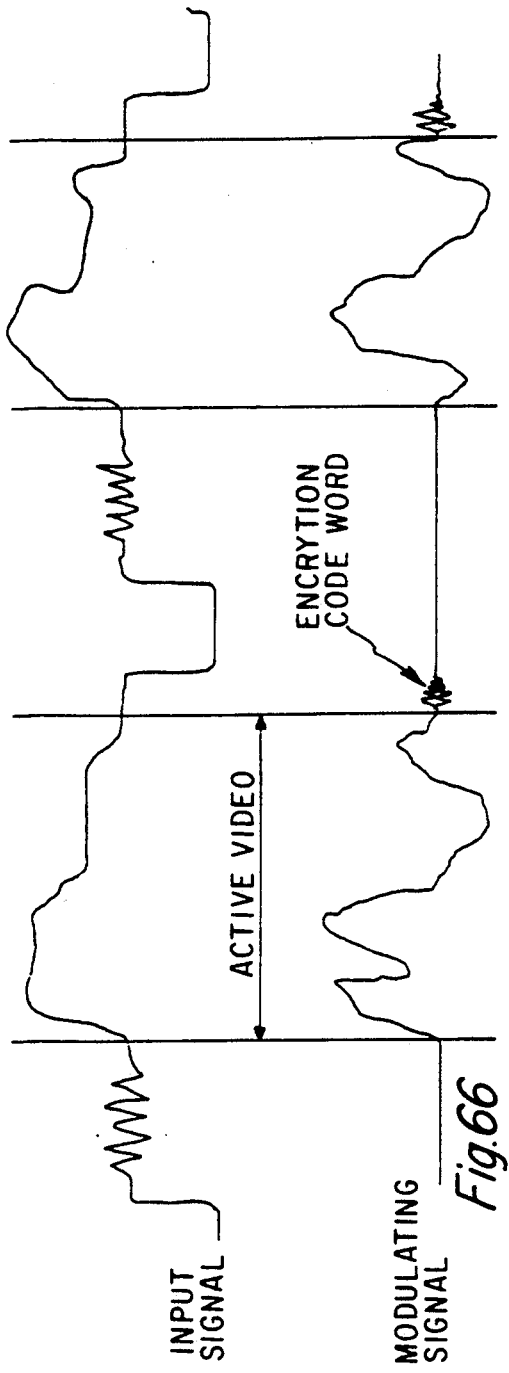
FIG. 66 shows an illustrative video signal for the FIG. 65 system.

The SVP can for used for secure video transmission. This system is shown in FIG. 65. The system includes a video signal source which provides an output to an input buffer. The buffered signal is provided to the SVP for processing. The SVP and input buffer can operate under control of a controller. The encoded signal from the SVP is provided to a transmitter where it is transmitted to a receiver and is again input buffered and decoded by an SVP on the receiving end. The SVP in the above system can encrypt a video signal by multiplying the pixel in each processor element by an arbitrary constant. The mapping of encryption constants to processor elements is defined by ROM coded pattern in the encoding and decoding Synchronous Vector Processors. The encoder transmits a code word to the decoding SVP. This code word changes the receiving device to demodulate by multiplying by inverse of the encoding pattern. An illustration of the transmitted signal is provided in FIG. 66.

Figure 67:
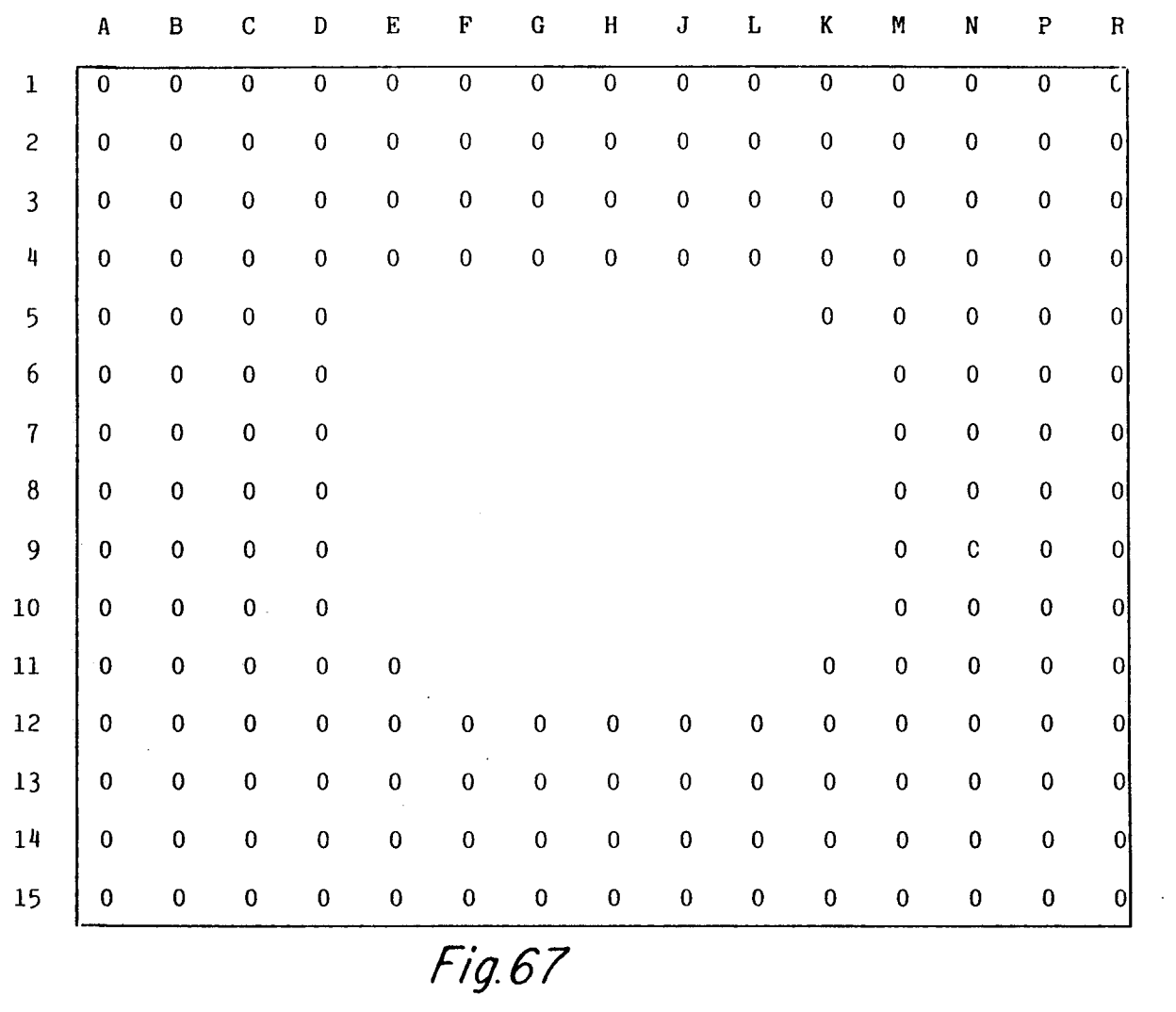

The SVP chip is packaged in a pin grid array package. FIG. 67 is a pinout of the chip package.

SVP PIN GRID ARRAY CHIP PINOUT

The pin name and package pin coordinate for the SVP SE chip is shown in Table 28.

TABLE 28

PGA Pinout

| Signal | Pin # | Signal | Pin # | Signal | Pin # | Signal | Pin # |
|---|---|---|---|---|---|---|---|
| DI36 | C13 | SRCK | C2 | C9 | L5 | DI7 | N13 |
| DI37 | C12 | Vss | A1 | C10 | N3 | Vdd | M13 |
| DI38 | B13 | DO0 | E4 | Vdd | N4 | DI8 | N14 |
| DI39 | A15 | DO1 | B1 | C11 | P3 | DI9 | R15 |
| Vss | D11 | DO2 | E3 | C12 | R1 | DI10 | L12 |
| SWCK | A14 | DO3 | D2 | C13 | R2 | DI11 | P15 |
| RSTWH | C11 | Vdd | C1 | C14 | N5 | Vss | L13 |
| WE | B12 | DO4 | F4 | C15 | P4 | DI12 | M14 |
| CC0L | A13 | DO5 | F3 | C16 | M6 | DI13 | N15 |
| Vdd | D10 | DO6 | E2 | C17 | N6 | DI14 | K12 |
| CC1L | C10 | DO7 | F2 | C18 | P6 | DI15 | L14 |
| CC2L | B11 | Vss | D1 | Vdd | R4 | Vdd | M15 |
| CC3L | B10 | DO8 | E1 | C19 | M7 | DI16 | L15 |
| Vss | A12 | DO9 | G4 | C20 | N7 | DI17 | J12 |
| RF0A0 | D9 | DO10 | G2 | C21 | P7 | DI18 | J14 |
| RF0A1 | B9 | DO11 | F1 | C22 | R7 | DI19 | K15 |
| RF0A2 | A10 | Vdd | G1 | Vss | N8 | Vss | J15 |
| RF0A3 | A9 | DO12 | H4 | C23 | R8 | DI20 | H12 |
| Vdd | A8 | DO13 | H3 | TEST1 | P9 | DI21 | H15 |
| RF0A4 | B7 | DO14 | H1 | TEST2 | N9 | DI22 | G14 |
| RF0A5 | C7 | DO15 | J1 | TEST3 | M9 | DI23 | G12 |
| RF0A6 | D7 | Vss | J2 | RESET | R10 | Vdd | F15 |
| RF1A0 | B6 | DO16 | J4 | PCK | P10 | DI24 | F14 |
| Vss | C6 | DO17 | K2 | GO | R11 | DI25 | E15 |
| RF1A1 | D6 | DO18 | K3 | CC0R | P11 | DI26 | F12 |
| RF1A2 | C5 | DO19 | L1 | CC1R | M10 | DI27 | E13 |
| RF1A3 | A4 | Vdd | K4 | CC2R | N11 | Vss | D15 |
| RF1A4 | B4 | DO20 | L3 | CC3R | R12 | DI28 | D14 |
| Vdd | A3 | DO21 | M1 | Vss | P12 | DI29 | C15 |
| RF1A5 | D5 | DO22 | M2 | DI0 | R13 | DI30 | E12 |
| RF1A6 | C4 | DO23 | N1 | DI1 | M11 | DI31 | D13 |
| C0 | B3 | Vss | L4 | DI2 | N12 | Vdd | C14 |
| C1 | A2 | C4 | M3 | DI3 | P13 | DI32 | B15 |
| C2 | B2 | C5 | N2 | Vss | R14 | DI33 | B14 |
| C3 | D4 | C6 | P1 | DI4 | P14 | DI34 | D12 |
| RE | C3 | C7 | P2 | DI5 | M12 | DI35 | E11 |
| RSTRH | D3 | C8 | M4 | DI6 | L11 | | |

SIGNAL DESCRIPTIONS

The signal descriptions for the SVP are provided in this section. Table 29 below lists the Signal Name, the number of pins of that signal type, whether it is an input or output, and a short pin function description.

TABLE 29

| Signal Name | # Pins | I/O | Description |
|---|---|---|---|
| | | | Global signals: |
| RESET | 1 | I | Processor Reset - Resets all internal pipeline latches and control |

TABLE 29-continued

| Signal Name | # Pins | I/O | Description |
|---|---|---|---|
| | | | circuitry of the PEs as well as DIR and DOR circuits. |
| PCK | 1 | I | Processor Clock - Main clock for the PEs and their control circuitry. |
| GO | 1 | O | Global Output - Wire-OR'ed signal from all 1024 PEs controlled by software instructions. |
| | | | Address Lines: |
| RF0A6-RF0A0 | 7 | I | 7 bit address for the 128 bits of RAM in RF0 and the 40 bits of the DIR. |
| RF1A6-RF1A0 | 7 | I | 7 bit address for the 128 bits of RAM in RF1 and the 24 bits of the DOR. |
| | | | PE Control Lines: |
| C0-C1 | 2 | I | 2 bit control selects data source for RF0/DIR. |
| C2 | 1 | I | 1 bit control selects between RF0 and DIR for memory operation. |
| C3-C4 | 2 | I | 2 bit control selects data source for RF1/DOR |
| C5 | 1 | I | 1 bit control selects between RF1 and DOR for memory operation. |
| C6-C8 | 3 | I | 3 bit control selects data source for near-neighbor communications. |
| C9-C11 | 3 | I | 3 bit control selects data source for Working Register C. |
| C12-C14 | 3 | I | 3 bit control selects data source for Working Register B. |
| C15-C17 | 3 | I | 3 bit control selects data source for Working Register A. |
| C18-C20 | 3 | I | 3 bit control selects data source for Working Register M. |
| C21 | 1 | I | 1 bit control selects Conditional Instruction mode for PEs. |
| C22-C23 | 2 | I | 2 bit control selects instruction mode for PEs as Single/Double/Wait-stated Single or Idle mode. |
| | | | Cascading signals: |
| CC0L-CC1L | 2 | I | 8 lines allow multiple SVP devices to be cascaded to provide multiples of 1024 PEs to operate in parallel with continuous near-neighbor communications. |
| CC2L-CC3L | 2 | O | |
| CC0R-CC1R | 2 | O | |
| CC2R-CC3R | 2 | I | |
| | | | Data Input Register signals: |
| SWCK | 1 | I | Serial Write Clock - DIR write clock. |
| RSTWH | 1 | I | Reset Write - Synchronous Reset signal for DIR. |
| WE | 1 | I | Write Enable - Synchronous write enable for DIR. |
| DI0-DI39 | 40 | I | Data Inputs - Parallel data inputs to DIR. |
| | | | Data Output Register signals: |
| SRCK | 1 | I | Serial Read Clock - DOR read clock. |
| RSTRH | 1 | I | Reset Read - Synchronous Reset signal for DOR. |
| RE | 1 | I | Read Enable - Synchronous read enable for DOR. |
| DO0-DO23 | 24 | O | Data Outputs - Parallel data outputs from DOR. |
| Vdd | 12 | I | Power - 5 volt supply |
| Vss | 13 | — | Ground |
| TEST1-TEST3 | 3 | NC | Factory Test signals - leave open. |

INSTRUCTION SET SUMMARY

The following sections list some legal sub-instruction mnemonics. Higher level instructions may be created from these primitives. The value to the left of the assignment operator '=' in the listing is the Destination operand while to right is the Source Operand:

<Destination-operand> = <Source-operand>

Abbreviations are used to reduce typing and some synonyms are used to reduce confusion when entering mnemonics:

| Logical Reference | | Physical Reference | | Description | Address Range |
|---|---|---|---|---|---|
| R0 (n) | ---> | RF0(n) | ---> | Register File 0, address n; | 0 <= n <= 127 |
| R1(p) | ---> | RF1(p) | ---> | Register File 1, address p; | 0 <= p <= 127 |
| INP(m) | ---> | DIR(m) | ---> | Data Input Register, address m; | 0 <= m <= 39 |
| OUT(q) | ---> | DOR(q) | ---> | Data Output Register, address q; | 0 <= q <= 23 |
| M | ---> | WRM | ---> | working Register M | |
| A | ---> | WRA | ---> | working Register A | |
| B | ---> | WRB | ---> | working Register B | |
| C | ---> | WRC | ---> | working Register C | |

Sub-instructions whose data source depends on the value of WRM (that is, M-dependent sub-instructions) show three lines. The first line shows the sub-instruction entered into the program, while the second and third lines show the operational result depending whether (WRM)=0 or (WRM)=1, respectively. '(WRM)' is the contents of working Register WRM.

For example:

| | | | |
|---|---|---|---|
| R0(n) = XR0(n) | | | <---- Entered on assembly line |
| = RR0(n) | ; (WRM)=0 | | <---- Source of data if (WRM)=0 |
| = LR0(n) | ; (WRM)=1 | | <---- Source of data if (WRM)=1 |

The instructions are grouped into 8 categories: RF0, RF1, WRA, WRB, WRC, WRM, ALU, and GO. Some instructions appear in more than one category for completeness.

| Mnemonic<br><DEST> = <SRC> | Condition | Operation |
|---|---|---|
| REGISTER FILE RF0/DATA INPUT REGISTER | | |
| STORE sub-instructions | | |
| R0(n) = C | | (WRC) into RF0(n) |
| R0(n) = SM | | ALU Sum into RF0(n) |

-continued

| Mnemonic<br><DEST> = <SRC> | Condition | Operation |
|---|---|---|
| R0(n) = M | | (WRM) into RF0(n) |
| INP(m) = C | | (WRC) into DIR(m) |
| INP(m) = SM | | ALU Sum into DIR(m) |
| INP(m) = M | | (WRM) into DIR(m) |
| R0(n) = 0 | | Logical 0 into RF0(n) |
| INP(m) = 0 | | Logical 0 into DIR(m) |
| M-dependent STORE sub-instructions | | |
| R0(n) = XB | | |
| = RB | ; (WRM)=0 | Right (WRB) into RF0(n) |
| = LB | ; (WRM)=1 | Left (WRB) into RF0(n) |
| INP(m) = XB | | |
| = RB | ; (WRM)=0 | Right (WRB) into DIR(m) |
| = LB | ; (WRM)=1 | Left (WRB) into DIR(m) |
| R0(n) = X2B | | |
| = R2B | ; (WRM)=0 | 2nd Right (WRB) into RF0(n) |
| = L2B | ; (WRM)=1 | 2nd Left (WRB) into RF0(n) |
| INP(m) = X2B | | |
| = R2B | ; (WRM)=0 | 2nd Right (WRB) into DIR(m) |
| = L2B | ; (WRM)=1 | 2nd Left (WRB) into DIR(m) |
| M-dependent MOVE sub-instructions | | |
| R0(n) = XR0(n) | | |
| = RR0(n) | ; (WRM)=0 | Right RF0(n) into RF0(n) |
| = LR0(n) | ; (WRM)=1 | Left RF0(n) into RF0(n) |
| INP(m) = XINP(m) | | |
| = RINP(m) | ; (WRM)=0 | Right DIR(m) into DIR(m) |
| = LINP(m) | ; (WRM)=1 | Left DIR(m) into DIR(m) |
| R0(n) = XR1(p) | | |
| = RR1(p) | ; (WRM)=0 | Right RF1(p) into RF0(n) |
| = LR1(p) | ; (WRM)=1 | Left RF1(p) into RF0(n) |
| R0(n) = XOUT(q) | | |
| = ROUT(q) | ; (WRM)=0 | Right DOR(q) into RF0(n) |
| = LOUT(q) | ; (WRM)=1 | Left DOR(q) into RF0(n) |
| INP(m) = XR1 | | |
| = RR1(p) | ; (WRM)=0 | Right RF1(p) into DIR(m) |
| = LR1(p) | ; (WRM)=1 | Left RF1(p) into DIR(m) |
| INP(m) = XOUT(q) | | |
| = ROUT(q) | ; (WRM)=0 | Right DOR(q) into DIR(m) |
| = LOUT(q) | ; (WRM)=1 | Left DOR(q) into DIR(m) |
| R0(n) = X2R0(n) | | |
| = R2R0(n) | ; (WRM)=0 | 2nd Right RF0(n) into RF0(n) |
| = L2R0(n) | ; (WRM)=1 | 2nd Left RF0(n) into RF0(n) |
| INP(m) = X2INP(m) | | |
| = R2INP(m) | ; (WRM)=0 | 2nd Right DIR(m) into DIR(m) |
| = L2INP(m) | ; (WRM)=1 | 2nd Left DIR(m) into DIR(m) |
| R0(n) = XX2R1(p) | | |
| = R2R1(p) | ; (WRM)=0 | 2nd Right RF1(p) into RF0(n) |
| = L2R1(p) | ; (WRM)=1 | 2nd Left RF1(p) into RF0(n) |
| R0(n) = X2OUT(q) | | |
| = R2OUT(q) | ; (WRM)=0 | 2nd Right DOR(q) into RF0(n) |
| = L2OUT(q) | ; (WRM)=1 | 2nd Left DOR(q) into RF0(n) |
| INP(m) = X2R1(p) | | |
| = R2R1(p) | ; (WRM)=0 | 2nd Right RF1(p) into DIR(m) |
| = L2R1(p) | ; (WRM)=1 | 2nd Left RF1(p) into DIR(m) |
| INP(m) = X2OUT(q) | | |
| = R2OUT(q) | ; (WRM)=0 | 2nd Right DOR(q) into DIR(m) |
| = L2OUT(q) | ; (WRM)=1 | 2nd Left DOR(q) into DIR(m) |
| READ sub-instructions | | |
| R0(n) = R0(n) | | NO-OP or read RF0(n) |
| INP(m) = INP(m) | | NO-OP or read DIR(m) |
| REGISTER FILE RF1/DATA OUTPUT REGISTER | | |
| STORE sub-instructions | | |
| R1(p) = C | | (WRC) into RF1(p) |
| R1(p) = SM | | ALU Sum into RF1 (p) |
| R1(p) = CY | | ALU Carry into RF1(p) |
| OUT(q) = C | | (WRC) into DOR(q) |
| OUT(q) = SM | | ALU Sum into DOR(q) |
| OUT(q) = CY | | ALU Carry into DOR(q) |
| M-dependent STORE sub-instructions | | |
| R1(p) = KCY | | |
| = R1(p) | ; (WRM)=0 | NO-OP or read RF1(p) |
| = CY | ; (WRM)=1 | ALU Carry into RF1(p) |
| OUT(q) = KCY | | |
| = OUT(q) | ; (WRM)=0 | NO-OP or read RF DOR(q) |
| = CY | ; (WRM)=1 | ALU Carry into RF DOR(q) |
| READ sub-instructions | | |
| R1(p) = R1(p) | | NO-OP or read(p) |
| OUT(q) = OUT(q) | | NO-OP or read(q) |
| WORKING REGISTER WRA | | |

-continued

| Mnemonic <DEST> = <SRC> | Condition | Operation |
|---|---|---|
| LOAD sub-instructions | | |
| A = 0 | | Logical 0 into WRA |
| A = 1 | | Logical 1 into WRA |
| A = A | | NO-OP |
| A = C | | (WRC) into WRA |
| LOAD sub-instructions | | |
| A = R0(n) | | RF0(n) into WRA |
| A = INP(m) | | DIR(m) into WRA |
| A = R1(p) | | RF1(p) into WRA |
| A = OUT(q) | | DOR(q) into WRA |
| LOAD from left Processor Element (PE) into WRA: out into right PEs WRA | | |
| A = LR0(n) | | Left RF0(n) into WRA |
| A = LINP(n) | | Left DIR(m) into WRA |
| A = LR1(p) | | Left RF1(p) into WRA |
| A = LOUT(q) | | Left DOR(q) into WRA |
| A = LB | | Left (WRB) into WRA |
| LOAD from second left PE into WRA: out into second right PEs WRA | | |
| A = L2R0(n) | | 2nd Left RF0(n) into WRA |
| A = L2INP(m) | | 2nd Left DIR(m) into WRA |
| A = L2R1(p) | | 2nd Left RF1(p) into WRA |
| A = L2ROUT(q) | | 2nd Left DOR(q) into WRA |
| A = L2B | | 2nd Left (WRB) into WRA |
| LOAD from right PE into WRA: out into left PEs WRA | | |
| A = RR0(n) | | Right RF0(n) into WRA |
| A = RINP(m) | | Right DIR(m) into WRA |
| A = RR1(p) | | Right RF1(p) into WRA |
| A = ROUT(q) | | Right DOR(q) into WRA |
| A = RB | | Right (WRB) into WRA |
| LOAD from second right PE into WRA: out into second left PEs WRA | | |
| A = R2R0(n) | | 2nd Right RF0(n) into WRA |
| A = R2INP(m) | | 2nd Right DIR(m) into WRA |
| A = R2R1(p) | | 2nd Right RF1(p) into WRA |
| A = R2OUT(q) | | 2nd Right DOR(q) into WRA |
| A = R2B | | 2nd Right (WRB) into WRA |
| WORKING REGISTER WRB | | |
| LOBD sub-instructions | | |
| B = 0 | | Logical 0 into WRB |
| B = 1 | | Logical 1 into WRB |
| B = B | | NO-OP |
| B = C | | (WRC) into WRB |
| LOAD sub-instructions | | |
| B = R0(n) | | RF0(n) into WRB |
| B = INP(m) | | DIR(m) into WRB |
| B = R1(p) | | RF1(p) into WRB |
| B = OUT(q) | | DOR(q) into WRB |
| LOAD from left PE into WRB: out into right PEs WRB | | |
| B = LR0(n) | | Left RF0(n) into WRB |
| B = LINP(n) | | Left DIR(m) into WRB |
| B = LR1(p) | | Left RF1(p) into WRB |
| B = LOUT(q) | | Left DOR(q) into WRB |
| B = LB | | Left (WRB) into WRB |
| LOAD from second left PE into WRB: out into second right PEs WRB | | |
| B = L2R0(n) | | 2nd Left RF0(n) into WRB |
| B = L2INP(m) | | 2nd Left DIR(m) into WRB |
| B = L2R1(p) | | 2nd Left RF1(p) into WRB |
| B = L2ROUT(q) | | 2nd Left DOR(q) into WRB |
| B = L2B | | 2nd Left (WRB) into WRB |
| LOAD from right PE into WRB: out into left PEs WRB | | |
| B = RR0(n) | | Right RF0(n) into WRB |
| B = RINP(m) | | Right DIR(m) into WRB |
| B = RR1(p) | | Right RF1(p) into WRB |
| B = ROUT(q) | | Right DOR(q) into WRB |
| B = RB | | Right (WRB) into WRB |
| LOAD from second right PE into WRB: out into second left PEs WRB | | |
| B = R2R0(n) | | 2nd Right RF0(n) into WRB |
| B = R2INP(m) | | 2nd Right DIR(m) into WRB |
| B = R2R1(p) | | 2nd Right RF1(p) into WRB |
| B = R2OUT(q) | | 2nd Right DOR(q) into WRB |
| B = R2B | | 2nd Right (WRB) into WRB |
| WORKING REGISTER WRC | | |
| LOAD sub-instructions | | |
| C = 0 | | Logical 0 into WRC |
| C = 1 | | Logical 1 into WRC |
| C = C | | NO-OP |
| C = A | | (WRC) into WRC |
| C = CY | | ALU Carry into WRC |

-continued

| Mnemonic <DEST> = <SRC> | Condition | Operation |
|---|---|---|
| C = BW | | ALU Borrow into WRC |
| LOAD sub-instructions | | |
| C = R0(n) | | RF0(n) into WRC |
| C = INP(m) | | DIR(m) into WRC |
| C = R1(p) | | RF1(p) into WRC |
| C = OUT(q) | | DOR(q) into WRC |
| STORE sub-instructions | | |
| R0(n) = C | | (WRC) into RF0(n) |
| INP(m) = C | | (WRC) into DIR(m) |
| R1(p) = C | | (WRC) into RF1(p) |
| OUT(q) = C | | (WRC) into DOR(q) |
| M-dependent LOAD sub-instructions | | |
| C = KCB | | |
| = BW | ; (WRM)=0 | ALU Carry into WRC |
| = CY | ; (WRM)=1 | ALU Borrow into WRC |
| WORKING REGISTER WRM | | |
| LOAD sub-instructions | | |
| M = 0 | | Logical 0 into WRM |
| M = 1 | | Logical 1 into WRM |
| M = C | | (WRC) into WRM |
| M = M | | NO-OP |
| LOAD GLOBAL VARIABLE sub-instructions | | |
| M = AUXi(j) | | (Aux Reg i, bit k) into WRM |
| M = AUX(h) | | (Aux Reg bit h) into WRM |
| LOAD sub-instructions | | |
| M = R0(n) | | RF0(n) into WRM |
| M = INP(m) | | DIR(m) into WRM |
| M = R1(p) | | RF1(p) into WRM |
| M = OUT(q) | | DOR(q) into WRM |
| LOAD from left PE into WRM: out into right PE's WRM | | |
| M = LR0(n) | | Left RF0(n) into WRM |
| M = LINP(m) | | Left DIR(m) into WRM |
| M = LR1(p) | | Left RF1(p) into WRM |
| M = LOUT(q) | | Left DOR(q) into WRM |
| M = LB | | Left (WRB) into WRM |
| LOAD from second left PE into WRM: out into second right Pe's WRM | | |
| M = L2R0(n) | | 2nd Left RF0(n) into WRM |
| M = L2INP(m) | | 2nd Left DIR(m) into WRM |
| M = L2R1(p) | | 2nd Left RF1(p) into WRM |
| M = L2OUT(q) | | 2nd Left DOR(q) into WRM |
| M = L2B | | 2nd Left (WRB) into WRM |
| LOAD from right PE into WRM: out into left PE's WRM | | |
| M = RR0(n) | | Right RF0(n) into WRM |
| M = RINP(m) | | Right DIR(m) into WRM |
| M = RR1(p) | | Right RF1(p) into WRM |
| M = ROUT(q) | | Right DOR(q) into WRM |
| M = RB | | Right (WRB) into WRM |
| LOAD sub-instructions | | |
| M = R2R0(n) | | 2nd Right RF0(n) into WRM |
| M = R2INP(m) | | 2nd Right DIR(m) into WRM |
| M = R2R1(p) | | 2nd Right RF1(p) into WRM |
| M = R2OUT(q) | | 2nd Right DOR(q) into WRM |
| M = R2B | | 2nd Right (WRB) into WRM |
| STORE sub-instructions | | |
| R0(n) = M | | (WRM) into RF0(n) |
| INP(m) = M | | (WRM) into DIR(m) |
| GLOBAL OUTPUT | | |
| OUT sub-instructions | | |
| GO = 0 | | Logical 0 into GO |
| GO = B | | (WRB) into GO |
| GO = R0(n) | | RF0(n) into GO |
| GO = INP(m) | | DIR(m) into GO |
| GO = R1(p) | | RF1(p) into GO |
| GO = OUT(q) | | DOR(q) into GO |
| ARITHMETIC LOGIC UNIT (ALU) | | |
| STORE sub-instructions | | |
| R0(n) = SM | | ALU Sum into RF0(n) |
| INP(m) = SM | | ALU Sum into DIR(m) |
| R1(p) = SM | | ALU Sum into RF1(p) |
| OUT(q) = SM | | ALU Sum into DOR(q) |
| R1(p) = CY | | ALU Carry into RF1(p) |
| OUT(q) = CY | | ALU Carry into DOR(q) |
| LOAD sub-instructions | | |
| C = CY | | ALU Carry into WRC |
| C = BW | | ALU Borrow into WRC |

-continued

| Mnemonic <DEST> = <SRC> | | Condition | Operation |
|---|---|---|---|
| M-dependent STORE sub-instructions | | | |
| R1(p) = | KCY | | |
|  = | R1(p) | ; (WRM)=0 | NO-OP or read RF1(p) |
|  = | CY | ; (WRM)=1 | ALU Carry into RF1(p) |
| OUT(q) = | KCY | | |
|  = | OUT(q) | ; (WRM)=0 | NO-OP or read DOR(q) |
|  = | CY | ; (WRM)=1 | ALU Carry into DOR(q) |
| M-dependent LOAD sub-instructions | | | |
| C = | KCB | | |
|  = | BW | ; (WRM)=0 | ALU Carry into WRC |
|  = | CY | ; (WRM)=1 | ALU Borrow into WRC |

SVP ARRAY INSTRUCTION SET FOR INSTRUCTION PROGRAM MEMORY 1258, FIG. 34

The following tables list all of the legal SVP array sub-instructions. Also listed are the opcodes and conflict masks for each sub-instruction. The conflict mask is used by the assembler to determine if two sub-instructions on the same line can be combined.

All of the foregoing instructions are described by the 22-bit Array Opcode field plus the address fields. Variations of these instructions and IG controller instructions are described in these and other bits.

In the tables below, the following abbreviations are used:

| | |
|---|---|
| x - don't care | |
| b - Break Point bit, | b = 1: BP set at immediate address |
| | b = 0: no BP at immediate address |
| r - 2's complement of Repeat Count, | $0 <= r <= 15$ |
| m - R0 memory address value, | $0 <= m <= 127$ |
| n - DIR address value, | $0 <= n <= 39$ |
| p - R1 memory address value, | $0 <= p <= 127$ |
| q - DOR address value, | $0 <= q <= 23$ |
| k - Auxiliary Register address value, | $64 <= k <= 95$ |
| z - Instruction Mode (see Appendix C) | |

```
                                                                1-bit Break Point flag
                                                                4-bit Repeat Count
                                                                7-bit Reg File R1 address
                                                                7-bit Reg File R0 address
                                                                3-bit Instruction Mode
                                             22-bit
                      B  R  R  I              Array
         Mnemonic     P  C  1  0  M           Opcode    Operation
                      4  3  3  2  2       0   44 bit word from Instruction Generator
                      3  9  2  5  2   1 - -  0
```

| | <DEST> | = | <SRC> | B P | R C | R 1 | R 0 | I M | | Array Opcode | Operation |
|---|---|---|---|---|---|---|---|---|---|---|---|
| RF0 Sub-instructions: | | | | | | | | | | | |
| | R0(n) | = | R0(n) | b | r | x | n | z | | 00000000 | NO-OP or read RF0(n) |
| | INP(m) | = | INP(m) | b | r | x | m | z | | 00000004 | NO-OP or read DIR(m) |
| | R0(n) | = | C | b | r | x | n | z | | 00000001 | (WRC) into RF0(n) |
| | R0(n) | = | SM | b | r | x | n | z | | 00000002 | ALU Sum into RF0(n) |
| | R0(n) | = | M | b | r | x | n | z | | 00000003 | (WRM) into RF0(n) |
| | INP(m) | = | C | b | r | x | m | z | | 00000005 | (WRC) into DIR(m) |
| | INP(m) | = | SM | b | r | x | m | z | | 00000006 | ALU Sum into DIR(m) |
| | INP(m) | = | M | b | r | x | m | z | | 00000007 | (WRM) into DIR(m) |
| | R0(n) | = | O | b | r | x | n | x | | 10000001 | Logical 0 into RF0(n) |
| | INP(m) | = | O | b | r | x | m | x | | 10000005 | Logical 0 into DIR(m) |
| | R0(n) | = | XR0(n) | b | r | x | n | x | | 10000101 | |
| |  | = | RR0(n) | ; | | | | | | (WRM)=0 | Right RF0(n) into RFC(n) |
| |  | = | LR0(n) | ; | | | | | | (WRM)=1 | Left RFP(n) into RF0(n) |
| | INP(m) | = | XINP(m) | b | r | x | m | x | | 10000105 | |
| |  | = | RINP(m) | ; | | | | | | (WRM)=0 | Right DIR(m) into DIR(m) |
| |  | = | LINP(m) | ; | | | | | | (WRM)=1 | Left DIR(m) into DIR(m) |
| | R0(n) | = | XR1(p) | b | r | p | n | x | | 10000201 | |
| |  | = | RR1(p) | ; | | | | | | (WRM)=0 | Right RF1(p) into RF0(n) |
| | Ro(n) | = | XOUT(q) | b | r | q | n | x | | 10000241 | |
| |  | = | ROUT(q) | ; | | | | | | (WRM)=0 | Right DOR(q) into RF0(n) |
| |  | = | LOUT(q) | ; | | | | | | (WRM)=1 | Left DOR(q) into RF0(n) |
| | INP(m) | = | XR1(p) | b | r | p | m | x | | 10000205 | |
| |  | = | RR1(p) | ; | | | | | | (WRM)=0 | Right RF1(p) into DIR(m) |
| |  | = | LR1(p) | ; | | | | | | (WRM)=1 | Left RF1(p) into DIR(m) |
| | INP(m) | = | XOUT(q) | b | r | q | m | x | | 10000245 | |
| |  | = | ROUT(q) | ; | | | | | | (WRM)=0 | Right DOR(q) into DIR(m) |
| |  | = | LOUT(q) | ; | | | | | | (WRM)=1 | Left DOR(q) into DIR(m) |
| | R0(n) | = | XB | b | r | x | n | x | | 10000301 | |
| |  | = | RB | ; | | | | | | (WRM)=0 | Right (WRB) into RF0(n) |
| |  | = | LB | ; | | | | | | (WRM)=1 | Left (WRB) into RF0(n) |

| <DEST> = <SRC> | Operand/Opcode | Operation |
|---|---|---|

-continued

```
RF0 Sub-instructions:
   INP(m) = XB        b  r  x  m  x  10000305
          = RB        b  r     (WRM)=0              Right (WRB) into DIR(m)
          = LB        ;        (WRM)=1              Left (WRB) into DIR(m)
   R0(n)  = X2R0(n)   b  r  x  n  x  10000501
          = R2R0(n)   ;        (WRM)=0              2nd Right RF0(n) into RF0(n)
          = L2R0(n)   ;        (WRM)=1              2nd Left RF0(n) into RF0(n)
   INP(m) = X2INP(m)  b  r  x  m  x  10000505
          = R2INP(m)  ;        (WRM)=0              2nd Right DIR(m) into DIR(m)
          = L2INP(m)  ;        (WRM)=1              2nd Left DIR(m) into DIR(m)
          = LR1(p)    ;        (WRM)=1              Left RF1(p) into RF0(n)
   R0(n)  = X2R1(p)   b  r  p  n  x  10000601
          = R2R1(p)   ;        (WRM)=0              2nd Right RF1(p) into RF0(n)
          = L2R1(p)   ;        (WRM)=1              2nd Left RF1(p) into RF0(n)
   R0(n)  = X2OUT(q)  b  r  q  n  x  10000641
          = R2OUT(q)  ;        (WRM)=0              2nd Right DOR(q) into RF0(n)
          = L2OUT(q)  ;        (WRM)=1              2nd Left DOR(q) into RF0(n)
   INP(m) = X2R1(p)   b  r  p  m  x  10000605
          = R2R1(p)   ;        (WRM)=0              2nd Right RF1(p) into DIR(m)
          = L2R1(p)   ;        (WRM)=1              2nd Left RF1(p) into DIR(m)
   INP(m) = X2OUT(q)  b  r  q  m  x  10000645
          = R2OUT(q)  ;        (WRM)=0              2nd Right DOR(q) into DIR(m)
          = L2OUT(q)  ;        (WRM)=1              2nd Left DOR(q) into DIR(m)
   R0(n)  = X2B       b  r  x  n  x  10000701
          = R2B       ;        (WRM)=0              2nd Right (WRB) into RF0(n)
          = L2B       ;        (WRM)=1              2nd Left (WRB) into RF0(n)
   INP(m) = X2B       b  r  x  m  x  10000705
          = R2B       ;        (WRM)=0              2nd Right (WRB) into DIR(m)
          = L2B       ;        (WRM)=1              2nd Left (WRB) into DIR(m)

RF1 Sub-instructions:
   R1(p)  = R1(p)     b  r  p  x  z  00000000       NO-OP or read(p)
   OUT(q) = OUT(q)    b  r  q  x  z  00000040       NO-OP or read DOR(q)
   R1(p)  = C         b  r  p  x  z  00000010       (WRC) into RF1(p)
   R1(p)  = SM        b  r  p  x  z  00000020       ALU Sum into RF1(p)
   R1(p)  = CY        b  r  p  x  z  00000030       ALU Carry into RF1(p)
   OUT(q) = C         b  r  q  x  z  00000050       (WRC) into DOR(q)
   OUT(q) = SM        b  r  q  x  z  00000060       ALU Sum into DOR(q)
   OUT(q) = CY        b  r  q  x  z  00000070       ALU Carry into DOR(q)
   R1(p)  = KCY       b  r  p  x  x  10000030       Conditional CY Write
          = R1(p)     ;        (WRM)=0              NO-OP or read RF1(p)
          = CY        ;        (WRM)=1              ALU Carry into RF1(p)
   OUT(q) = KCY       b  r  q  x  x  10000070       Conditional CY Write
          = OUT(q)    ;        (WRM)=0              NO-OP or read DOR(q)
          = CY        ;        (WRM)=1              ALU Carry into DOR(q)

WRA Sub-instructions:
   A = 0              b  r  x  x  z  00600000       Logical 0 into WRA
   A = 1              b  r  x  x  z  00700000       (WRB) into WRA
   A = A              b  r  x  x  z  00000000       NO-OP
   A = C              b  r  x  x  z  00500000       (WRC) into WRA
   A = R0(n)          b  r  x  n  z  00100000       RF0(n) into WRA
   A = INP(m)         b  r  x  m  z  00100004       DIR(m) into WRA
   A = R1(p)          b  r  p  x  z  00200000       RF1(p) into WRA
   A = OUT(q)         b  r  q  x  z  00200040       DOR(q) into WRA
   A = LR0(n)         b  r  x  n  z  00400100       Left RF0(n) into WRA
   A = LINP(n)        b  r  x  m  z  00400104       Left DIR(m) into WRA
   A = LR1(p)         b  r  p  x  z  00400200       Left RF1(p) into WRA
   A = LOUT(q)        b  r  q  x  z  00400240       Left DOR(q) into WRA
   A = LB             b  r  x  x  z  00400300       Left (WRB) into WRA
   A = L2R0(n)        b  r  x  n  z  00400500       2nd Left RF0(n) into WRA
   A = L2INP(m)       b  r  x  m  z  00400504       2nd Left DIR(m) into WRA
   A = L2R1(p)        b  r  p  x  z  00400600       2nd Left RF1(p) into WRA
   A = L2OUT(q)       b  r  q  x  z  00400640       2nd Left DOR(q) into WRA
   A = L2B            b  r  x  x  z  00400700       2nd Left (WRB) into WRA
   A = RR0(n)         b  r  x  n  z  00300100       Right RF0(n) into WRA
   A = RINP(m)        b  r  x  m  z  00300104       Right DIR(m) into WRA
   A = RR1(p)         b  r  p  x  z  00300200       Right RF1(p) into WRA
   A = ROUT(q)        b  r  q  x  z  00300240       Right DOR(q) into WRA
   A = RB             b  r  x  x  z  00300300       Right (WRB) into WRA
   A = R2R0(n)        b  r  x  n  z  00300500       2nd Right RF0(n) into WRA
   A = R2INP(m)       b  r  x  m  z  00300504       2nd Right DIR(m) into WRA
   A = R2R1(p)        b  r  p  x  z  00300600       2nd Right RF1(p) into WRA
   A = R2OUT(q)       b  r  q  x  z  00300640       2nd Right DOR(q) into WRA
   A = R2B            b  r  x  x  z  00300700       2nd Right (WRB) into WRA WRB Sub-instructions:
   B = 0              b  r  x  x  z  00600000       Logical 0 into WRB
   B = 1              b  r  x  x  z  00070000       WRA into WRB
   B = B              b  r  x  x  z  00000000       NO-OP
   B = C              b  r  x  x  z  00050000       (WRC) into WRB
   B = R0(n)          b  r  x  n  z  00010000       RF0(n) into WRB
   B = INP(m)         b  r  x  m  z  00010004       DIR(m) into WRB
```

-continued

| | | | | | | | | |
|---|---|---|---|---|---|---|---|---|
| B | = | R1(p) | b | r | p | x | z | 00020000 | RF1(p) into WRB |
| B | = | OUT(q) | b | r | q | x | z | 00020040 | RF OUT(q) into WRB |
| B | = | LR0(n) | b | r | x | n | z | 00040100 | Left RF0(n) into WRB |
| B | = | LINP(m) | b | r | x | m | z | 00040104 | Left DIR(m) into WRB |
| B | = | LR1(p) | b | r | p | x | z | 00040200 | Left RF1(p) into WRB |
| B | = | LOUT(q) | b | r | q | x | z | 00040240 | Left DOR(q) into WRB |
| B | = | LB | b | r | x | x | z | 00040300 | Left (WRB) into WRB |
| B | = | L2R0(n) | b | r | x | n | z | 00040500 | 2nd Left RF0(n) into WRB |
| B | = | L2INP(m) | b | r | x | m | z | 00040504 | 2nd Left DIR(m) into WRB |
| B | = | L2R1(p) | b | r | p | x | z | 00040600 | 2nd Left RF1(p) into WRB |
| B | = | L2OUT(q) | b | r | q | x | z | 00040640 | 2nd Left DOR(q) into WRB |
| B | = | L2B | b | r | x | x | z | 00040700 | 2nd Left (WRB) into WRB |
| B | = | RR0(n) | b | r | x | n | z | 00030100 | Right RF0(n) into WRB |
| B | = | RINP(m) | b | r | x | m | z | 00030104 | Right DIR(m) into WRB |
| B | = | RR1(p) | b | r | p | x | z | 00030200 | Right RF1(p) into WRB |
| B | = | ROUT(q) | b | r | q | x | z | 00030240 | Right DOR(q) into WRB |
| B | = | RB | b | r | x | x | z | 00030300 | Right (WRB) into WRB |
| B | = | R2R0(n) | b | r | x | n | z | 00030500 | 2nd Right RF0(n) into WRB |
| B | = | R2INP(m) | b | r | x | m | z | 00030504 | 2nd Right DIR(m) into WRB |
| B | = | R2R1(p) | b | r | p | x | z | 00030600 | 2nd Right RF1(p) into WRB |
| B | = | R2OUT(q) | b | r | q | x | z | 00030640 | 2nd Right DOR(q) into WRB |
| B | = | R2B | b | r | x | x | z | 00030700 | 2nd Right (WRB) into WRB |

WRC Sub-instructions:

| | | | | | | | | |
|---|---|---|---|---|---|---|---|---|
| C | = | 0 | b | r | x | x | z | 00006000 | Logical 0 into WRC |
| C | = | 1 | b | r | x | x | z | 00007000 | Logical 1 into WRC |
| C | = | A | b | r | x | x | z | 00003000 | WRA into WRC |
| C | = | C | b | r | x | x | z | 00000000 | NO-OP |
| C | = | CY | b | r | x | x | z | 00004000 | ALU Carry into WRC |
| C | = | BW | b | r | x | x | z | 00005000 | ALU Borrow into WRC |
| C | = | RF0(n) | b | r | x | n | z | 00001000 | (WRB) into WRC |
| C | = | INP(m) | b | r | x | m | z | 00001004 | DIR(m) into WRC |
| C | = | R1(p) | b | r | p | x | z | 00002000 | RF1(p) into WRC |
| C | = | OUT(q) | b | r | q | x | z | 0002040 | DOR(q) into WRC |
| R0(n) | = | C | b | r | x | n | z | 00000001 | (WRC) into RF0(n) |
| INP(m) | = | C | b | r | x | m | z | 00000005 | (WRC) into DIR(m) |
| R1(p) | = | C | b | r | p | x | z | 00000010 | (WRC) into RF1(p) |
| OUT(q) | = | C | b | r | q | x | z | 00000050 | (WRC) into DOR(q) |
| C | = | KCB | b | r | x | x | x | 10004000 | Conditional CY/BW |
| | = | BW | | | ; | (WRM)=0 | | | ALU Carry into WRC |
| | = | CY | | | ; | (WRM)=0 | | | ALU Borrow into WRC |

WRM Sub-instructions:

| | | | | | | | | |
|---|---|---|---|---|---|---|---|---|
| M | = | 0 | b | r | x | x | z | 06000000 | Logical 0 into WRM |
| M | = | 1 | b | r | x | x | z | 07000000 | Logical 1 into WRM |
| M | = | C | b | r | x | x | z | 05000000 | (WRC) into WRM |
| M | = | M | b | r | x | x | z | 00000000 | NO-OP |
| M | = | AUXi(j) | b | r | k | x | z | 06000040 | AUX REG i bit j into WRM |
| | | | | | ; k = i*8 + j + 64, 0 < = 3, 0 < = j < = 7 | | | | |
| M | = | AUX(j) | b | r | k | x | z | 06000040 | AUX REG bit j into WRM |
| | | | | | ; k = j + 64, 0 < = j < = 31 | | | | |
| M | = | R0(n) | b | r | x | n | z | 01000000 | RF0(n) into WRM |
| M | = | INP(m) | b | r | x | m | z | 01000004 | DIR(m) into WRM |
| M | = | R1(p) | b | r | p | x | z | 02000000 | RF1(p) into WRM |
| M | = | OUT(q) | b | r | q | x | z | 02000040 | DOR(q) into WRM |
| M | = | LR0(n) | b | r | x | n | z | 04000100 | Left RF0(n) into WRM |
| M | = | LINP(m) | b | r | x | m | z | 04000104 | Left DIR(m) into WRM |
| M | = | LR1(p) | b | r | p | x | z | 04000200 | Left RF1(p) into WRM |
| M | = | LOUT(q) | b | r | q | x | z | 04000240 | Left DOR(q) into WRM |
| M | = | LB | b | r | x | x | z | 04000300 | Left (WRB) into WRM |
| M | = | L2R0(n) | b | r | x | n | z | 04000500 | 2nd Left RF0(n) into WRM |
| M | = | L2INP(m) | b | r | x | m | z | 04000504 | 2nd Left DIR(m) into WRM |
| M | = | L2R1(p) | b | r | p | x | z | 04000600 | 2nd Left RF1(p) into WRM |
| M | = | L2OUT(q) | b | r | q | x | z | 04000640 | 2nd Left DOR(q) into WRM |
| M | = | L2B | b | r | x | x | z | 04000700 | 2nd Left (WRB) into WRM |
| M | = | RR0(n) | b | r | x | n | z | 03000100 | Right RF0(n) into WRM |
| M | = | RINP(m) | b | r | x | m | z | 03000104 | Right DIR(m) into WRM |
| M | = | RR1(p) | b | r | p | x | z | 03000200 | Right RF1(p) into WRM |
| M | = | ROUT(q) | b | r | q | x | z | 03000240 | Right DOR(q) into WRM |
| M | = | RB | b | r | x | x | z | 03000300 | Right (WRB) into WRM |
| M | = | R2R0(n) | b | r | x | n | z | 03000500 | 2nd Right RF0(n) into WRM |
| M | = | R2INP(m) | b | r | x | m | z | 03000504 | 2nd Right DIR(m) into WRM |
| M | = | R2R1(p) | b | r | p | x | z | 03000600 | 2nd Right RF1(p) into WRM |
| M | = | R2OUT(q) | b | r | q | x | z | 03000640 | 2nd Right DOR(q) into WRM |
| M | = | R2B | b | r | x | x | z | 03000700 | 2nd Right (WRB) into WRM |
| R0(n) | = | M | b | r | x | n | z | 00000003 | WR(WRM) into RF0(n) |
| INP(m) | = | M | b | r | x | m | z | 00000007 | WR(WRM) into DIR(m) |

ALU Sub-instructions:

| | | | | | | | | |
|---|---|---|---|---|---|---|---|---|
| R0(n) | = | SM | b | r | x | n | z | 00000002 | ALU Sum into RF0(n) |
| INP(m) | = | SM | b | r | x | m | z | 00000006 | ALU Sum into DIR(m) |
| R1(p) | = | SM | b | r | p | x | z | 00000020 | ALU Sum into RF1(p) |

-continued

| | | | | | | | |
|---|---|---|---|---|---|---|---|
| OUT(q) = SM | b | r | q | x | z | 00000060 | ALU Sum into DOR(q) |
| R1(p) = CY | b | r | p | x | z | 00000030 | ALU Carry into RF1(p) |
| OUT(q) = CY | b | r | q | x | z | 00000070 | ALU Carry into DOR(q) |
| C = CY | b | r | x | x | z | 00004000 | ALU Carry into WRC |
| C = BW | b | r | x | x | z | 00005000 | ALU Borrow into WRC |
| R1(p) = KCY | b | r | p | x | x | 10000030 | |
| = R1(p) | ; | | (WRM)=0 | | | | NO-OP or read RF1(p) |
| = CY | ; | | (WRM)=1 | | | | ALU Carry into RF1(p) |
| OUT(q) = KCY | b | r | q | x | x | 10000070 | |
| = OUT(q) | ; | | (WRM)=0 | | | | NO-OP or read DOR(q) |
| = CY | ; | | (WRM)=1 | | | | ALU Carry into DOR(q) |
| C = KCB | b | r | x | x | x | 10004000 | |
| = BW | ; | | (WRM)=0 | | | | ALU Carry into WRC |
| = CY | ; | | (WRM)=1 | | | | ALU Borrow into WRC |

GO Sub-instructions:

| | | | | | | | |
|---|---|---|---|---|---|---|---|
| GO = 0 | b | r | x | x | z | 00000000 | Logical 0 to GO |
| GO = B | b | r | x | x | z | 00000300 | (WRB) to GO |
| GO = R0(n) | b | r | x | n | z | 00000100 | RF0(n) to GO |
| GO = INP(m) | b | r | x | m | z | 00000104 | DIR(m) to GO |
| GO = R1(p) | b | r | p | x | z | 00000200 | RF1(p) to GO |
| GO = OUT(q) | b | r | q | x | z | 00000240 | DOR(q) to GO |

SVP INSTRUCTION GENERATOR INSTRUCTION SET

The following table lists all of the legal instruction mnemonics and their opcodes for the Instruction Generator plus the variations on the array instructions of for single, wait-stated single, and double instructions.

LEGEND FOR THE IG INSTRUCTIONS:

x - don't care
b - break point bit
rrrr - 4-bit repeat count value in 2's complement form
ppppppp - 7-bit memory address for RF1 or DOR or AUX

LEGEND FOR THE IG INSTRUCTIONS: -continued nnnnnnn - 7-bit memory address for RF0 or DIR
ii..i iii iii - Array instruction opcode from Appendix B.
00..0 - all bits in the field are zero
vvvvv - 5-bit value from the IG Mode Input Pins
aaaa aaaaaaa - 11-bit jump address
cccc cc00000 - 11-bit jump address in which 5 LSB's = 00000
mmmmm mm - 6-bit rotation modulus divided by 2. Therefore, rotation modulus must be an integer multiple of 2. Valid values:
$0 <= mmmmmm <= 63$
zzzzz - 5-bit rotation step value divided by 4. Therefore, rotation step value must be an integer multiple of 4. Valid values: $0 <= zzzzz <= 31$

IG INSTRUCTION OPCODES:

| Mnemonic | | | 44-bit Opcode | | | | | |
|---|---|---|---|---|---|---|---|---|
| | | 43 | 39 | 32 | 25 | 22 | 2..0 16 | 03 | 00 |

Array Instructions: (For list see Appendix B)

| | | | | | | | | |
|---|---|---|---|---|---|---|---|---|
| Single | b | rrrr | ppppppp | nnnnnnn | 000 | ii..i | iii | iii |
| Wait stated Single | b | rrrr | ppppppp | nnnnnnn | 001 | ii..i | iii | iii |
| Double | b | rrrr | ppppppp | nnnnnnn | 010 | ii..i | iii | iii |
| Idle | b | rrrr | xxxxxxx | xxxxxxx | 011 | xx..x | xxx | xxx |

JUMP INSTRUCTIONS:

| | | | | | | | | |
|---|---|---|---|---|---|---|---|---|
| JMP <adr1> | b | aaaa | aaaaaaa | xxxxx00 | 100 | 00..0 | 000 | 000 |
| JME <adr1>,<val> | b | aaaa | aaaaaaa | vvvvv00 | 100 | 00..0 | 000 | 100 |
| JMT <adr2> | b | cccc | cc00000 | xxxxxxx | 100 | 00..0 | 100 | x00 |

FLAG TEST INSTRUCTIONS:

| | | | | | | | | |
|---|---|---|---|---|---|---|---|---|
| JFAZ <adr1> | b | aaaa | aaaaaaa | xxxxx01 | 100 | 00..0 | 000 | 000 |
| JFBZ <adr1> | b | aaaa | aaaaaaa | xxxxx10 | 100 | 00..0 | 000 | 000 |

CALL/RETURN INSTRUCTIONS:

| | | | | | | | | |
|---|---|---|---|---|---|---|---|---|
| CALL <adr1> | b | aaaa | aaaaaaa | xxxxxxx | 101 | 00..0 | 000 | x00 |
| RET | b | xxxx | xxxxxxx | xxxxxxx | 101 | 00..0 | 100 | x00 |

MODE REGISTER INSTRUCTIONS:

| | | | | | | | | |
|---|---|---|---|---|---|---|---|---|
| UMR | b | xxxx | xxxxxxx | xxxxxxx | 110 | 00..0 | 000 | x00 |

GLOBAL ROTATION INSTRUCTIONS:

| | | | | | | | | |
|---|---|---|---|---|---|---|---|---|
| LRM0 <mod>,<rot> | b | mmmm | mmzzzzz | xxxxx00 | 110 | 00..0 | 100 | x00 |
| LRM1 <mod>,<rot> | b | mmmm | mmzzzzz | xxxxx01 | 110 | 00..0 | 100 | x00 |
| GRL0 | b | xxxx | xxxxxxx | xxxxx10 | 110 | 00..0 | 100 | x00 |
| GRL1 | b | xxxx | xxxxxxx | xxxxx11 | 110 | 00..0 | 100 | x00 |

The function of the IG instructions listed in the opcode table above are explained below.

ARRAY INSTRUCTIONS:

Single
wait stated Single
Double
Idle

JUMP INSTRUCTIONS:

-continued

| | |
|---|---|
| JMP <adr1> | Unconditional Jump to address <adr1>. |
| JME <val>,<adr1> | JUMP on MODE EQUAL. Jump to <adr1> if <val> = <(mode register)>, else go to next statement. |
| JMT <adr2> | JUMP to MODE TABLE. Jump to mode table at <adr2> with relative table entry point of <(mode register)>. <adr2> is an 11-bit address with the 5 LSB's equal to 00000. The absolute address is:<br>(<adr2> AND 07E0h) + <(mode register)><br>The table at <adr2> will most likely contain JMP instructions to subroutines within the main program; however, any instruction may be used in the table. The table must be located on a 5-bit boundary. |

FLAG TEST INSTRUCTIONS:

| | |
|---|---|
| JFAZ <adr1> | JUMP on FLAG 'A' ZERO. Jump to <adr1> if Flag 'A' is Zero, else go to next statement. This is a hardware flag. |
| JFBZ <adr1> | JUMP on FLAG 'B' ZERO. Jump to <adr1> if Flag 'B' is Zero, else go to next statement. This is a hardware flag. |

CALL/RETURN INSTRUCTIONS:

| | |
|---|---|
| CALL <adr1> | CALL. Place current address plus one in the 'return register', then jump unconditionally to <adr1>. This is a single level CALL; if CALL instructions are nested, the RET instruction will return to the instruction following the last CALL. |
| RET | RETURN. Return to address: <(return register)>. |

MODE REGISTER INSTRUCTIONS:

| | |
|---|---|
| UMR | Update the Mode Register with the most recent value. The IG works asynchronously with the timing generators and Master Controller. Thus, it is necessary to get new mode values at a predictable time. External circuits (usually the Vertical Timing Generator) will update the IG's temporary mode register at any time, but that value will not affect IG instructions until a UMR instruction is executed. That value will remain in effect until the next UMR instruction is executed. |

GLOBAL ROTATION INSTRUCTIONS:

| | |
|---|---|
| LRM0 <mod>, <rot> | Load Rotation Modulus register for RF0. An area of memory in RF0 may be declared as global rotation memory between addresses zero and <mod-1>. <mod> is the Global rotation modulus, and has the valid values of 0, 2, 4, ... 122, 124, 126. When the instruction GRL0 is executed, the memory within the Global Rotation space will be rotated by <rot> bits. <rot> has the valid values of 0, 4, 8, ... 116, 120, 124. |
| LRM1 <mod>, <rot> | Load Rotation Modulus register for RF1. An area of memory in RF1 may be declared as global rotation memory between addresses zero and <mod-1>. <mod> is the Global rotation modulus, and has the valid values of 0, 2, 4, ... 122, 124, 126. When the instruction GRL1 is executed, the memory within the Global Rotation space will be rotated by <rot> bits. <rot> has the valid values of 0, 4, 8, ... 116, 120, 124. |
| GRL0 | Global Rotate Left RF0 modulo <mod> step <rot>, where <mod> and <rot> are defined by the LRM0 instruction. |
| GRL1 | Global Rotate Left RF1 modulo <mod> step <rot>, where <mod> and <rot> are defined by the LRM1 instruction. |

INSTRUCTION SET OF MASTER CONTROLLER (MC)

OUT    Output control signal.
       MC will pause its execution after "OUT" instruction,
       and re-start its execution when "FSYNC" comes.

```
      code                    label      mnemonic
D C B A 9 8 7 6 5 4 3 2 1 0

<  m  > <h> <─  v  ─> 1 1              OUT <m>, <v>, <h>
│ │ │ │ │ │ │ │ │ │ │ │
▼ ▼ ▼ ▼ ▼ ▼ ▼ ▼ ▼ ▼ ▼ ▼
M M M M H H V V V V V V
C C C C T T T T T T T T
3 2 1 0 G G G G G G G G
        9 8 5 4 3 2 1 0
```

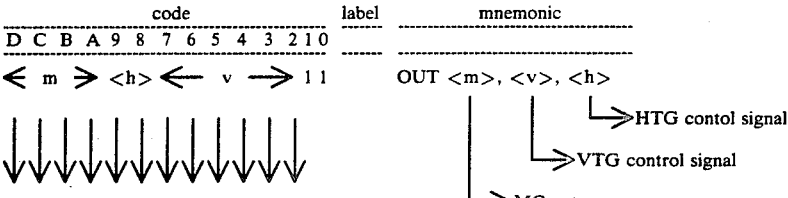

TBOUT  Output tabled control signal.
       The table must be constructed with up to 16 "OUT" instructions.
       One of the "OUT" instructions is chosen by contents of "COMB".
       Destination table must be located boundary of 16.

|  | code | label | mnemonic |
|---|---|---|---|
| | D C B A 9 8 7 6 5 4 3 2 1 0 | | |
| | ←─tbl.─→ 0 0 0 0 0 1 0 1 | | TBOUT <table> |

JMP     Jump to <label>.

|  | code | label | mnemonic |
|---|---|---|---|
| | D C B A 9 8 7 6 5 4 3 2 1 0 | | |
| | ←─dest.─→ 1 1 0 1 0 | | JMP <label> |

TCMA     Test COMA if COMA is equal to <c>, then jump to <label>.
if COMA is not equal to <c>, then execute next instruction.
Destination must be located boundary of 4.

|  | code | label | mnemonic |
|---|---|---|---|
| | D C B A 9 8 7 6 5 4 3 2 1 0 | | |
| | ←─ dest. ─→ <c> 0 0 0 | | TCMA <c>, <label> |

TXF10     Test "flag1" and "flag0". Jump if [((c XNOR flag1) OR m) AND ((d XNOR flag0) OR n)]
If "flag1" and "flag0" are equal to <cd>, then jump to <label>.
If "flag1" and "flag0" are not equal to <cd>, then execute next instruction.
The flag test is masked by <,m>. "0"= test, "1"= mask.
Destination must be located boundary of 4.

|  | code | label | mnemonic |
|---|---|---|---|
| | D C B A 9 8 7 6 5 4 3 2 1 0 | | |
| | ←─ dest. ─→ m n c d 0 1 0 | | TXF10 <mn>, <cd>, <label> |

→ Compare bit for "flag0"
                       → Compare bit for "flag1"
                    → Mask bit for "flag0"
                → Mask bit for "flag1"

TXF32     Test "flag3" and "flag2". Jump if [((c XNOR flag3) OR m) AND ((d XNOR flag2) OR n)]
If "flag3" and "flag2" are equal to <cd>, then jump to <label>.
If "flag3" and "flag2" are not equal to <cd>, then execute next instruction.
The flag test is masked by <mn>.
Destination must be located boundary of 4.

|  | code | label | mnemonic |
|---|---|---|---|
| | D C B A 9 8 7 6 5 4 3 2 1 0 | | |
| | ←─ dest. ─→ m n c d 1 1 0 | | TXF32 <mn>, <cd>, <label> |

→ Compare bit for "flag2:
                       → Compare bit for "flag3"
                    → Mask bit for "flag2"
                → Mask bit for "flag3"

ALIGN2     Generate following instructions from next 4×N (N is integer) address.
ALIGN4     Generate following instructions from next 16×N (N is integer) address.
Files;       Input file
            Object file
            Listing file
Instruction format;     Label Fields
                          Instruction Fields
                          Mnemonic Fields
                          Operand Fields
                          Comment Fields
Constants;     Binary Integers
                Octal Integers
                Decimal Integers
                Hexadecimal Integers
                Symbols
Directives;     .PAGE
                .TITLE "string"
                .WIDTH <width>
                .COPY <file name>
                .END -continued

```
.SET <value>
.ASECT
```

| address | code | label | mnemonic |
|---|---|---|---|
| 8 7 6 5 4 3 2 1 0 | D C B A 9 8 7 6 5 4 3 2 1 0 | | |
| ← a → 0 0 | ←M01→<h>←S01→1 1 | STL0: | ALIGN2<br>OUT M01, S01, h |
| ← a → 0 1 | ← 4(a+1) →1 1 0 1 0 | | JMP STL1 |
| ←a+1→ 0 0 | ←M01→<h>←S11→1 1 | STL1: | ALIGN2<br>OUT M01, S11, h |
| ←a+1→ 0 1 | ← 4(a+2) →1 1 0 1 0 | | JMP STL2 |
| ←a+2→ 0 0 | ←a+1→ 0 0 0 1 0 0 0 | STL2: | ALIGN2<br>TCMA 0001b, STL1 *1 |
| ←a+2→ 0 1 | ←a+1→ 0 0 1 0 0 0 0 | | TCMA 0010b, STL1 *1 |
| ←a+2→ 1 0 | ← b → 0 0 1 1 0 0 0 | | TCMA 0011b, PIP *1 |
| ←a+2→ 1 1 | ←4c→ 0 1 0 0 0 0 0 | | TCMA 0100b, MLT *1 |
| | | (coding is continued) | ALIGN2 |
| ← b → 0 0 | ←c→ 0 0 0 0 0 0 1 0 1 | PIP: | TBOUT PTB0 *3 |
| ← b → 0 1 | ←a+2→ 1 0 0 1 0 1 0 | | TXF10 10b, 01b, STL2<br>*1 |
| ← b → 1 0 | ←c+1→ 0 0 0 0 0 0 1 0 1 | | TBOUT PTB2 *3 |
| ← b → 1 1 | ←4(a+2)→ 1 1 0 1 0 | | JMP STL2 |
| *4 | | | ALIGN4 |
| ← c → 0 0 0 0 | ←M10→ 0 0 ←P010→1 1 | PTB0: | OUT M10, P010, 0 |
| ← c → 0 0 1 0 | ←M10→ 0 1 ←P010→1 1 | | OUT M10, P010, 1 |
| ← c → 0 0 1 0 | ←M10→ 1 0 ←P011→1 1 | | OUT M10, P011, 2 |
| ← c → 0 0 1 1 | ←M10→ 1 1 ←P011→1 1 | | OUT M10, P011, 3 |
| *4 | | | ALIGN4 |
| ←c+1→ 0 0 0 0 | ←M10→ 0 0 ←P210→1 1 | PTB2: | OUT M10, P210, 0 |
| ←c+1→ 0 0 0 1 | ←M10→ 1 0 ←P210→1 1 | | OUT M10, P210, 2 |
| ←c+1→ 0 0 1 0 | ←M10→ 0 1 ←P211→1 1 | | OUT M10, P211, 1 |
| ←c+1→ 0 0 1 1 | ←M10→ 1 1 ←P211→1 1 | | OUT M10, P211, 3 |

*1 TCMA, TCMB, TXF10 and TXF32 can only jump to addresses where the two LSB's=00. The assembler should understand this, and situate the <label> on the correct boundary.
*3 TBOUT can only point the addresses where the four LSB's=0000. These four LSB's are substituted with COMB. The assembler should understand this, and situate the <label> on the correct boundary.
*4 c = 1 + INTEGER(b/4)

It should be understood that various embodiments of the invention can employ hardware, software or microcoded firmware. Process and state transition diagrams herein are also representative of diagrams for microcorded and software based embodiments. Connections and couplings can be ohmic, direct electrical, capacitive digital, analog interfacing, electromagnetic, optical or by any other suitable means. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to this description. It is therefore contemplated that the appended claims cover any such modifications or embodiments as fall within the true scope of the invention.

What is claimed is:

1. A memory cell comprising:
   sensing circuit means having at least one differential data line for transferring data between said memory cell and said sensing circuit means;
   a memory cell select circuit having cell select lines connected to said memory cell and operable in response to a control signal to enable transfer of into and out of said memory cell;
   a first transistor having first and second current handling terminals and a control terminal, the first current handling terminal of said first transistor connected to said differential data line said first transistor control terminal forming a word line for said memory cell;
   a capacitive storage cell having first and second terminals, said first capacitive storage connected to ground potential, said second capacitor terminal connected to the second current handling terminal of said first transistor;
   a second transistor having first and second current handling terminals and a control terminal, said control terminal of said second transistor connected the second current handling terminal of said first transistor, said first current handling terminal of said second transistor connected to ground potential;
   a third transistor having first and second current handling terminals and a control terminal said first current handling terminal of said third transistor connected to said second current handling terminal of said second transistor, said control terminal of said third transistor connected to a cell select line of said memory cell circuit, and said second current handling terminal of said first transistor forming a memory cell read line;
   an output data line connected to said memory cell read line for transferring data out of said memory cell.

2. The memory cell of claim 1 further comprising:

means connected to said output data for precharging said output data line to a predeterminable voltage level prior to reading data from the memory cell.

3. The memory cell of claim 1 wherein:
said second transistor is a field effect transistor having a threshold voltage greater than a logical high voltage value of said capacitive storage cell.

4. The memory cell of claim 1 wherein:
a node formed at the connective junction of the second current handling terminal of said second transistor and the first current handling terminal of said third transistor is isolated to prevent degradation of a charge stored on said capacitive storage cell during reading of data from said memory cell.

* * * * *